(12) United States Patent
Suzuki et al.

(10) Patent No.: US 7,977,865 B2
(45) Date of Patent: Jul. 12, 2011

(54) COMPOSITE MATERIAL, MATERIAL FOR LIGHT-EMITTING ELEMENT, LIGHT-EMITTING ELEMENT, LIGHT-EMITTING DEVICE AND ELECTRONIC DEVICE

(75) Inventors: Tsunenori Suzuki, Yokohama (JP); Satoshi Seo, Kawasaki (JP); Takako Takasu, Chigasaki (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 836 days.

(21) Appl. No.: 11/886,905

(22) PCT Filed: Mar. 13, 2006

(86) PCT No.: PCT/JP2006/305324
§ 371 (c)(1),
(2), (4) Date: Sep. 21, 2007

(87) PCT Pub. No.: WO2006/101018
PCT Pub. Date: Sep. 28, 2006

(65) Prior Publication Data
US 2009/0072714 A1 Mar. 19, 2009

(30) Foreign Application Priority Data

Mar. 23, 2005 (JP) ................................. 2005-085026
Nov. 4, 2005 (JP) ................................. 2005-321431

(51) Int. Cl.
*H01L 51/40* (2006.01)
*H01J 1/63* (2006.01)
*C08L 39/02* (2006.01)
*C08K 3/22* (2006.01)

(52) U.S. Cl. .......... 313/504; 438/29; 524/612; 524/408; 524/555; 257/E51.027

(58) Field of Classification Search .................. 428/690; 313/504; 438/29; 524/612, 408, 555; 257/E51.027
See application file for complete search history.

(56) References Cited

U.S. PATENT DOCUMENTS 5,049,464 A * 9/1991 Kanemaru et al. ......... 430/58.15
(Continued)

FOREIGN PATENT DOCUMENTS

GB 2334959 9/1999
(Continued)

OTHER PUBLICATIONS

Machine English translation of JP 2000-150169 A. May 6, 2010.*
(Continued)

*Primary Examiner* — Angela Ortiz
*Assistant Examiner* — J. L. Yang
(74) *Attorney, Agent, or Firm* — Eric J. Robinson; Robinson Intellecutal Property Law Office, P.C.

(57) ABSTRACT

The present invention provides a composite material for a light-emitting element including a high molecular compound having an arylamine skeleton and an inorganic compound showing an electron accepting property to the high molecular compound. The absorption spectrum of the composite material is different from absorption spectra of the high molecular compound and the inorganic compound which each form the composite material. In other words, a composite material having an absorption peak in a wavelength which is seen in the absorption spectra of neither the high molecular compound nor the inorganic compound forming the composite material is superior in carrier transporting and injecting properties and a favorable material. In addition, the composite material can be formed by a wet method such as a sol-gel method, it can be apply to the increase of substrate size easily in a manufacturing process and advantageous industrially.

16 Claims, 28 Drawing Sheets

U.S. PATENT DOCUMENTS

| | | | |
|---|---|---|---|
| 5,103,103 A * | 4/1992 | Radford et al. | 250/515.1 |
| 6,423,429 B2 | 7/2002 | Kido et al. | |
| 6,486,601 B1 | 11/2002 | Sakai et al. | |
| 6,589,673 B1 | 7/2003 | Kido et al. | |
| 7,101,630 B2 | 9/2006 | Kato | |
| 7,158,161 B2 | 1/2007 | Gyoutoku et al. | |
| 7,749,407 B2 * | 7/2010 | Hsu et al. | 252/511 |
| 2001/0046611 A1 | 11/2001 | Kido et al. | |
| 2003/0189401 A1 | 10/2003 | Kido et al. | |
| 2004/0004433 A1 | 1/2004 | Lamansky et al. | |
| 2004/0265253 A1 * | 12/2004 | Seo et al. | 424/63 |
| 2005/0084712 A1 | 4/2005 | Kido et al. | |
| 2005/0098207 A1 | 5/2005 | Matsumoto et al. | |
| 2005/0106419 A1 | 5/2005 | Endoh et al. | |
| 2005/0170208 A1 | 8/2005 | Yatsunami et al. | |
| 2005/0248267 A1 | 11/2005 | Gyoutoku et al. | |
| 2006/0008740 A1 | 1/2006 | Kido et al. | |
| 2006/0142520 A1 | 6/2006 | Jones et al. | |
| 2007/0155928 A1 | 7/2007 | Koyama et al. | |
| 2007/0182317 A1 | 8/2007 | Kido et al. | |
| 2007/0200125 A1 | 8/2007 | Ikeda et al. | |
| 2008/0154005 A1 | 6/2008 | Suzuki et al. | |

FOREIGN PATENT DOCUMENTS

| | | |
|---|---|---|
| JP | 07-053953 | 2/1995 |
| JP | 08-054833 | 2/1996 |
| JP | 09-063771 A | 3/1997 |
| JP | 10-199681 | 7/1998 |
| JP | 2824411 | 9/1998 |
| JP | 2824411 | 11/1998 |
| JP | 11-307259 | 11/1999 |
| JP | 11-307264 | 11/1999 |
| JP | 2000-150169 | 5/2000 |
| JP | 2000150169 A * | 5/2000 |
| JP | 2000-315581 | 11/2000 |
| JP | 2003-272860 | 9/2003 |
| JP | 2005-026121 | 1/2005 |
| JP | 2005-026121 A | 1/2005 |
| JP | 1 530 245 | 5/2005 |
| JP | 2005-166637 | 6/2005 |
| JP | 1 351 558 | 7/2006 |
| WO | WO 01/67823 | 9/2001 |
| WO | WO-2004/021463 | 3/2004 |
| WO | WO 2006/080553 | 8/2006 |

OTHER PUBLICATIONS

Machine English translation of JP 2000-150169 A. Aug. 27, 2010.*

Adachi.C et al., "Electroluminescence in Organic Films With Three-Layer Structure," JPN. J. Appl. Phys. (Japanese Journal of Applied Physics, Feb. 20, 1988, vol. 27, No. 2, pp. L269-L271.

International Search Report (Application No. PCT/JP2006/301709) Dated Apr. 4, 2006.

Written Opinion (Application No. PCT/JP2006/301709) Dated Apr. 4, 2006.

Ikeda et al., *Low-Drive-Voltage OLEDs with a Buffer Layer Having Molybdenum Oxide*, SID '06 Digest of Technical Papers, vol. 37, 2006, pp. 923-926.

Tang et al., *Organic Electroluminescent Diodes*, Applied Physics Letters, vol. 51 (12), Sep. 21, 1987, pp. 913-915.

Cao et al., *Polymer Light-Emitting Diodes with Polyethylene Dioxythiophene-Polystyrene Sulfonate as the Transparent Anode*, Synthetic Metals, vol. 87, 1997, pp. 171-174.

Letendre, *Challenges in Jetting OLED Fluids in the Manufacturing of FPD Using Piezoelectric Micro-Pumps*, SID '04 Digest of Technical Papers, vol. 35, 2004, pp. 1273-1275.

Suzuki et al., *Polymer/Metal-Oxide Composite: A Novel Buffer Layer for Solution-Processible OLEDs*, SID '07 Digest of Technical Papers, vol. 38, 2007, pp. 1840-1843.

Dislich, *New Routes to Multicomponent Oxide Glasses*, Angew. Chem. Inter. Ed., vol. 10, No. 6, Jun. 1971, pp. 363-370.

Nakada et al., *Multi Photon Emission Organic EL Devices Using Charge-Transfer Complex as Charge Generation Layer*, The $63^{rd}$ Autumn Meeting, Sep. 2002, pp. 1165.

International Search Report (Application No. PCT/JP2006/305324) dated Jun. 27, 2006.

Written Opinion (Application No. PCT/JP2006/305324) dated Jun. 27, 2006.

* cited by examiner

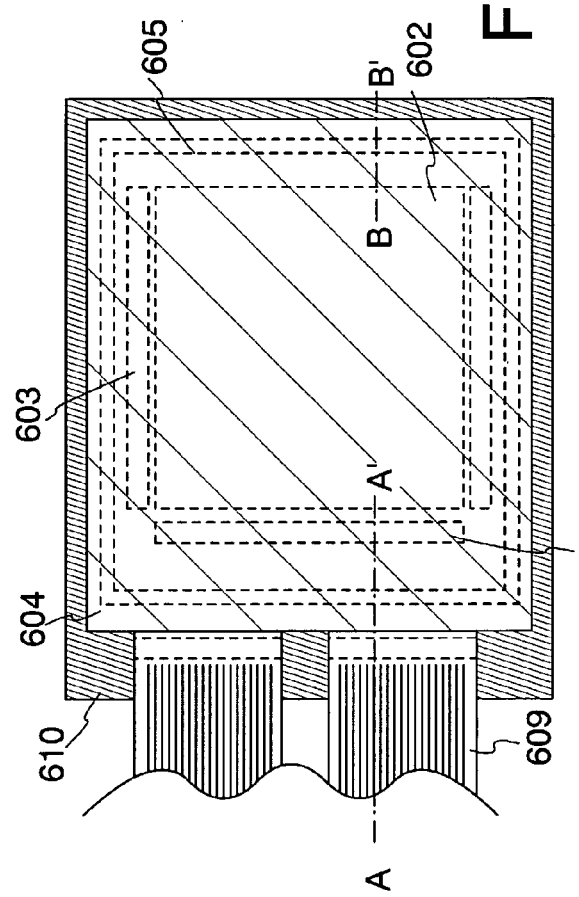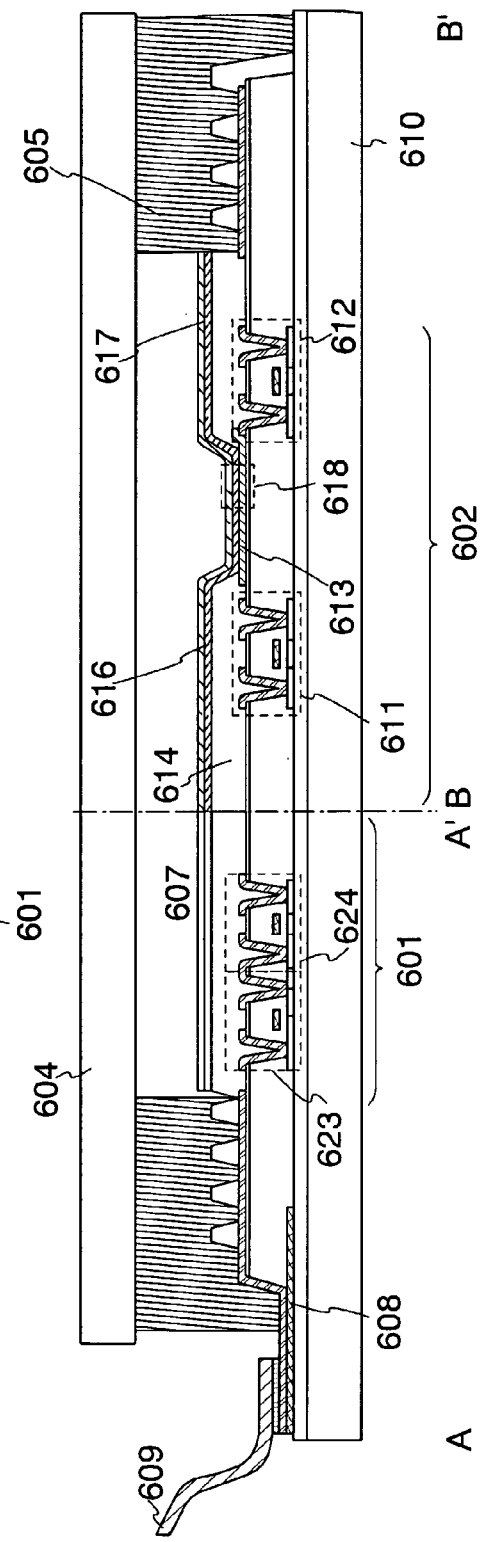

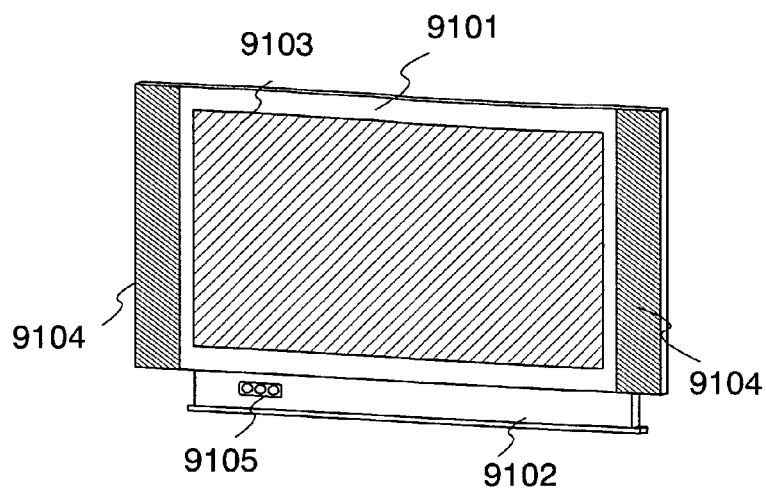
FIG. 10A
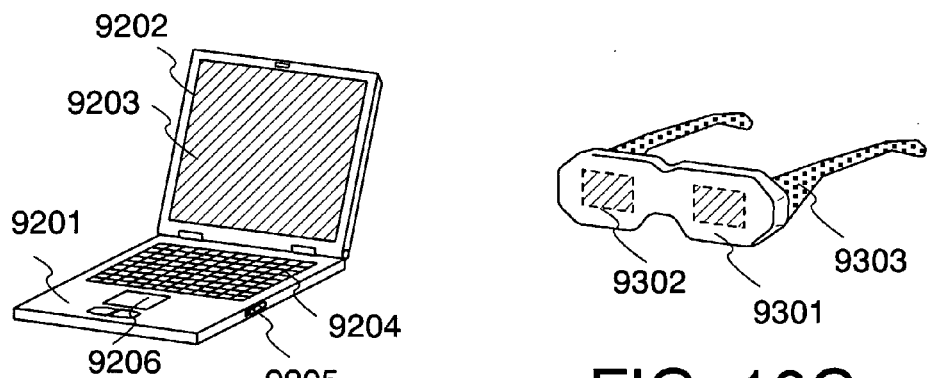
FIG. 10B
FIG. 10C
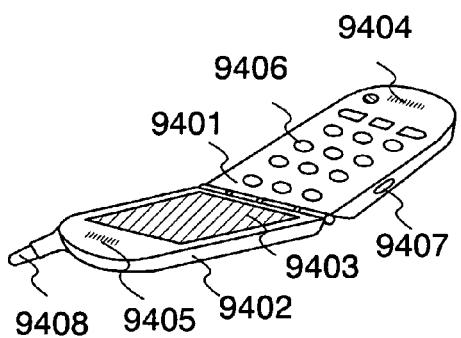
FIG. 10D
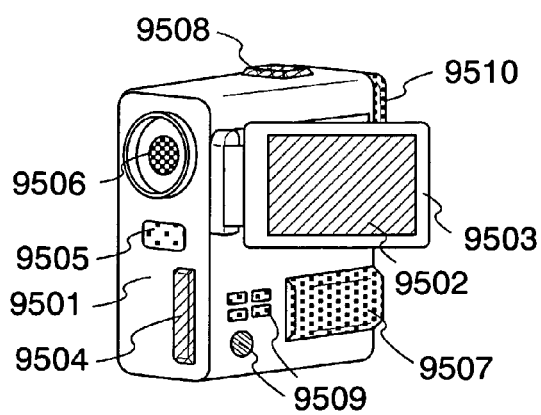
FIG. 10E

COMPOSITE MATERIAL, MATERIAL FOR LIGHT-EMITTING ELEMENT, LIGHT-EMITTING ELEMENT, LIGHT-EMITTING DEVICE AND ELECTRONIC DEVICE

TECHNICAL FIELD

The present invention relates to a light-emitting element having a layer including a light-emitting substance between a pair of electrodes, and a manufacturing method thereof. Further, the present invention relates to a light-emitting device having such a light-emitting element.

BACKGROUND ART

In recent years, a light-emitting element which can provide high luminance by current flow to an organic compound has attracted attentions, like a light-emitting element including a light-emitting organic compound.

A basic structure of a light-emitting element is a structure in which a layer containing a light-emitting organic compound is interposed between a pair of electrodes. By applying voltage to the element, electrons from one of the pair of electrodes and holes from the other electrode are injected to a light-emitting layer, so that current flows. The electrons and holes (i.e., carriers) are recombined, and thus, the light-emitting organic compound is excited. The light-emitting organic compound returns to a ground state from the excited state, thereby emitting light.

It is to be noted that the excited state generated by an organic compound can be a singlet excited state or a triplet excited state, and luminescence from the singlet excited state is referred to as fluorescence, and luminescence from the triplet excited state is referred to as phosphorescence.

Since light-emitting elements are usually formed by using a thin film with a thickness approximately on the order of submicron, it is a great advantage that the light-emitting elements can be manufactured to be thin and lightweight. In addition, since it takes the time on the order of microseconds or less to generate luminescence after carrier injection, it is also one of the features that the speed of response is quite fast. Further, since sufficient luminescence can be obtained at a direct-current voltage of several to several tens of volts, the power consumption is relatively low. From these advantages, light-emitting elements have attracted a lot of attentions as the elements for the next-generation flat panel displays. In particular, the light-emitting elements are expected to be applied to mobile devices and the like, taking advantage of the features of thinness, lightness in weight and the like.

Most of characteristics of light-emitting elements depend greatly on materials forming the light-emitting elements, and various materials have been developed aiming at the use for light-emitting elements. In addition, there is a possibility that even a material which has been developed as a material for a light-emitting element can be applied to various devices such as solar batteries or transistors, with use of characteristics of the material.

Light-emitting elements using such an organic compound need a material having an excellent carrier transporting property or injecting property, since a lot of organic compounds are poor in conductivity.

For example, Reference 1 discloses a composite material including an organic compound and an inorganic oxide which is intended to be used for a charge generating layer to be provided between light-emitting units in a light-emitting element having a plurality of light-emitting units. According to Reference 1, it is disclosed that a carrier transporting property or injecting property of the composite material is improved by an interaction between the organic compound and the inorganic oxide.

However, a film of the composite material disclosed in Reference 1 can be formed only by an evaporation method. There is a limitation on metal oxides which can be deposited by an evaporation method, and thus, the room for choices of materials is extremely small. In addition, as compared with a wet method typified by a spin coating method or an ink-jetting method, there is a concern that a film formation using an evaporation method has difficulty in treating with a larger substrate in a manufacturing process of elements, and disadvantage for industrialization (Reference 1: Japanese Patent Laid-Open No. 2003-272860).

DISCLOSURE OF INVENTION

In view of the problem, it is an object of the present invention to provide a composite material having an excellent conductivity. It is another object of the present invention to provide a composite material for a light-emitting element using the material which is advantageous industrially. Further, it is another object of the present invention to provide a light-emitting element, a light-emitting device and an electronic device using the composite material. In addition, it is another object of the present invention to provide a light-emitting element which needs small driving voltage, and furthermore, a light-emitting device and an electronic device which needs less power consumption.

Moreover, it is another object of the present invention to provide a novel material forming a composite material having an excellent conductivity, which is a material for forming a composite material. In addition, it is another object of the present invention to provide a novel material for providing a composite material which has an excellent conductivity and is advantageous industrially.

The inventors have found a composite material including a high molecular compound having an arylamine skeleton and an inorganic compound showing an electron accepting property to the high molecular compound. The inventors have found out that the absorption spectrum of the composite material is different from absorption spectra of the high molecular compound and the inorganic compound which each form the composite material. In other words, a composite material having an absorption peak in a wavelength which is seen in the absorption spectra of neither the high molecular compound nor the inorganic compound forming the composite material is superior in carrier transporting and injecting properties and a favorable material. Note that a high molecular compound means a polymer or a dendrimer.

In addition, the inventors have found out that a composite material including a high molecular compound having an arylamine skeleton and an inorganic compound showing an electron accepting property to the high molecular compound, wherein the composite material including the inorganic compound which is molybdenum oxide, vanadium oxide, tungsten oxide, or tantalum oxide is superior in conductivity, carrier transporting and injecting properties, and is a favorable material.

One feature of the present invention is a composite material including an organic compound and an inorganic compound, in which the organic compound is a high molecular compound having an arylamine skeleton, and whose absorption spectrum is different from those of the high molecular compound and the inorganic compound.

One feature of the present invention is a composite material including an organic compound and an inorganic compound, in which the organic compound is a high molecular compound having an arylamine skeleton, and an absorption spectrum of the composite material has an absorption peak in a wavelength which cannot be seen in absorption spectra of either of the high molecular compound and the inorganic compound.

One feature of the present invention is a composite material including an organic compound and an inorganic compound, in which the organic compound is a high molecular compound having an arylamine skeleton, and the inorganic compound is an oxide of a metal belonging to Group 5 to 7 in the periodic table. More preferably, the inorganic compound is vanadium oxide, molybdenum oxide, tungsten oxide, tantalum oxide, niobium oxide or rhenium oxide.

It should be noted that such composite materials are formed by a wet method such as a sol-gel method, and thus, can easily treat with a larger substrate in a manufacturing process; therefore, they are advantageous industrially. Further, they may be formed in combination with an evaporation method.

Note that a light-emitting device having a light-emitting element including a layer made of a composite material as described above is also one mode of the present invention. It should be noted that the light-emitting device of the present invention refers to an image display device or a light-emitter using a light-emitting element. In addition, a module that has a connector such as a flexible printed circuit (FPC), a TAB (Tape Automated Bonding) tape, or a TCP (Tape Carrier Package) attached to a light-emitting device; a module that has a printed wiring board provided at the tip of a TAB tape or a TCP; and a module that has an IC (integrated circuit) directly mounted on a light-emitting element by a COG (Chip On Glass) method, are also all included in the category of the light-emitting device.

A composite material of the present invention is a composite material having an excellent conductivity.

In addition, since a composite material of the present invention can be formed by a wet method, it is suitable for mass production achieved by increasing a substrate size and advantageous industrially.

A light-emitting element of the present invention includes a composite material obtained by combining an organic compound and an inorganic compound, and thus, the light-emitting element has excellent carrier injecting and transporting properties and excellent conductivity and can be driven at lower driving voltage.

Since a light-emitting device and an electronic device having a light-emitting element of the present invention has a light-emitting element which can be driven at lower driving voltage, the light-emitting device and the electronic device need less power consumption.

Because a light-emitting element of the present invention can be formed by a wet method, it can be applied for to the size increase of a substrate, and it is suitable for mass production and advantageous industrially.

A novel material of the present invention is a novel material which can provide a composite material with an excellent conductivity. Further, a novel material of the present invention is a novel material which is superior in conductivity and which can provide a composite material which is advantageous industrially.

BRIEF DESCRIPTION OF DRAWINGS

In the accompanying drawings:

FIGS. 9A and 9B show a light-emitting device;

FIGS. 10A to 10E each show an electronic device;

BEST MODES FOR CARRYING OUT THE INVENTION

Figure 1:
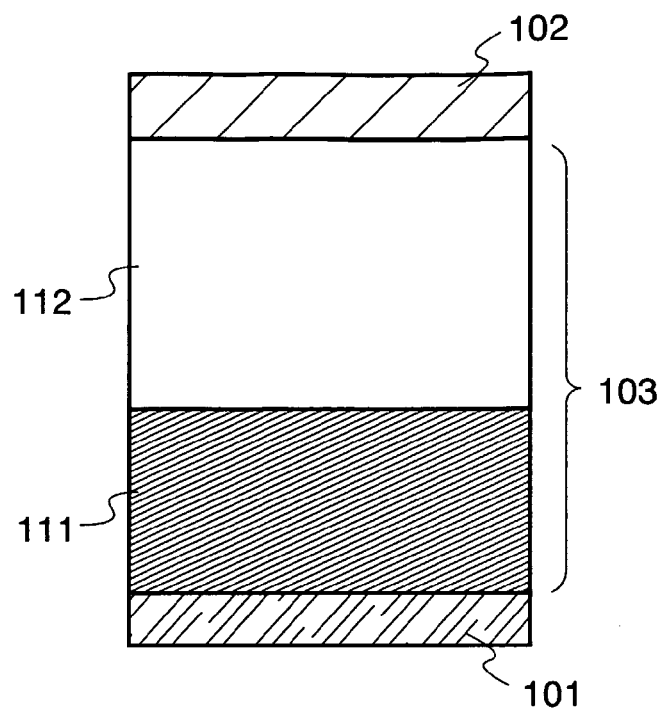
FIG. 1 shows a light-emitting element of the present invention.

Hereinafter, the embodiment modes of the present invention will be described with reference to the accompanying drawings. The present invention can be carried out in many different modes, and it is easily understood by those skilled in the art that modes and details herein disclosed can be modified in various ways without departing from the spirit and the scope of the present invention. It should be noted that the present invention should not be interpreted as being limited to the description of the embodiment modes to be given below.

As for a pair of electrodes of a light-emitting element according to the present invention, when a voltage is applied such that a potential of one electrode thereof is higher than that of the other electrode, light is emitted. At this time, one electrode having a higher potential, is referred to as an electrode serving as an anode, and the other electrode having a lower potential, is referred to as an electrode serving as a cathode.

Embodiment Mode 1

The present invention is a composite material including a high molecular compound having an arylamine skeleton and an inorganic compound. As the high molecular compound to be used, there is no limitation on the high molecular compound as long as it has an arylamine skeleton. However, as an example of the high molecular compound having an arylamine skeleton forming a composite material of the present invention, a high molecular compound having a repetition unit represented by the general formula (1) is preferable. This is because the vinyl polymer represented by the general formula (1) has advantageous effects that it is easily melted in a solvent, and it can easily form a composite material.

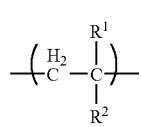

(1)

In the general formula, $R^1$ preferably represents hydrogen, an alkyl group, a cyano group, or an alkoxy group and $R^2$ is preferably a high molecular compound of a monovalent substituent having a triarylamine structure. As monovalent substituent having a triarylamine structure, 4-diphenylamino phenyl, 4-[N-(1-naphthyl)-N-phenylamino]phenyl, 4-{N-[4-diphenylaminophenyl]-N-phenylamino}phenyl, and the like can be given.

A high molecular compound having an arylamine skeleton forming a composite material of the present invention is a high molecular compound having a repetition unit represented by the general formula (1).

(1)

In the general formula, $R^1$ represents hydrogen, an alkyl group, a cyano group, or an alkoxy group and $R^2$ is a substituent represented by the following formula (2).

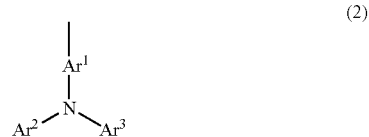

(2)

In the formula, $Ar^1$ is a substituted or unsubstituted arylene group having 6 to 12 carbon atoms, and $Ar^2$ and $Ar^3$ are each a substituted or unsubstituted aryl group having 6 to 14 carbon atoms. A high molecular compound can be used favorably. The vinyl polymers represented by the general formula (1) have advantageous effects that they are easily melted in a solvent, and they can easily form a composite material.

In the formula (2), as specific examples of the arylene group having 6 to 12 carbon atoms for $Ar^1$, 1,4-phenylene, 3-methyl-1,4-phenylene, 1,3-phenylene, 4,4'-biphenylene, and the like as shown by the following formulas (2-1) to (2-4) are given. As specific examples of an aryl group having 6 to 14 carbon atoms for $Ar^2$ and $Ar^3$, phenyl, m-tolyl, p-tolyl, p-metoxyphenyl, 1-naphthyl, 4-methyl-1-naphthyl, 2-naphthyl, 4-biphenyl, 9-anthryl and the like as shown by the following formulas (2-5) to (2-12) can be given. Needless to say, the present invention is not limited to these examples.

(2-1)

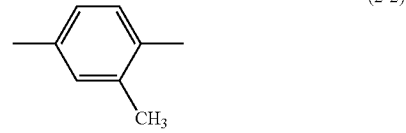

(2-2)

(2-3)

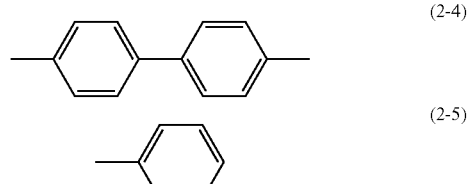

(2-4)

(2-5)

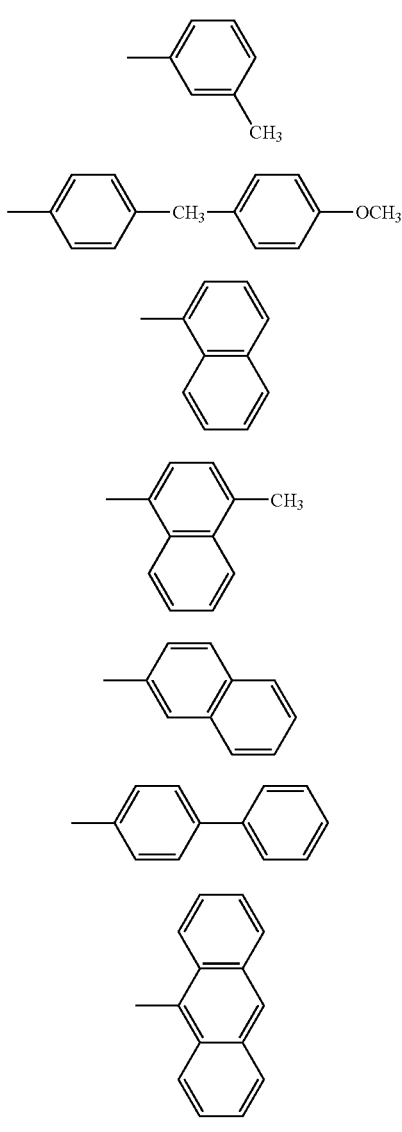

A high molecular compound having a repetition unit represented by the general formula (1) can be given as a high molecular compound having an arylamine skeleton forming a composite material of the present invention.

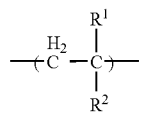
(1)

In the formula, it is preferable that $R^1$ represents hydrogen, an alkyl group, a cyano group, or an alkoxy group and $R^2$ is preferably a high molecular compound which is a substituent represented by the following formula (3).

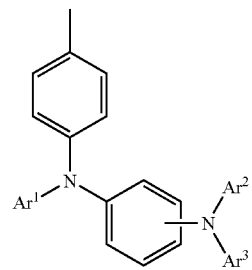
(3)

$Ar^1$ to $Ar^3$ each represent a substituted or unsubstituted aryl group having 6 to 14 carbon atoms. Such vinyl polymer also has advantageous effects that it is easily melted in a solvent, and it can easily form a composite material.

In addition, as a high molecular compound having an arylamine skeleton forming a composite material of the present invention, a high molecular compound having a repetition unit represented by the structural formula (4) can be used preferably.

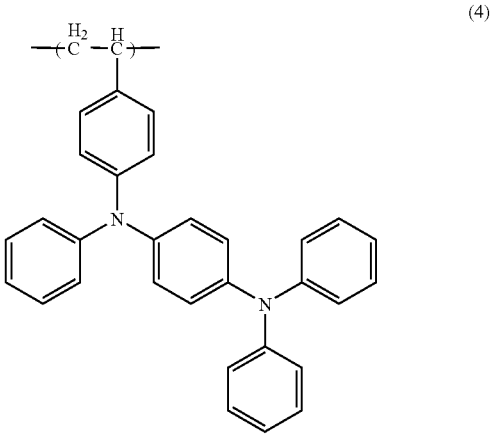
(4)

As specific examples of the high molecular compound, a high molecular compound having a repetition unit represented by structural formulas (5) to (77) and the like are given.

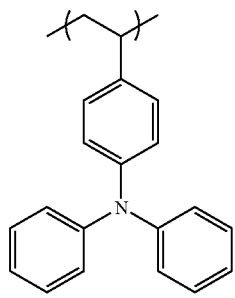
(5)

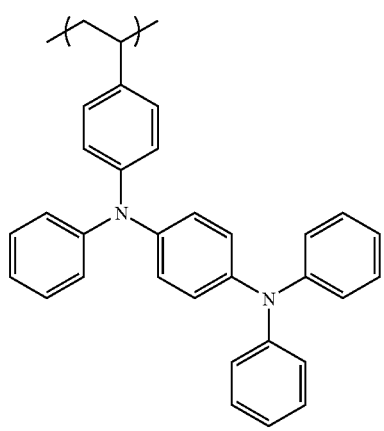
(6)
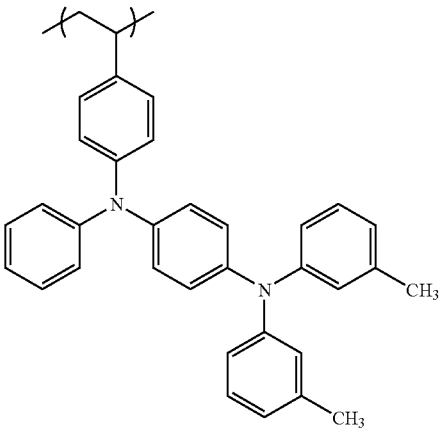
(9)
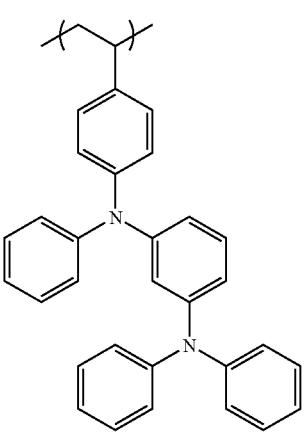
(7)
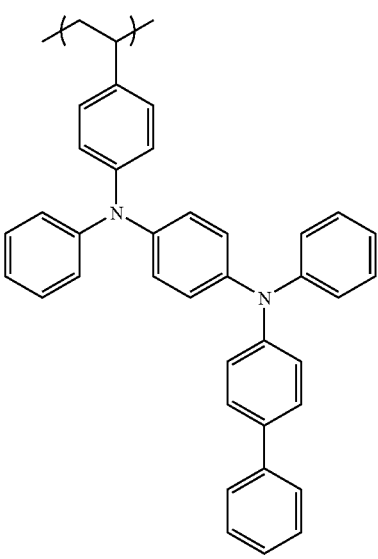
(10)
(8)
(11)

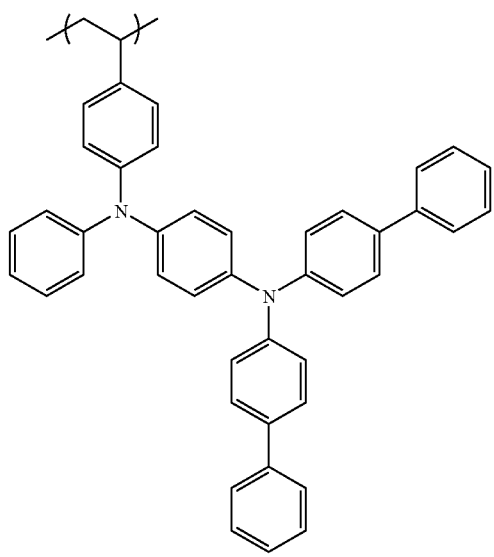
(12)
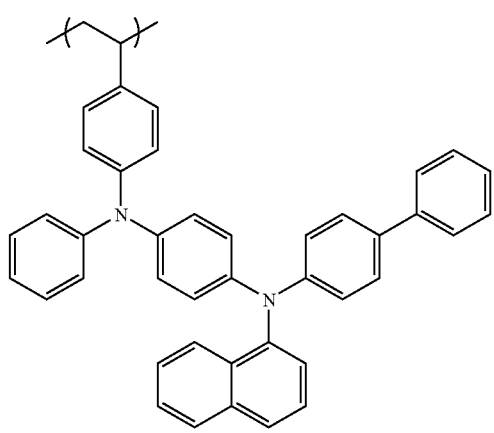
(13)
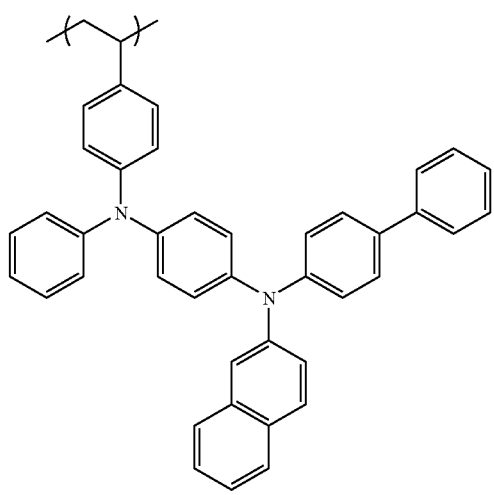
(14)
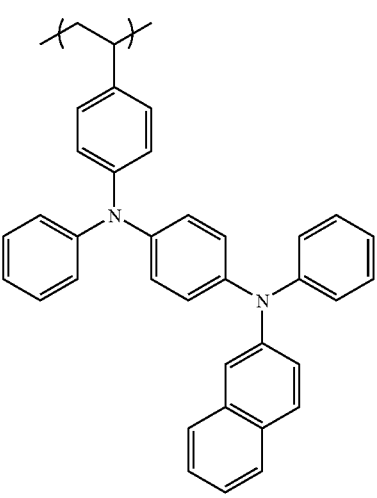
(15)
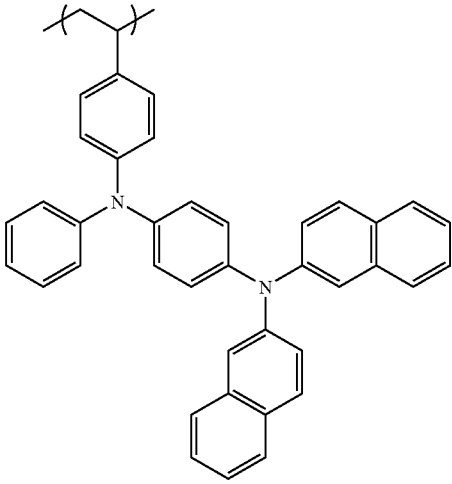
(16)
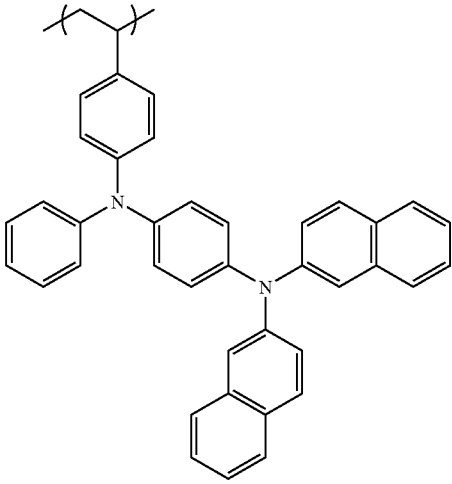
(17)

(18)
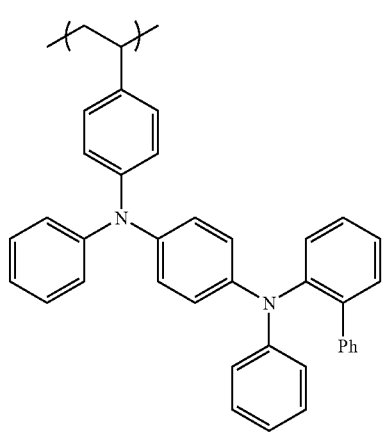
(19)
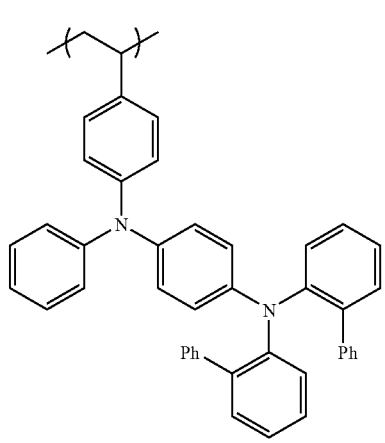
(20)
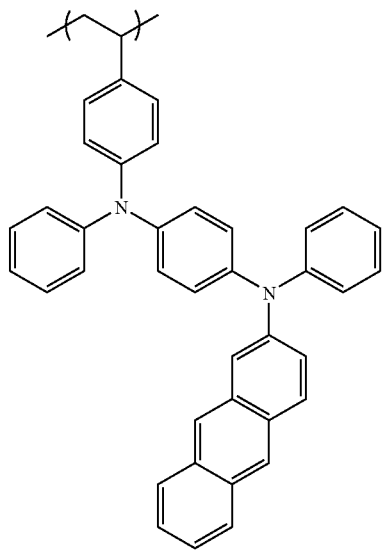
(21)
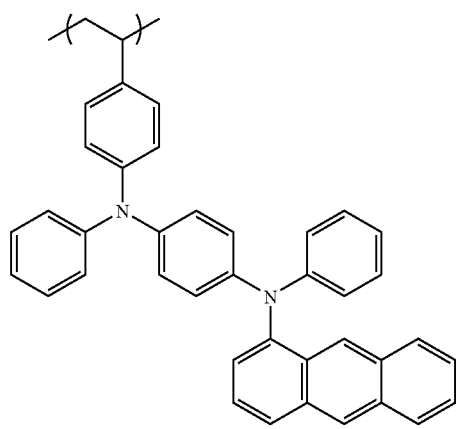
(22)
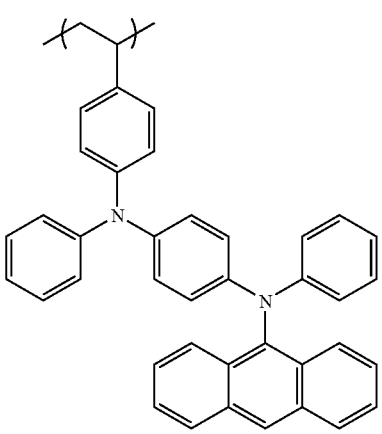
(23)
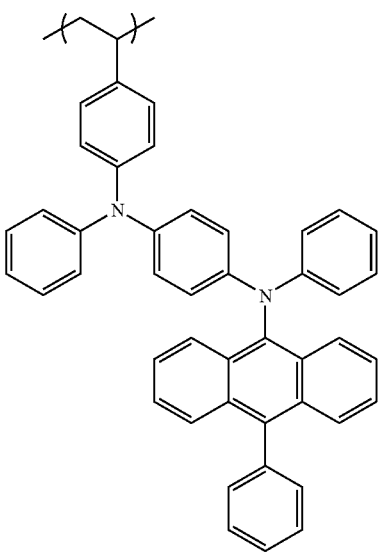

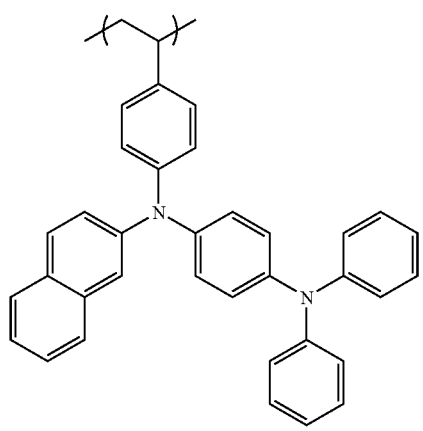
(24)
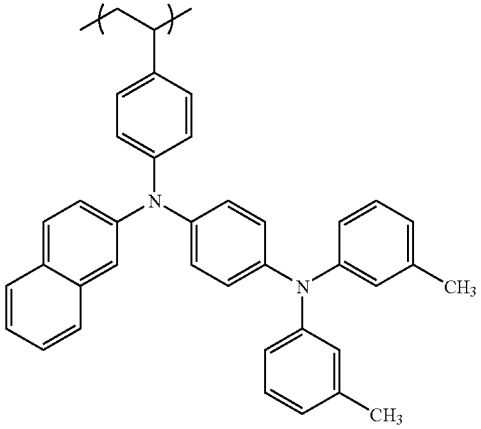
(27)
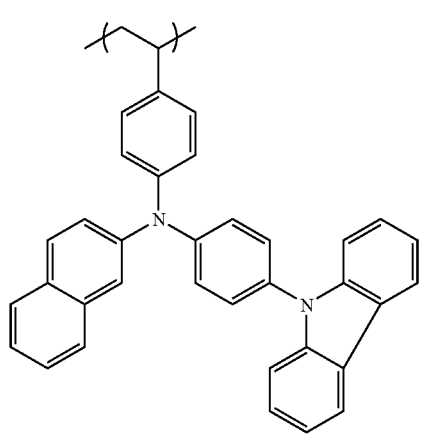
(25)
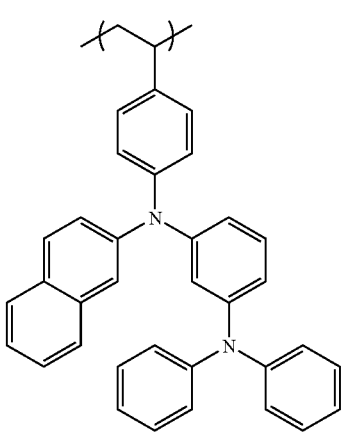
(28)
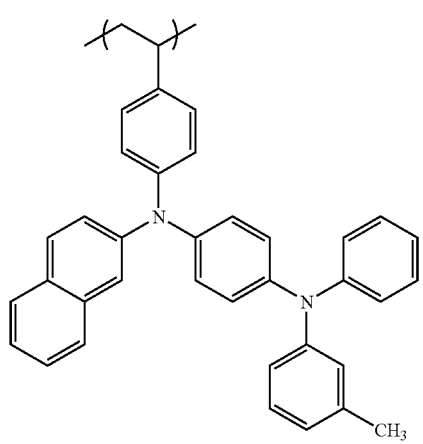
(26)
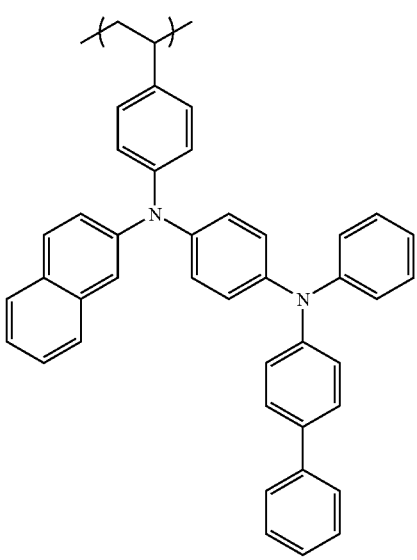
(29)

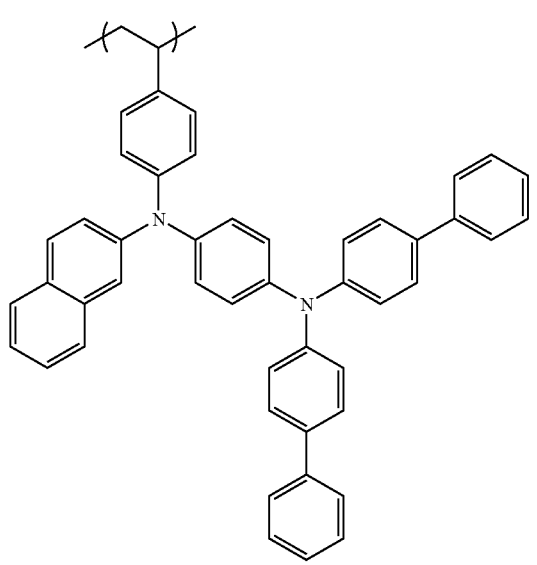
(30)
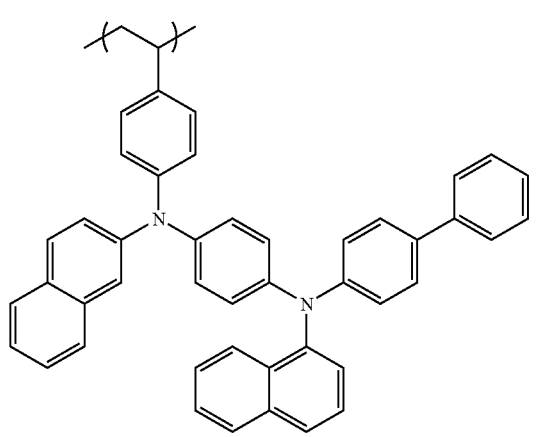
(31)
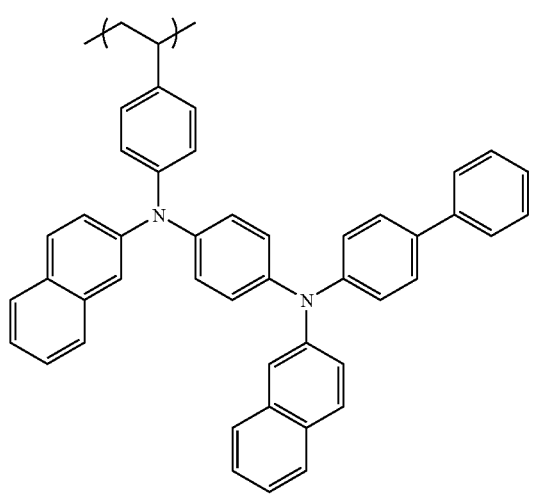
(32)
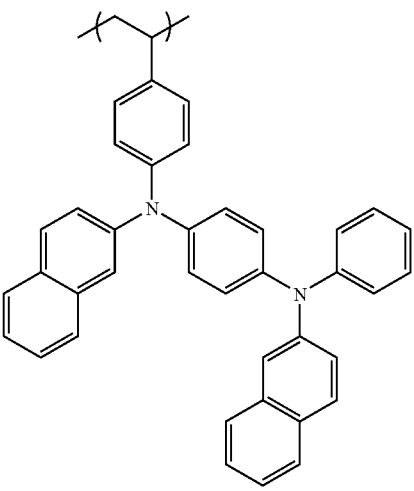
(33)
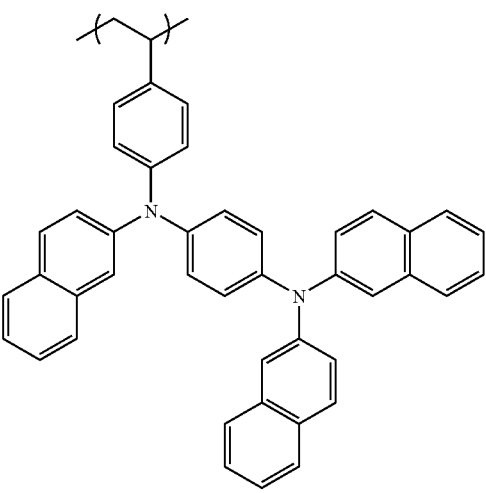
(34)
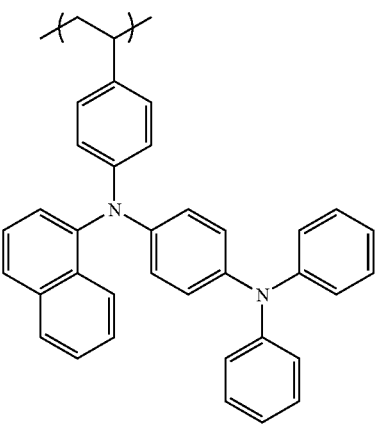
(35)

-continued
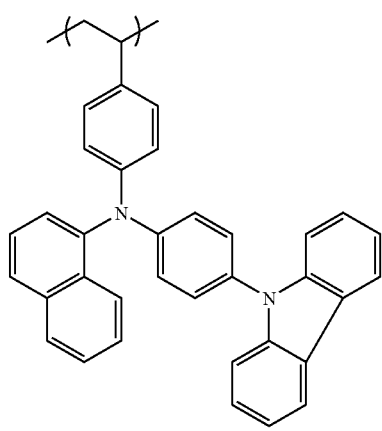
(36)
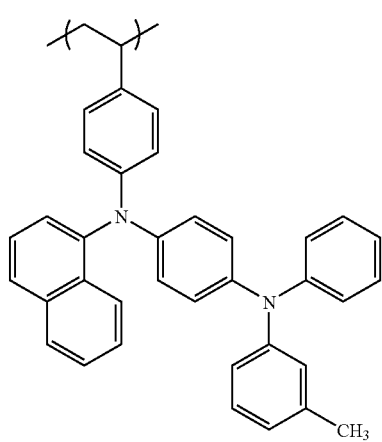
(37)
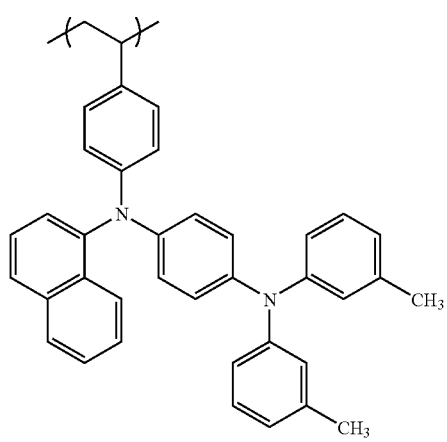
(38)
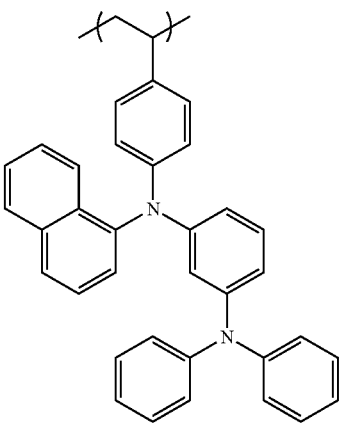
(39)
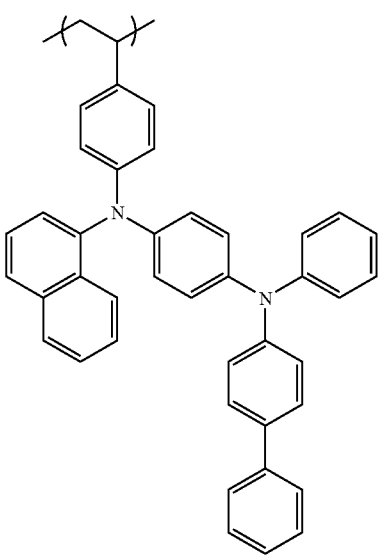
(40)
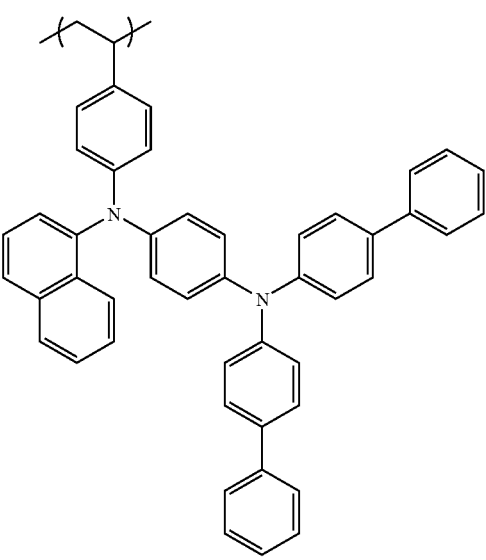
(41)

(42)
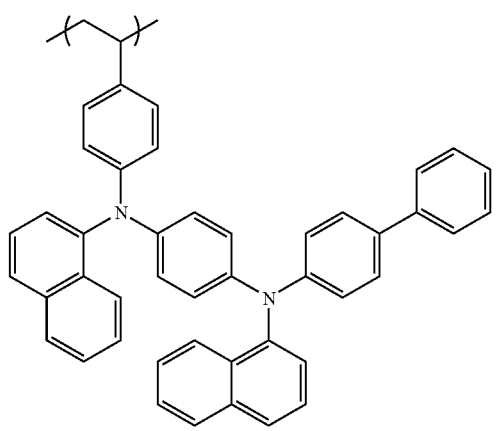
(43)
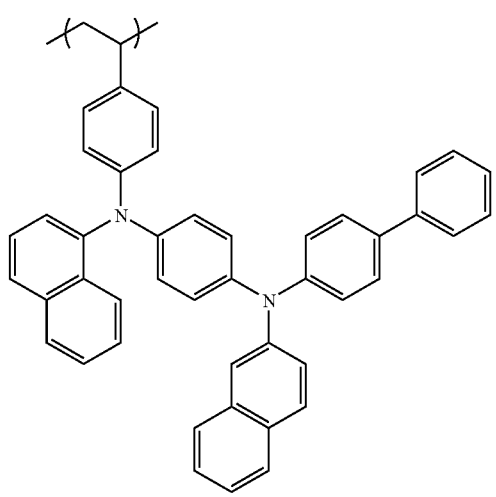
(44)
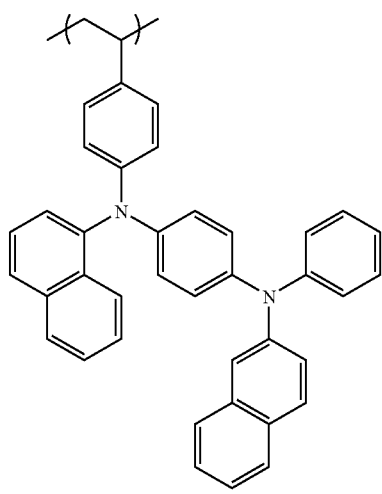
(45)
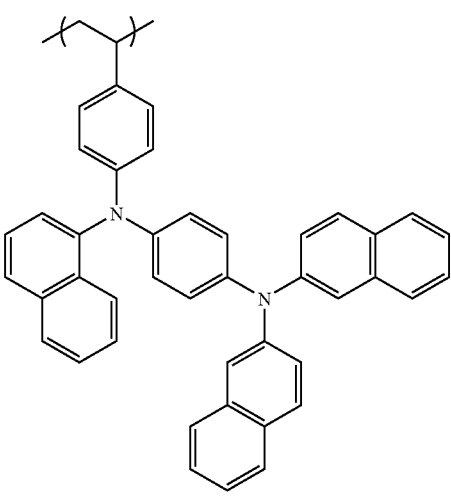
(46)
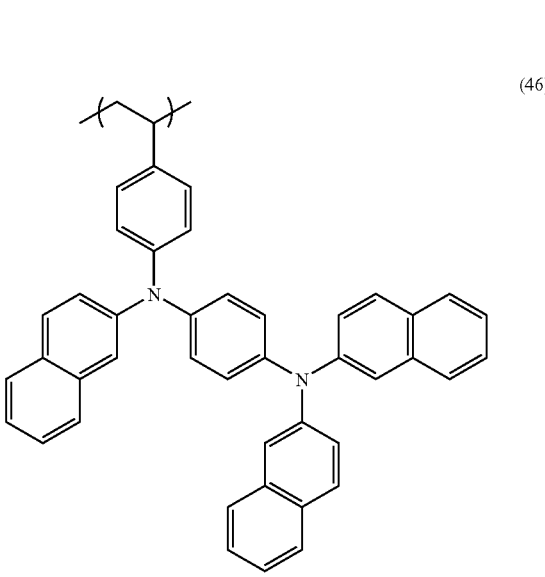
(47)
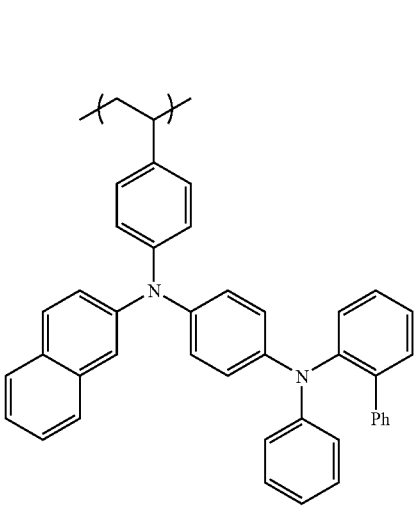

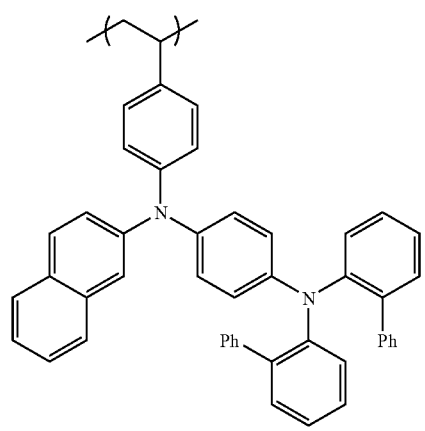
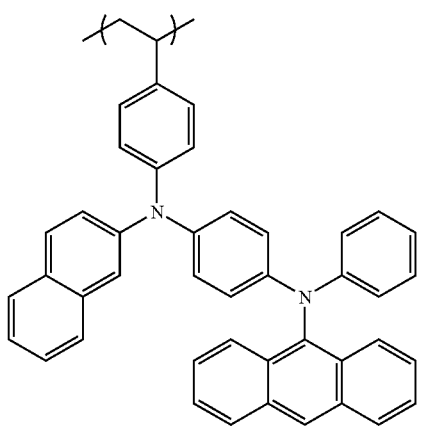
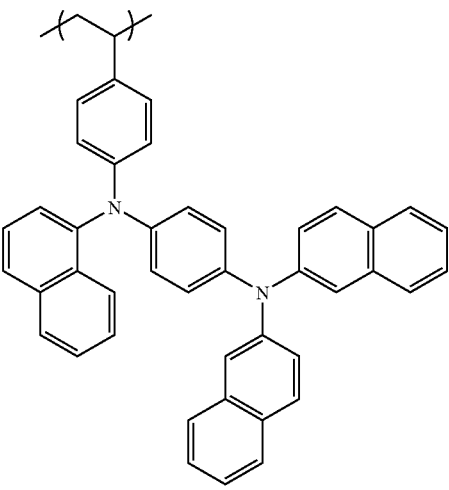

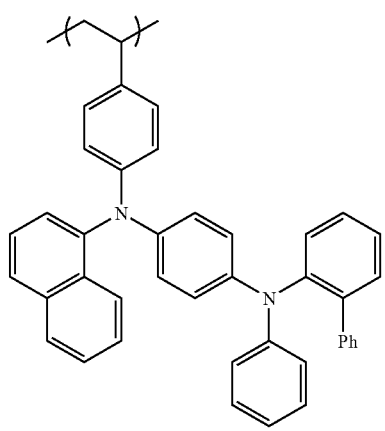
(54)
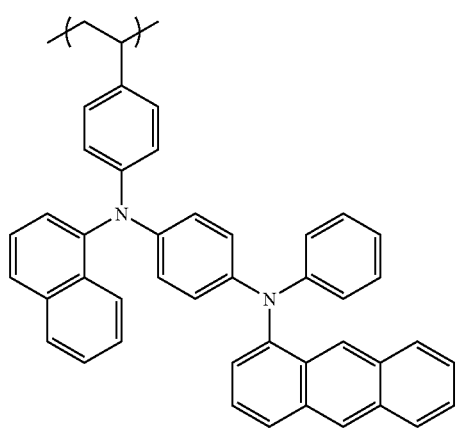
(57)
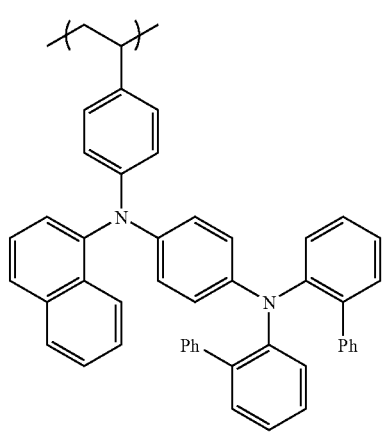
(55)
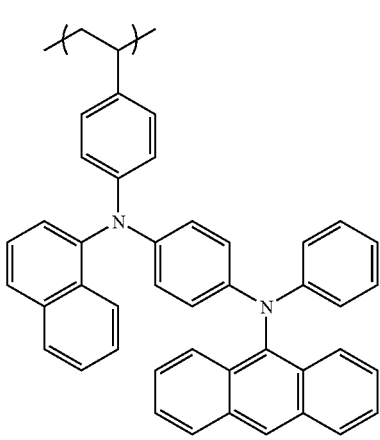
(58)
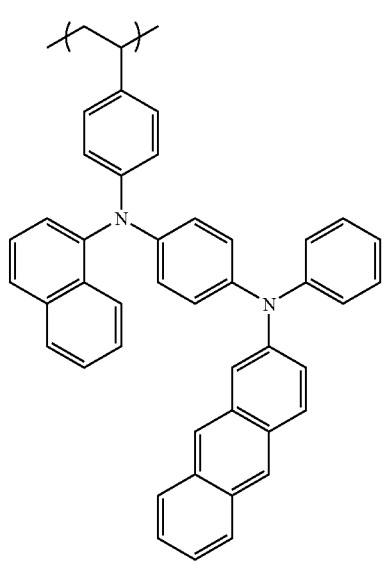
(56)
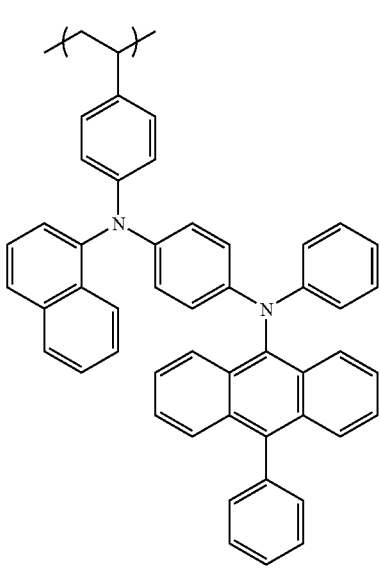
(59)

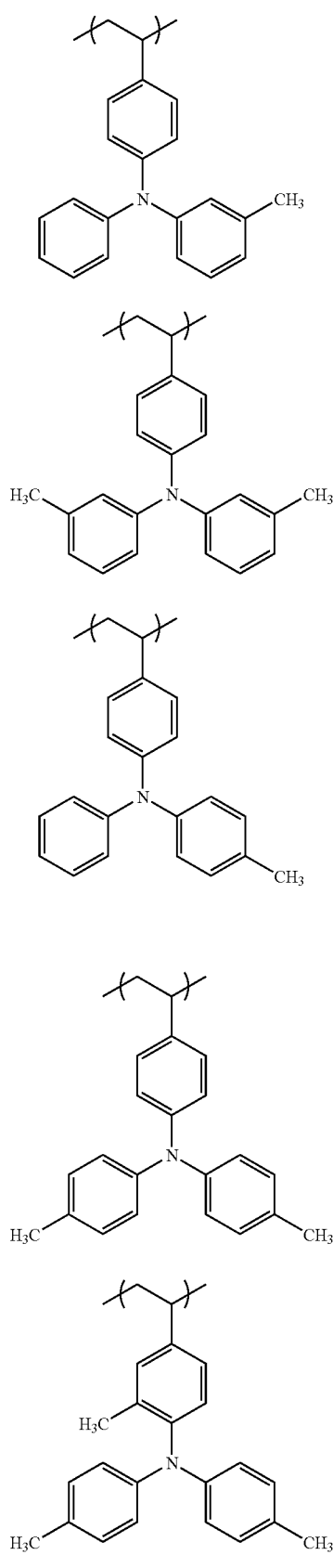
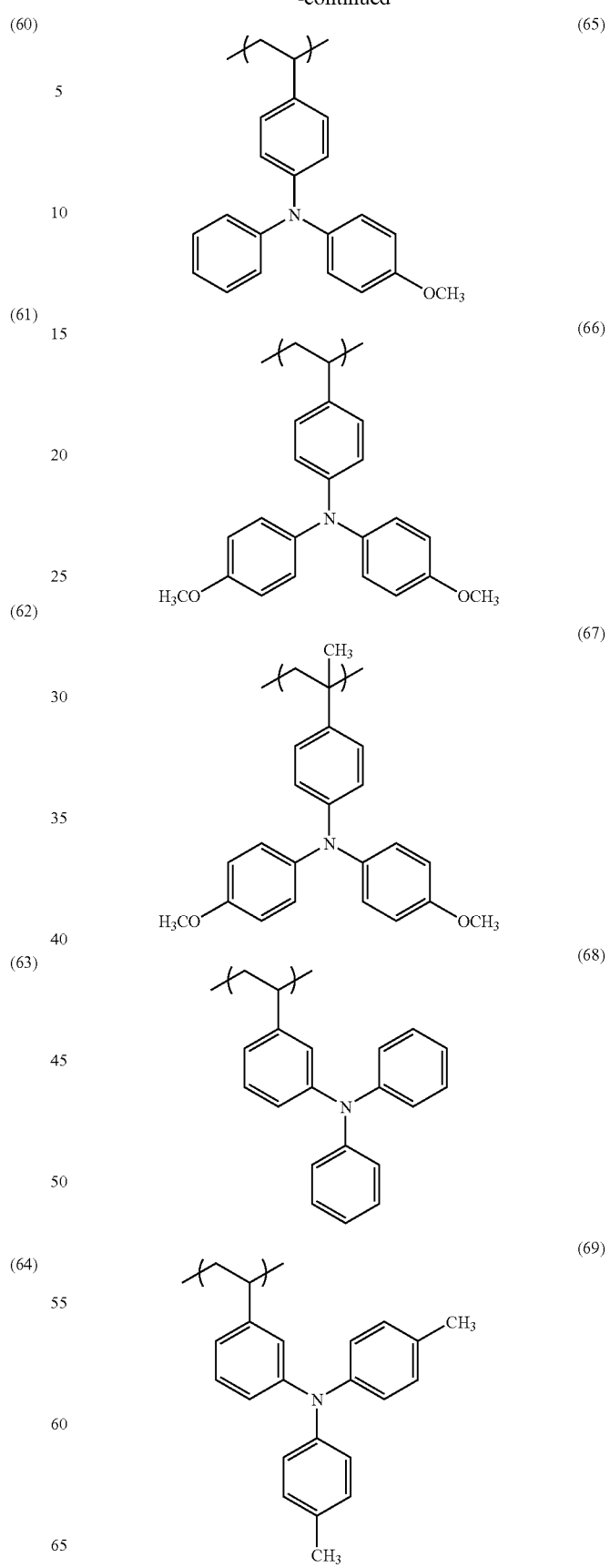

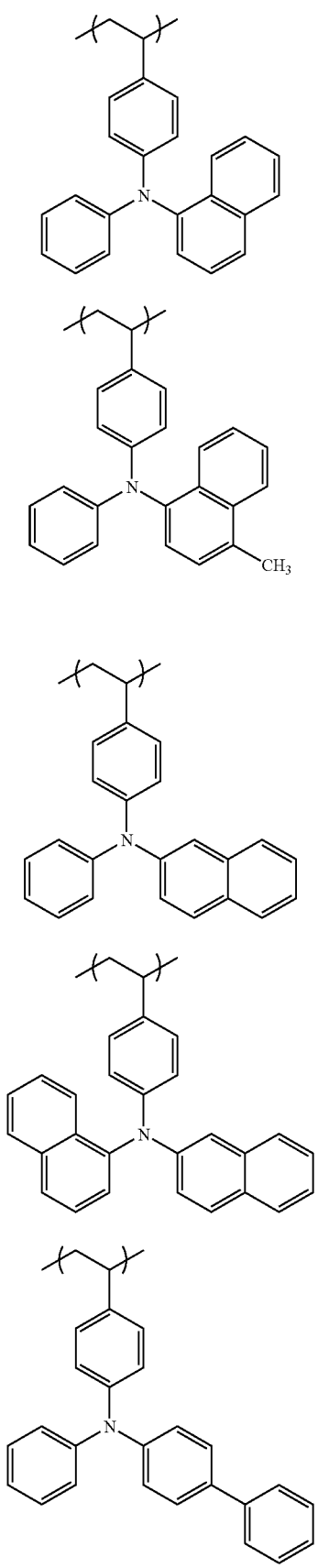
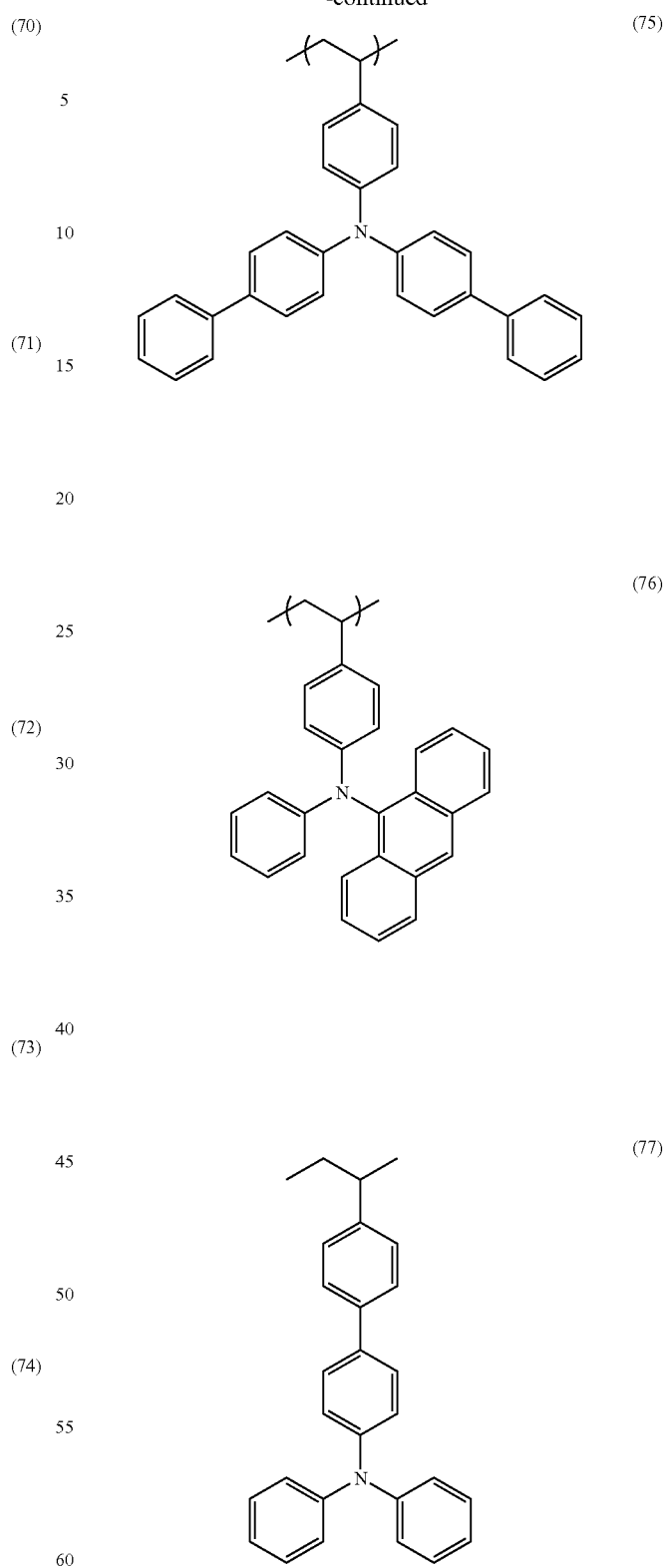
In addition, the present invention may be a composite material including an inorganic compound and a high molecular compound having a repetition unit represented by a structural formula (78).

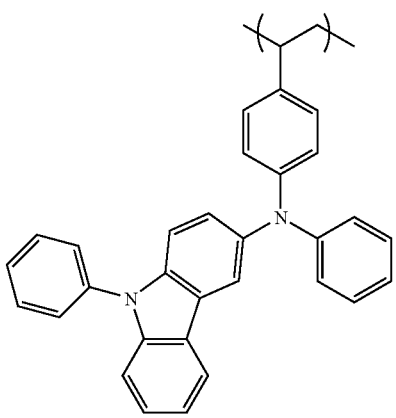

(78)

Since the high molecular compound represented by the structural formula (78) has a high heat resistance property, a composite material which has a higher heat resistance property can be manufactured.

Note that such high molecular compounds preferably have a number average molecular weight of 2000 to 500000, more preferably, a number average molecular weight of 10000 to 100000. In addition, such high molecular compounds each may have a branch and an end group thereof may be any group.

The inorganic compound forming a composite material of the present invention is a metal oxide, and a metal oxide of metals belonging to Group 5 to 7 in the periodic table is preferable. As for such metal oxides, the metal can employ a high oxidation number, and easily accepts electrons. Thus, such metal oxides are preferable. More preferably, a composite material having a high conductivity can be formed by using a vanadium oxide, a molybdenum oxide, a tungsten oxide, a tantalum oxide, a niobium oxide, a rhenium oxide or the like. It should be noted that such oxides may include a hydroxy group.

The absorption spectrum of a composite material of the present invention has a different form from absorption spectra of the inorganic compound and the high molecular compound forming the composite material. In other words, it has an unique absorption peak which cannot be seen in the absorption spectra of the high molecular compound and the inorganic compound. A composite material of the present invention having such characteristics is a material having high conductivity, hole injecting property and hole transporting property.

The unique absorption peak of the composite material is considered absorption which emerges as a result of an interaction of the high molecular compound and the inorganic compound. It is anticipated that the conductivity, the hole injecting property and the hole transporting property are improved by the interaction.

In a composite material of the present invention, as the specific surface area of the inorganic compound is larger, the area for the interaction of the high molecular compound and the inorganic compound becomes larger. Thus, the conductivity, the hole injecting property and the hole transporting property are expected to increase. Therefore, the inorganic compound is preferably dispersed in the high molecular compound as nanoparticles (nanocluster). Although the grain diameter of the nanoparticles (nanocluster) is not limited, a diameter of 20 nm or less is preferable to obtain a large specific surface area. In addition, the grain diameter of the nanoparticles (nanocluster) is preferably 0.5 nm or more so as to have an active surface. Further, more preferable grain diameter of the nanoparticles (nanocluster) is 1 to 10 nm. It should be noted that in this specification, the line analysis of EDX (Energy Dispersive X-ray Spectroscopy) is conducted to obtain a grain diameter of nanoparticles from a half width of a peak.

In order to enhance the film quality of a film made from a composite material, a binder substance may also be included. As the binder substance, polyvinyl alcohol (PVA), polymethyl methacrylate (PMMA), polycarbonate (PC), a phenol resin and the like are given.

Embodiment Mode 2

In Embodiment Mode 2, a film formation method of a composite material shown in Embodiment Mode 1 is described.

A metal alkoxide is used as a component for forming an inorganic compound in a composite material. As described in Embodiment Mode 1, vanadium, molybdenum, tungsten, and tantalum are preferable as the inorganic compound. Note that in a case of using a composite oxide as the inorganic compound, another metal alkoxide may be added. In other words, in a case that a composite oxide including an aluminum oxide skeleton, for example, is used, an aluminum alkoxide such as aluminum triisopropoxide may additionally be added.

A sol is prepared by adding water and a chelating agent such as β-diketon as a stabilizer, into a solution in which this metal alkoxide is dissolved in a proper solvent. As the solvent, for example, tetrahydrofuran (THF), acetonitrile, dichloromethane, dichloroethane, toluene, xylene or a mixed solvent of these can be used, as well as lower alcohol such as methanol, ethanol, n-propanol, i-propanol, n-butanol, and sec-butanol. However, the present invention is not limited to them.

As the compound which can be used as a stabilizer, β-diketones such as acetylacetone, ethyl acetoacetate, benzoylacetone are given, for example. The stabilizer is provided to prevent precipitation inside a sol; however, it is not necessarily provided.

The amount of water to be added is preferably 2 or more and 6 or less equivalent weights with respect to a metal alkoxide, since the metal of the alkoxide generally has diatomic to hexatomic. However, water is not necessarily required, since water is used to control the progress of a reaction of the metal alkoxide.

Subsequently, a solution of a high molecular compound is mixed with the prepared sol, and stirred to obtain a solution including the metal alkoxide and the high molecular compound. After that, by coating and baking, a composite material of the present invention can be formed as a film. As a method of applying the solution, a dip coating method, a spin coating method, a droplet-discharging method typified by an ink-jet method or the like can be adopted. However, the present invention is not limited to the methods. High molecular compounds described in Embodiment Mode 1 can be used for the high molecular compound.

It should be noted that a binder substance may be added, in advance, to the solution, in a case of adding the binder substance. Substances described in Embodiment Mode 1 may be used as the binder substance.

Embodiment Mode 3

Embodiment Mode 3 describes a film formation method of a composite material of the present invention, which is different from the method of Embodiment Mode 2.

A metal alkoxide is used as a component for forming an inorganic compound in a composite material. As described in Embodiment Mode 1, vanadium, molybdenum, tungsten, tantalum, niobium, and rhenium are preferable as the inorganic compound. Note that in the case of using a composite oxide as an inorganic compound, another metal alkoxide may be added. In other words, in a case that a composite oxide including an aluminum oxide skeleton, for example, is used, an aluminum alkoxide such as aluminum triisopropoxide may additionally be added.

A first solution including a metal alkoxide and an organic compound is obtained by dissolving the metal alkoxide and the high molecular compound in a proper solvent, and stirring it. As the solvent, for example, tetrahydrofuran (THF), acetonitrile, dichloromethane, dichloroethane, or a mixed solvent of these can be used, as well as lower alcohol such as methanol, ethanol, n-propanol, i-propanol, n-butanol, and sec-butanol. However, the present invention is not limited to them. As the high molecular compound, high molecular compounds described in Embodiment Mode 1 are used.

After that, by coating, exposing to water vapor and baking, a composite material of the present invention is obtained. As a method of applying a solution, a dip coating method, a spin coating method, a droplet-discharging method typified by an ink-jet method or the like can be adopted. However, the present invention is not limited to the methods.

As a result of exposing the solution to water vapor after applying it, a hydrolysis reaction of the metal alkoxide occurs. Then, it is baked, so that polymerization or cross-linking reaction progresses.

In a case where a binder substance is added, a binder substance may be added in advance to the solution. As for the binder substance, those described in Embodiment Mode 1 may be used.

In this embodiment mode, a stabilizer such as the β-diketone as described in Embodiment Mode 2 may be added into the solution including a metal alkoxide and an organic compound. By adding a stabilizer, multinuclear precipitation of a metal hydroxide due to moisture in the air or the like, can be suppressed. A stabilizer is not necessarily needed, if the manufacturing process is done in an environment whose moisture concentration is 10 ppm or less, like a gloved box in which the moisture concentration is extremely low, before being exposed to water vapor.

Embodiment Mode 4

Embodiment Mode 4 describes a film formation method of a composite material of the present invention, which is different from those of Embodiment Modes 2 and 3.

As a component for forming an inorganic compound included in the composite material, an ammonia water solution is dropped into a water solution of acid salt including a metal to obtain multinuclear precipitation of a metal hydroxide. As the metal for forming the inorganic compound, vanadium, molybdenum, tungsten, and tantalum are preferable. Note that, in a case of applying a composite oxide as an inorganic compound, another metal salt may additionally be added. In other words, when a composite oxide including a skeleton of an aluminum oxide is applied, aluminum salt such as aluminum chloride may additionally be added.

Acid such as acetic acid is added into the obtained precipitation and refluxed, and it is deflocculated to obtain a sol. A solution of a high molecular compound (or a high molecular compound) is added into the obtained sol and was stirred. Thus, a first solution including the sol obtained by deflocculating a metal hydroxide, and the high molecular compound can be obtained. After that, by applying and baking the solution, a composite material of the present invention can be formed as a film. As the method of applying a solution, a dip coating method, a spin coating method, a droplet-discharging method typified by an ink-jet method or the like can be adopted. However, the present invention is not limited to the methods.

It should be noted that a binder substance may be added, in advance, to the solution, in a case of adding the binder substance. Substances described in Embodiment Mode 1 may be used as the binder substance.

Embodiment Mode 5

A light-emitting element of the present invention is described. The light-emitting element of the present invention includes a layer including a light-emitting substance and a layer formed of a composite material between a pair of electrodes. It should be noted that the composite material refers to the material described in Embodiment Mode 1.

FIG. 1 shows a structure of a light-emitting element of the present invention as one example. In the structure, a light-emitting stacked body 103 is sandwiched between a first electrode 101 and a second electrode 102. In this embodiment mode, the first electrode 101 serves as an anode and the second electrode 102 serves as a cathode.

The light-emitting stacked body 103 has a structure in which a first layer 111 and a second layer 112 are stacked.

The first layer 111 has a function of transporting holes to the second layer 112, and a layer made of a composite material of the present invention described in Embodiment Mode 1, which generates holes. Since the composite material of the present invention exhibits excellent hole injecting property and hole transporting property, driving voltage of the light-emitting element can be lowered. Since the first layer 111 including the composite material of the present invention is superior in hole transporting and injecting properties, it is preferably formed closer to the anode than a layer having a function of emitting light. In this embodiment mode, a case that the first layer 111 is provided to be in contact with the first electrode 101 serving as an anode is described.

As the high molecular compound and the inorganic compound included in the composite material, those described in Embodiment Mode 1 may be used.

In addition, the above composite material exhibits high conductivity, and thus, the increase of driving voltage can be suppressed, even when the thickness becomes thicker. Therefore, without increasing the driving voltage, the first layer 111 can be made thicker, thus, short-circuiting of the element caused by dusts or the like can be prevented.

The above composite material includes an inorganic compound, and thus, heat resistance of the light-emitting element can be enhanced.

It should be noted that the first layer 111 may take form in a variety of states, such as a state in which the organic compound becomes a matrix and the inorganic compound is dispersed therein, a state in which the inorganic compound becomes a matrix and the organic compound is dispersed therein, or a state in which the organic compound and the inorganic compound are contained in nearly equal amounts and bound to each other. However, regardless of the state of the first layer 111, electron transfer is done between the high molecular compound and the inorganic compound, and thus, excellent hole injecting and transporting properties and high conductivity can be obtained.

In addition, when a film made from a composite material is formed, a material serving as a binder (a binder substance)

may also be added in order to enhance the film quality. As the binder substance, polyvinyl alcohol (PVA), polymethyl methacrylate (PMMA), polycarbonate (PC), a phenol resin and the like are given.

The second layer 112 is a layer having a light-emitting function. The second layer 112 may have a single layer or a multilayer structure. For example, functional layers such as an electron injecting layer, an electron transporting layer, a hole blocking layer, a hole transporting layer, and a hole injecting layer may be freely combined, in addition to the light-emitting layer. In addition, a known material can be used for the second layer 112, and a low molecular material and a high molecular material can be used. It should be noted that, as a material for forming the second layer 112, organic compound materials containing an inorganic compound as a part can be used, as well as materials made of only an organic compound. An advantageous effect that heat resistance is more enhanced, can be provided, since the second layer 112 also contains an inorganic compound.

A known material can be used as a hole injecting material for forming a hole injecting layer. Specifically, metal oxides such as vanadium oxide, molybdenum oxide, ruthenium oxide, and aluminum oxide are preferable. Alternatively, in a case of using an organic compound, a porphyrin based compound is effective, phthalocyanine ($H_2$—PC), copper phthalocyanine (CuPc) or the like can be used. In addition, a chemically doped conductive high molecular compound can be used, for example, polyethylene dioxythiophene (PEDOT) which is doped with polystyrene sulfonic acid (PSS), or polyaniline (PAni) etc., can be used.

A known material can be used as a hole transporting material for forming a hole transporting layer. As a preferable material, there is an aromatic amine compound (i.e., a compound having a bond of benzene ring-nitrogen). As a widely used material, a star burst aromatic amine compound such as 4,4'-bis[N-(3-methylphenyl)-N-phenyl-amino]-biphenyl (TPD); or derivatives thereof, e.g., 4,4'-bis[N-(1-naphthyl)-N-phenyl-amino]-biphenyl (NPB); 4,4',4"-tris(N,N-diphenyl-amino)-triphenylamine (TDATA); 4,4',4"-tris[N-(3-methylphenyl)-N-phenyl-amino]-triphenylamine (MTDATA) can be given.

The light-emitting layer contains a light-emitting substance. The light-emitting substance is herein a substance that has an excellent emission efficiency and can emit light with a desired wavelength. Although the light-emitting layer is not especially limited, the light-emitting layer is preferably a light-emitting layer in which a light-emitting substance is dispersed in a layer formed of a substance having a larger energy gap than that of the light-emitting substance. This layer can prevent light emitted from the light-emitting substance from quenching due to the concentration. Further, the energy gap indicates an energy gap between the LUMO level and the HOMO level.

The light-emitting substance used for forming a light-emitting layer is not especially limited. A substance having an excellent emission efficiency that can emit light with a desired emission wavelength may be used. In order to emit red light, for example, the following substances exhibiting emission spectrum with peaks at 600 to 680 nm can be employed: 4-dicyanomethylene-2-isopropyl-6-[2-(1,1,7,7-tetramethyljulolidin-9-yl)ethenyl]-4H-pyran (DCJTI); 4-dicyanomethylene-2-methyl-6-[2-(1,1,7,7-tetramethyl-9-ljulolidin-9-yl)ethenyl]-4H-pyran (DCJT); 4-dicyanomethylene-2-tert-butyl-6-[2-(1,1,7,7-tetramethyljulolidin-9-yl)ethenyl]-4H-pyran (DCJTB); periflanthene; 2,5-dicyano-1,4-bis[2-(10-methoxy-1,1,7,7-tetramethyljulolidin-9-yl)ethenyl]benzene; and the like. In order to obtain green light emission, substances exhibiting emission spectrum with peaks at 500 to 550 nm such as N,N'-dimethylquinacridon (DMQd), coumarin 6, coumarin 545T, and tris(8-quinolinolato)aluminum ($Alq_3$) can be employed. In order to obtain blue light emission, the following substances exhibiting emission spectrum with peaks at 420 to 500 nm can be employed: 9,10-bis(2-naphthyl)-tert-butylanthracene (t-BuDNA); 9,9'-bianthryl; 9,10-diphenylanthracene (DPA); 9,10-bis(2-naphthyl)anthracene (DNA); bis(2-methyl-8-quinolinolato)-4-phenylphenolato-gallium (BGaq); bis(2-methyl-8-quinolinolato)-4-phenylphenolato-aluminum (BAlq); and the like. In addition to the above mentioned fluorescent substances, the following phosphorescent substances can be used as light-emitting substances: bis[2-(3,5-bis(trifluoromethyl)phenyl)pyridinato-N,$C^{2'}$]iridium(III)picolinate ($Ir(CF_3ppy)_2(pic)$); bis[2-(4,6-difluorophenyl)pyridinato-N,$C^{2'}$]iridium(III) acetylacetonate (FIr(acac)); bis[2-(4,6-difluorophenyl)pyridinato-N,$C^{2'}$]iridium(III) picolinate (FIr(pic)); tris(2-phenylpyridinato-N,$C^{2'}$)iridium ($Ir(ppy)_3$); and the like.

A substance used for dispersing a light-emitting substance is not especially limited. For example, an anthracene derivative such as 9,10-di(2-naphthyl)-2-tert-butylanthracene (t-BuDNA); a carbazole derivative such as 4,4'-bis(N-carbazolyl)biphenyl (CBP); a metal complex such as bis[2-(2-hydroxyphenyl)pyridinato]zinc ($Znpp_2$); and bis[2-(2-hydroxyphenyl)benzoxazolato]zinc (ZnBOX); and the like can be used.

As a material with an electron transporting property that is used for forming an electron transporting layer, a known material can be used. Specifically, a typical metal complex such as tris(8-quinolinolato)aluminum ($Alq_3$); tris(4-methyl-8-quinolinolato)aluminum ($Almq_3$); bis(10-hydroxybenzo[h]-quinolinato)beryllium ($BeBq_2$); bis(2-methyl-8-quinolinolato)-(4-hydroxy-biphenyl)-aluminum (BAlq); bis[2-(2-hydroxyphenyl)-benzoxazolato]zinc ($Zn(BOX)_2$); and bis[2-(2-hydroxyphenyl)-benzothiazolato]zinc ($Zn(BTZ)_2$) can be given. In addition, a hydrocarbon compound such as 9,10-diphenylanthracene and 4,4'-bis(2,2-diphenylethenyl)biphenyl is preferably employed. Additionally, a triazole derivative such as 3-(4-tert-butylphenyl)-4-(4-ethylphenyl)-5-(4-biphenyl)-1,2,4-triazole; a phenanthroline derivative such as bathophenanthroline and bathocuproine may be used.

As a material with an electron injecting property that is used for forming an electron injecting layer, a known material can be used. Specifically, alkali metal salt and alkaline earth metal salt such as calcium fluoride, lithium fluoride, lithium oxide and lithium chloride are preferable. Alternatively, a layer in which a donor compound such as lithium is added to a so-called electron transporting material such as tris(8-quinolinolato)aluminum ($Alq_3$) or bathocuproine (BCP), can be employed.

It should be noted that since the first layer 111 serves as a hole injecting layer, a hole injecting layer is not necessarily formed in the second layer 112 in this embodiment mode.

In this embodiment mode, a dopant that contributes to light emission is added only to the light-emitting layer and light emitted from the dopant is only observed. However, a dopant exhibiting different light emission may be added to, for example, an electron transporting layer or a hole transporting layer. When a color of light emitted from the light-emitting layer and a color of light emitted from the dopant added to the other layer are complementary to each other, white light emission can be obtained.

By changing the materials of the first electrode 101 or the second electrode 102, there are different variations for the light emitting element of this embodiment mode. Schematic views of the variations are shown in FIGS. 3A to 3C and FIGS. 4A to 4C. Further, the reference numerals used in FIG. 1 are also used in FIGS. 3A to 3C and FIGS. 4A to 4C. Moreover, reference numeral 100 represents a substrate for supporting a light emitting element of the present invention.

Figure 3A:
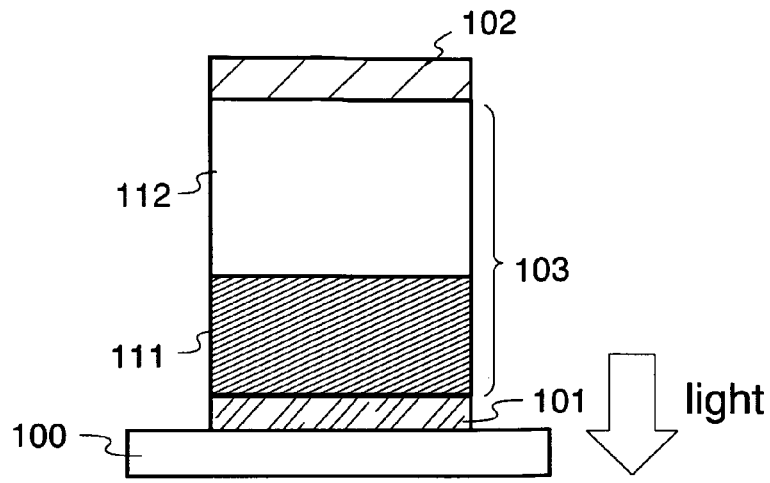
FIGS. 3A to 3C each show a light-emitting element of the present invention.
Figure 3B:
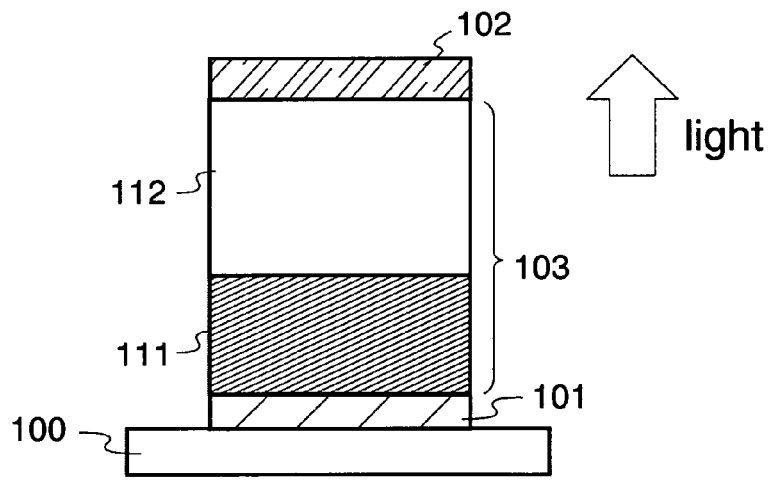
Figure 3C:
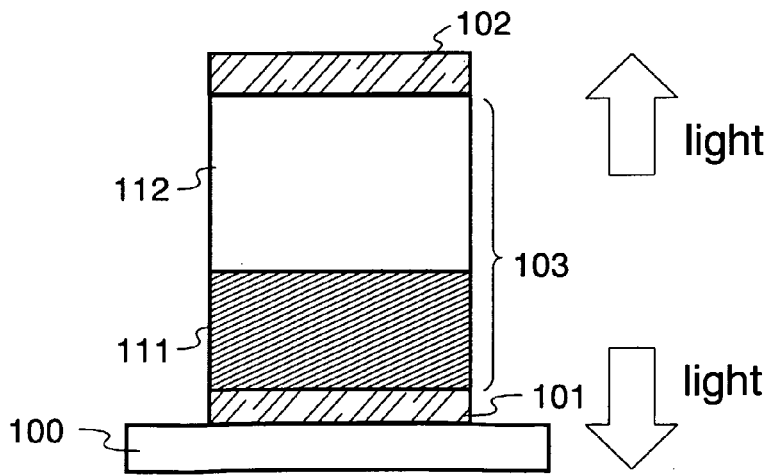

FIGS. 3A to 3C each show an example in which the first layer 111 and the second layer 112 included in the light-emitting stacked body 103 are stacked in this order over the substrate 100. In this case, when the first electrode 101 is formed using a material having a light transmitting property, light can be emitted through the substrate 100 as shown in FIG. 3A. Also, when the first electrode 101 is formed using a material with a light-shielding property (in particular, light reflecting property) and the second electrode 102 is formed using a material having a light transmitting property, light can be emitted through the side opposite the substrate 100 as shown in FIG. 3B. Further, when the first electrode 101 and the second electrode 102 are both formed using a material having a light transmitting property, light can be emitted toward both the substrate 100 and the side opposite the substrate as shown in FIG. 3C.

Figure 4A:
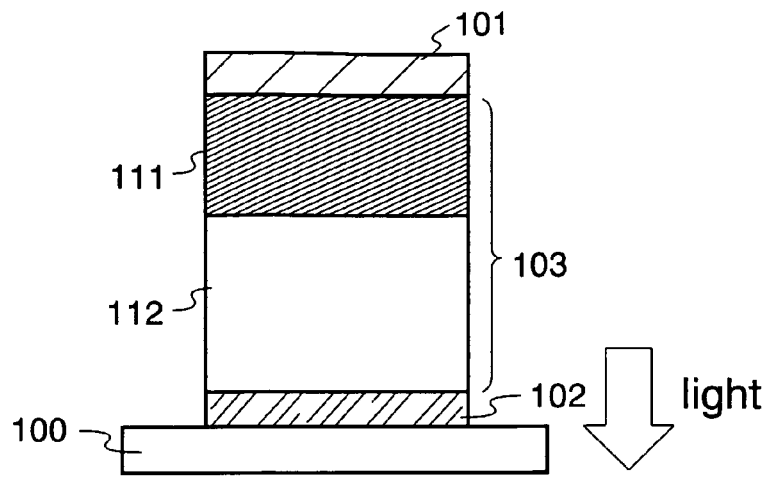
FIGS. 4A to 4C each show a light-emitting element of the present invention.
Figure 4B:
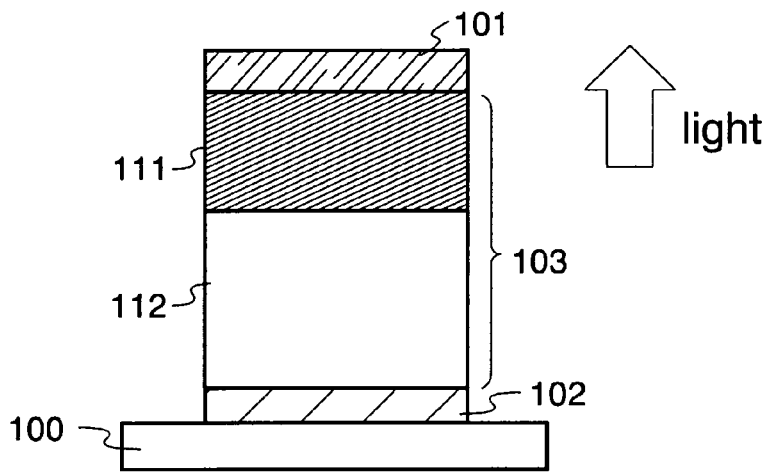
Figure 4C:
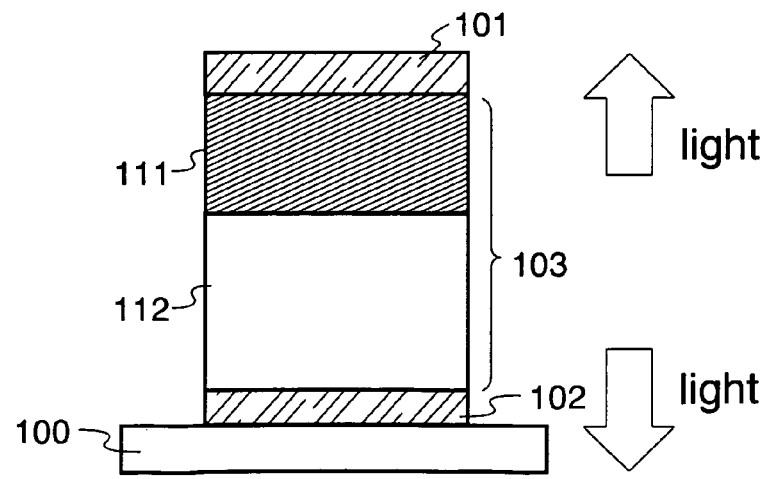

FIGS. 4A to 4C each show an example in which the second layer 112 and the first layer 111 included in the light-emitting stacked body 103 are stacked in this order over the substrate 100. In this case, when the first electrode 101 is formed using a material having a light-shielding property (in particular, light reflecting property) and the second electrode 102 is formed using a material having a light transmitting property, light can be emitted through the substrate 100 as shown in FIG. 4A. When the first electrode 101 is formed using a material having a light transmitting property and the second electrode 102 is formed using a material having a light-shielding property (in particular, light reflecting property), light can be emitted through the side opposite the substrate 100 as shown in FIG. 4B. Further, when the first electrode 101 and the second electrode 102 are both formed using a material having a light transmitting property, light can be emitted toward both the substrate 100 and the side opposite the substrate 100 as shown in FIG. 4C.

In the light emitting element of this embodiment mode, since the first layer 111 includes the composite material of the present invention described in Embodiment Mode 1, the first layer 111 exhibits extremely excellent hole injecting and transporting properties. Therefore, the increase in driving voltage can be suppressed even when the thickness of the first layer 111 is increased. As a consequence, short-circuiting of the light emitting element can be prevented while suppressing the increase in driving voltage. Moreover, in order to improve the color purity by an optical design, the thickness of the first layer 111 can be freely set.

In the light-emitting element of this embodiment mode, the first layer 111 is formed of the composite material of the present invention described in Embodiment Mode 1. Hence, the first layer 111 can be formed with good throughput even when the substrate size becomes larger. It is advantageous for mass production. It is possible that the throughput can be increased dramatically as compared with when all layers are formed by an evaporation method, since the first layer 111 is formed using the composite material of the present invention described in Embodiment Mode 1 even if the second layer 112 is formed by an evaporation method.

In addition, as in the structures in FIGS. 4A to 4C, when the second electrode 102 is formed, and the second layer 112 and the first layer 111 are sequentially formed, and the first electrode 101 is formed by a sputtering method, damages to the second layer 112 including a light-emitting substance can be reduced.

Embodiment Mode 6

Embodiment Mode 6 describes a manufacturing method of a light-emitting element shown in Embodiment Mode 5.

The first electrode 101 is formed first. The first electrode 101 can be formed using a known material by a known method. Specifically, indium tin oxide (ITO), indium tin oxide containing silicon (ITSO), indium oxide containing zinc oxide (IZO), a metal compound such as titanium nitride, a metal such as Cr, W, Zn, Pt, Al or Ag, or an alloy containing the elements, and the like are preferable.

Then, the first layer 111 is formed. The first layer 111 can be formed by any method shown in Embodiment Modes 2 to 4. The methods shown in Embodiment Modes 2 to 4 are each a wet method, and thus the methods are suitable for mass-production achieved by increasing the substrate size.

Next, the second layer 112 is formed. The second layer 112 can be formed using a known material by a known method. In a case of employing a wet method to form the second layer 112, all layers included in the light-emitting stacked body 103 can be formed by a wet method, and thus, a wet method can be correspond to the increase of substrate size and is suitable for mass production. For example, a light-emitting substance such as poly (2,5-dihexoxy-1,4-phenylenevinylene) (MEH-PPV) can be formed by a wet method. It is possible that the throughput can be increased dramatically as compared with when all layers are formed by an evaporation method, since the first layer 111 is formed using a composite material of the present invention described in Embodiment Mode 1 even if the second layer 112 is formed by an evaporation method.

The second electrode 102 can be formed using a known material by a known method. Specifically, materials mentioned in the description of the first electrode 101 can be used, and one or both of the first electrode 101 and the second electrode 102 may have a light-transmitting property.

In accordance with the above method, a light-emitting element of the present invention can be manufactured. Since the manufacturing method of a light-emitting element of the present invention which is employed for forming the first layer 111 is a wet method, the method can respond to the increase in a substrate size and is suitable for mass production. In particular, when the second layer 112 is also formed by a wet method using a known polymer light-emitting material or the like, all layers included in the light-emitting stacked body 103 can be formed by a wet method. Thus, the present invention can easily respond to the increase in a substrate size, and is suitable for mass production. It is possible that the throughput can be increased dramatically as compared with when all layers are formed by an evaporation method, since the first layer 111 is formed by a wet method using a composite material of the present invention even if another layer is formed by an evaporation method. It is advantageous for mass production achieved by increasing a substrate size.

It should be noted that this embodiment mode has described the method of forming layers from the first electrode 101 side. However, the light-emitting element may be formed by stacking layers from the second electrode 102 side.

Embodiment Mode 7

Embodiment Mode 7 describes a case that a layer containing a composite material is formed not to be in contact with an anode, between the anode and a light-emitting layer.

Figure 2:
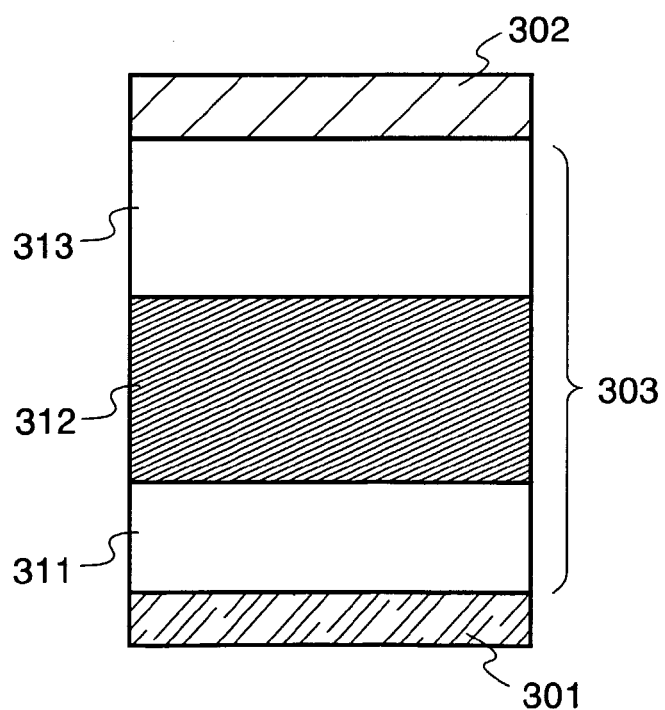
FIG. 2 shows a light-emitting element of the present invention.

FIG. 2 shows an example of a light-emitting element of the present invention. A light-emitting stacked body 303 is sandwiched between a first electrode 301 and a second electrode 302. The light-emitting stacked body 303 has a structure in which the first layer 311, the second layer 312 and the third layer 313 are stacked. In this embodiment mode, the first electrode 301 serves as an anode and the second electrode 302 serves as a cathode.

The first layer 311 has a function of injecting holes. A know material can be used for a hole injecting material for forming a hole injecting layer. Specifically, hole injecting materials described in Embodiment Mode 5 can be used.

The second layer 312 is a layer including a composite material described in Embodiment Mode 1. The same structure as the first layer 111 shown in Embodiment Mode 5 can be applied to the second layer 312.

The third layer 313 has a function of emitting light, and the same structure as the second layer 112 shown in Embodiment Mode 5 can be applied to the third layer 313.

By adopting the above structure, even when the second layer 312 is made thicker, the increase of driving voltage can be suppressed. Therefore, the increase of the driving voltage can be suppressed, short-circuiting of an element can be prevented, and further, enhancement of color purity by optical adjustment can be realized In addition, in the light-emitting element of this embodiment mode, the second layer 312 is formed using a composite material of the present invention described in Embodiment Mode 1. Hence, the second layer 312 can be formed with good throughput regardless of the increase in a substrate size, and is suitable for mass production. It is possible that the throughput can be increased dramatically as compared with when all layers are formed by an evaporation method, since the second layer 312 is formed using the composite material described in Embodiment Mode 1 even if another layer is formed by an evaporation method. Thus, it is advantageous for mass production achieved by increasing a substrate size.

Embodiment Mode 8

Embodiment Mode 8 describes a light-emitting element having a different structure from those described above, with reference to FIG. 5.

Figure 5:
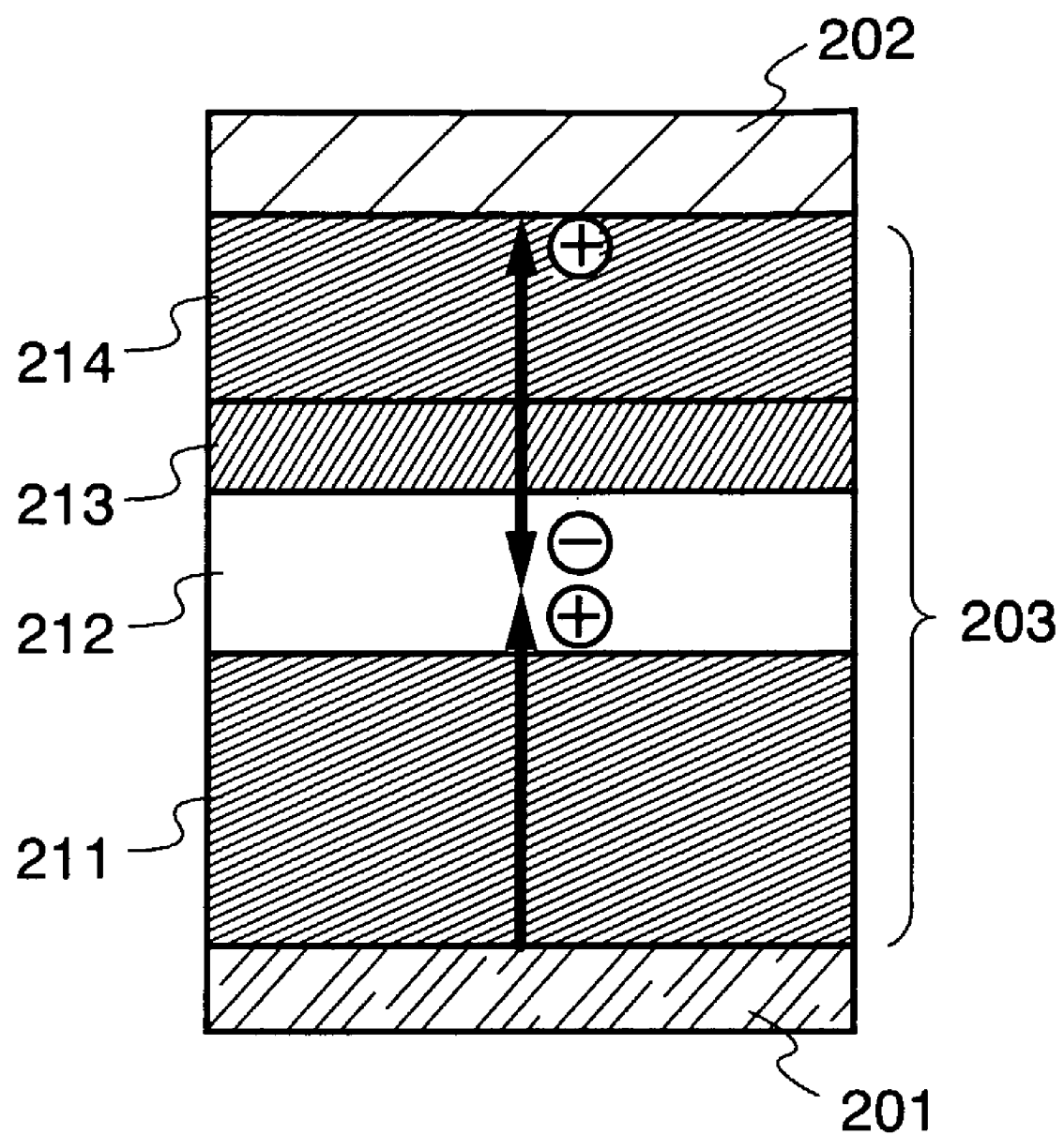
FIG. 5 shows a light-emitting element of the present invention.

FIG. 5 shows a structure of a light-emitting element of the present invention as one example. A light-emitting stacked body 203 is sandwiched between a first electrode 201 and a second electrode 202. The light-emitting stacked body 203 includes a structure in that a first layer 211, a second layer 212, a third layer 213 and a fourth layer 214 are stacked in this order. This embodiment mode describes a case that the first electrode 201 serves as an anode, and the second electrode 202 serves as a cathode.

The light-emitting element of this embodiment mode is operated as follows. When voltage is applied such that a potential of the first electrode 201 is higher than that of the second electrode 202, holes are injected into the second electrode 202 from the fourth layer 214 while electrons are injected into the second layer 212 from the third layer 213. Also, holes are injected into the first layer 211 from the first electrode 201, and holes are injected to the second layer 212 from the first layer 211. The holes injected from the first layer 211 and the electrons injected from the third layer 213 are recombined in the second layer 212, so that a light-emitting substance is excited. The excited light-emitting substance emits light when returning to a ground state from the excited state.

The first electrode 201, the second electrode 202, the first layer 211 and the second layer 212 can have the same structures as the first electrode 101, the second electrode 102, the first layer 111 and the second layer 112 in Embodiment Mode 5, respectively. In other words, the first electrode can be formed using a known material, the first layer 211 includes a composite material described in Embodiment Mode 1, and the second layer 212 has a function of emitting light.

The third layer 213 includes a material having a donor level for generating electrons. As such a layer, a layer including an electron transporting substance and a substance showing an electron donating property to the substance, is given. Herein, the electron transporting substance is a substance which has a property of transporting electrons rather than holes. The electron transporting substance is not especially limited, and for example, 2-(4-biphenylyl)-5-(4-tert-butylphenyl)-1,3,4-oxadiazole (PBD); 1,3-bis[5-(p-tert-butylphenyl)-1,3,4-oxadiazol-2-yl]benzene (OXD-7); 3-(4-tert-butylphenyl)-4-phenyl-5-(4-biphenylyl)-1,2,4-triazole (TAZ); and 3-(4-tert-butylphenyl)-4-(4-ethylphenyl)-5-(4-biphenylil)-1,2,4-triazole (p-EtTAZ); bathophenanthroline (BPhen), bathocuproine (BCP); and the like can be used, as well as metal complexes such as tris(8-quinolinolato)aluminum ($Alq_3$); tris(4-methyl-8-quinolinolato)aluminum ($Almq_3$); bis(10-hydroxybenzo[h]-quinolinato)beryllium ($BeBq_2$); bis(2-methyl-8-quinolinolato)-4-phenylphenolato-aluminium (BAlq); bis[2-(2-hydroxyphenyl)benzoxazolate]zinc (Zn$(BOX)_2$); and bis[2-(2-hydroxyphenyl)benzothiazolato]zinc (Zn$(BTZ)_2$). In addition, the substance showing an electron donating property to the electron transporting substance is not especially limited, and for example, alkali metals such as lithium and cesium, alkaline earth metals such as magnesium and calcium, rare-earth metal such as erbium and ytterbium, and the like can be used. Further, a substance selected from alkali metal oxides or alkaline earth metal oxides, such as lithium oxides ($Li_2O$), calcium oxides (CaO), sodium oxide ($Na_2O$), potassium oxide ($K_2O$), and magnesium oxide (MgO), may be used as the substance showing an electron donating property to an electron transporting substance. Note that alkali metal oxides, alkaline earth metal oxides, and the like are easy to treat, since they are less reactive. In addition, the second layer 312 may be a layer formed of an n-type semiconductor such as zinc oxide, zinc sulphide, zinc selenide, tin oxide or titanium oxide.

The fourth layer 214 includes an organic compound and an inorganic compound showing an electron accepting property to the organic compound. Therefore, the inorganic compounds described in Embodiment Mode 1 can be used as the inorganic compound included in the fourth layer. However, the inorganic compound included in the fourth layer 214 may be the same as that included in the first layer 211, or different from that included in the first layer 211.

By adopting such a structure, as shown in FIG. 5, electron transfer is conducted in the vicinity of an interface between the third layer 213 and the fourth layer 214 by applying a voltage, and electrons and holes are generated. Then, the third layer 213 transports electrons into the second layer 112, and at the same time, the fourth layer 214 transports holes into the second electrode 102. In other words, the third layer 213 and the fourth layer 214 serve as carrier generating layers together. In addition, it can be said that the fourth layer 214 has a function of transporting holes to the second electrode 102. It should be noted that a multiphoton type light-emitting element can also be obtained by further stacking another second layer and another third layer between the fourth layer 214 and the second electrode 202.

The first layer 211 or the fourth layer 214 exhibits extremely excellent hole injecting and transporting properties. Therefore, the increase in driving voltage can be suppressed even when the thickness of the first layer 211 is increased. Thus, in the light-emitting element of this embodiment mode, it is possible that the opposite sides of the second layer 212 having a light-emitting function can be made extremely thicker. As a consequence, short-circuiting of the light emitting element can be prevented more efficiently. Moreover, in order to improve the color purity by an optical design, the thicknesses in the both sides of the second layer 212 can be freely set. Furthermore, in a case where, after forming the light-emitting stacked body 203, the first electrode 201 or the second electrode 202 is formed by sputtering, damages to the second layer 212 including the light-emitting substance can be reduced. Further, by forming the first layer 211 and the fourth layer 214 using the same material, the layers formed with the same material are located at the opposite sides of the second layer 212. Thus, it can be expected that stress strain can be suppressed.

Further, in the light-emitting element of this embodiment mode, by changing the kind of the first electrode 201 or the second electrode 202, many variations for the light emitting element can be provided. Schematic views of the variations are shown in FIGS. 6A to 6C and FIGS. 7A to 7C. The reference numerals used in FIG. 5 are also used in FIGS. 6A to 6C and FIGS. 7A to 7C. Reference numeral 200 represents a substrate for supporting a light emitting element of the present invention.

Figure 6A:
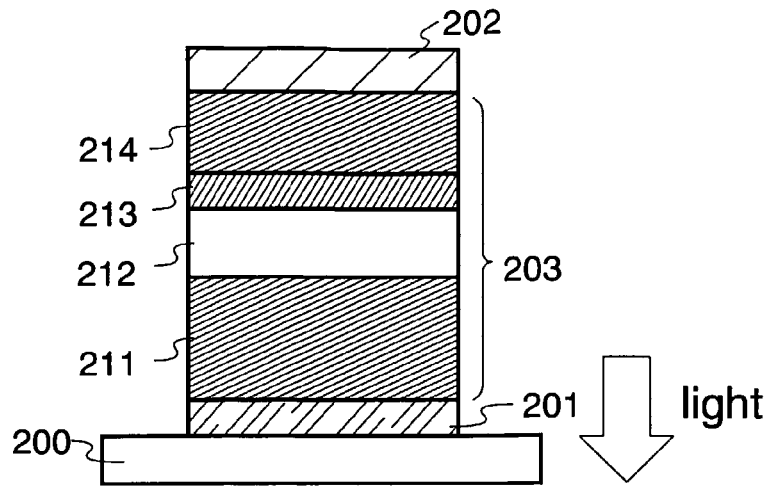
FIGS. 6A to 6C each show a light-emitting element of the present invention.
Figure 6B:
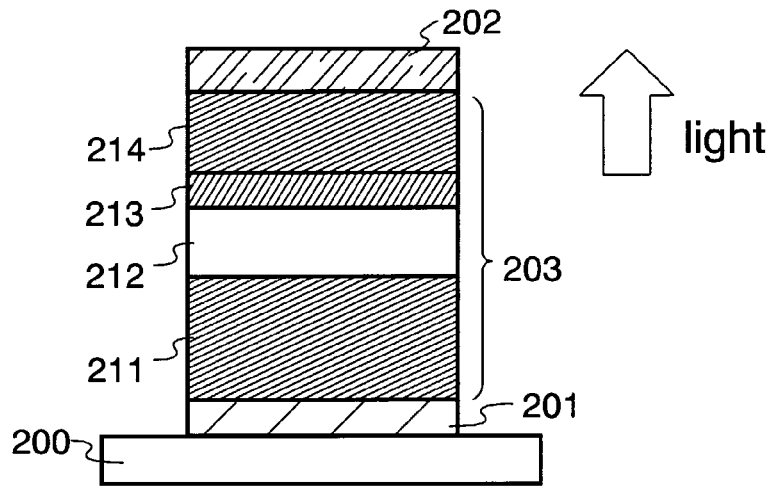
Figure 6C:
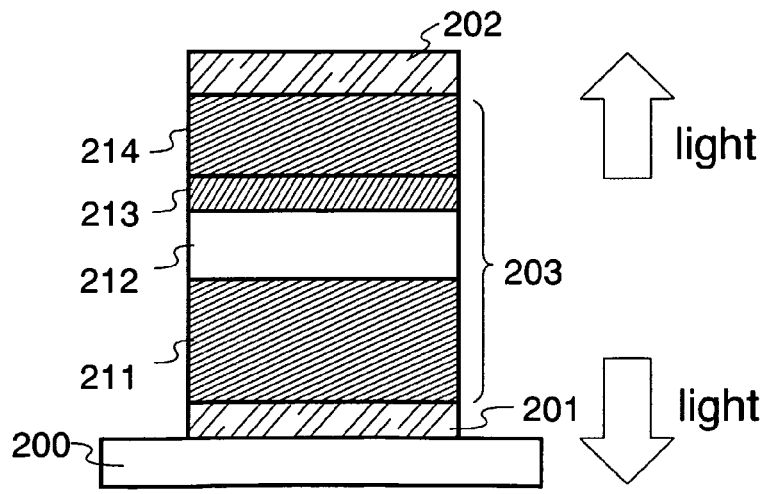

FIGS. 6A to 6C each show an example in which a light-emitting stacked body 203 includes a first layer 211, a second layer 212, a third layer 213, and a fourth layer 214, which are stacked in this order over the substrate 200. In this case, when the first electrode 201 is formed using a material with a light transmitting property and the second electrode 202 is formed using a material with a light-shielding property (in particular, light reflecting property), light can be emitted through the substrate 200 as shown in FIG. 6A. When the first electrode 201 is formed using a material with a light-shielding property (in particular, light reflecting property) and the second electrode 202 is formed using a material with a light transmitting property, light can be emitted through the side opposite the substrate 200 as shown in FIG. 6B. Further, when the first electrode 201 and the second electrode 202 are both formed using a material having a light transmitting property, light can be emitted through both the substrate 200 and the side opposite the substrate, as shown in FIG. 6C.

Figure 7A:
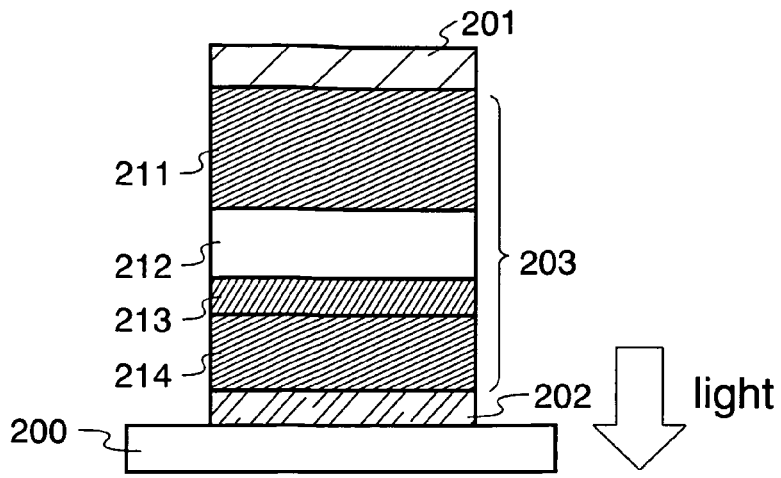
FIGS. 7A to 7C each show a light-emitting element of the present invention.
Figure 7B:
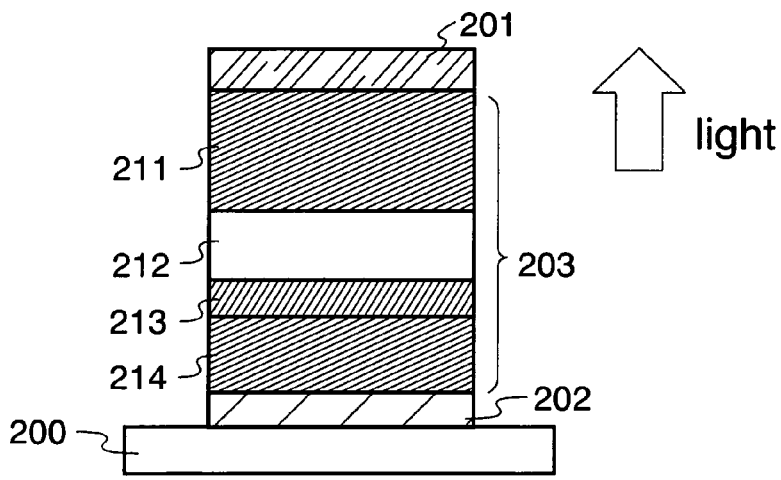
Figure 7C:
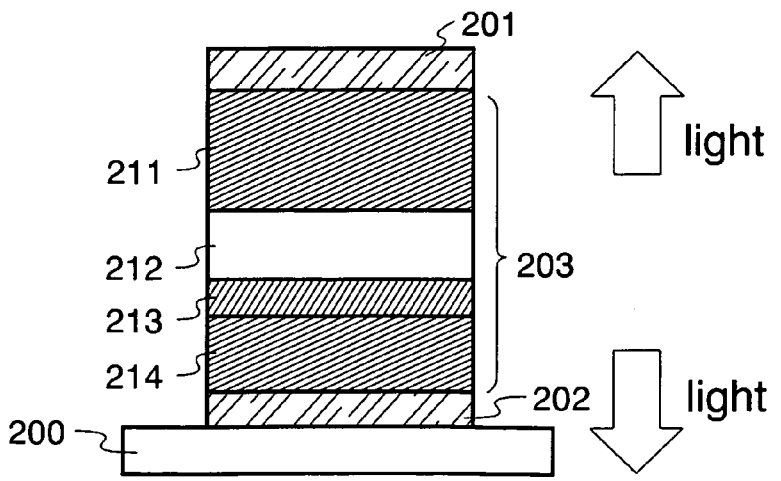

FIGS. 7A to 7C each show an example in which a light-emitting stacked body 203 includes a fourth layer 214, a third layer 213, a second layer 212 and a first layer 1211, which are stacked in this order over the substrate 200. In this case, when the first electrode 201 is formed using a material with a light-shielding property (in particular, light reflecting property) and the second electrode 202 is formed using a substance with a light transmitting property, light can be emitted through the substrate 200 as shown in FIG. 7A. When the first electrode 201 is formed using a material with a light transmitting property and the second electrode 202 is formed using a material with a light-shielding property (in particular, light reflecting property), light can be emitted through the side opposite side the substrate 200 as shown in FIG. 7B. Further, when the first electrode 201 and the second electrode 202 are both formed using a material with a light transmitting property, light can be emitted through both the substrate 200 and the side opposite the substrate 200, as shown in FIG. 7C.

When the light-emitting element in this embodiment mode is formed, it can be formed in accordance with the method described in Embodiment Mode 6. In other words, the first electrode 201, the second electrode 202, the second layer 212 and the third layer 213 can be formed by a known method, and the first layer 211, and the fourth layer 214 each can be formed by appropriately adopting any one of the methods described in Embodiment Modes 2 to 4. The fourth layer 214 may be formed by another method, for example, an evaporation method.

Further, when the fourth layer 214 is formed using a composite material of Embodiment Mode 1 by a wet method, the first layer 211 may be formed by a known method such as an evaporation method. In addition, in the case of forming the fourth layer 214 by a wet method, the first layer 211 is not necessarily required.

After forming the first electrode 201, the first layer 211, the second layer 212, the third layer 213, and the fourth layer 214 may be sequentially stacked, and then, the second electrode 202 may be formed. Alternatively, after forming the second electrode 202 first, the fourth layer 214, the third layer 213, the second layer 22, and the first layer 211 may be sequentially formed, and then, the first electrode may be formed.

In addition, it is possible that the first layer 211 includes a material having a donor level for generating electrons, the third layer 213 includes an organic compound and an inorganic compound showing an electron accepting property to the organic compound, and the fourth layer 214 includes a material having a donor level for generating electrons. In this case, since the third layer 213 includes an organic compound and an inorganic compound showing an electron accepting property to the organic compound, it has an excellent hole transporting property. Therefore, the driving voltage of the light-emitting element can be reduced. In addition, the thickness of the third layer 213 can be freely set, for the sake of enhancement in color purity by an optical design.

In addition, in the light-emitting element of this embodiment mode, the first layer 211 and the fourth layer 214 are formed using composite materials of the present invention described in Embodiment Mode 1. Hence, the first layer 211 and the fourth layer 214 can be formed with good throughput regardless of the increase in a substrate size, and is suitable for mass production. It is possible that the throughput can be increased dramatically as compared with when all layers are formed by an evaporation method, since the first layer 211 and the fourth layer 214 are formed using a composite material of the present invention described in Embodiment Mode 1 even if another layer is formed by an evaporation method. It is advantageous for mass production achieved by increasing the substrate size.

Embodiment Mode 9

Embodiment Mode 9 describes a structure of a light-emitting element in which a layer made from a composite material is sandwiched between a plurality of layers having light-emitting functions.

Figure 11:
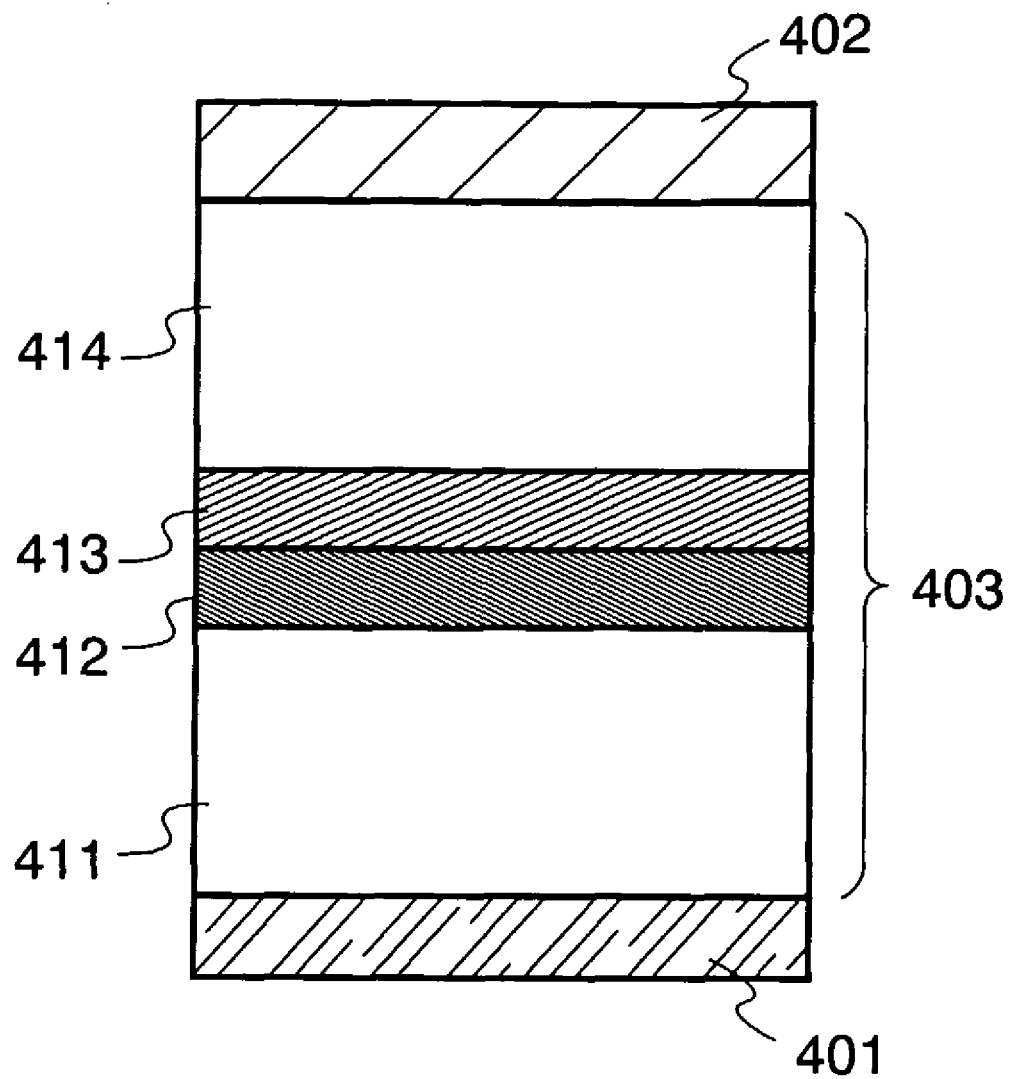
FIG. 11 shows a light-emitting element of the present invention.

FIG. 11 shows a structure of a light-emitting element of the present invention as one example. A light-emitting stacked body 403 is sandwiched between a first electrode 401 and a second electrode 402. The light-emitting stacked body 403 includes a structure in which a first layer 411, a second layer 412, a third layer 413 and a fourth layer 414 are stacked in this order. This embodiment mode describes a case that the first electrode 401 serves as an anode, and the second electrode 402 serves as a cathode.

The light-emitting element of this embodiment mode is operated as follows. When voltage is applied such that a potential of the first electrode 401 is higher than that of the second electrode 402, holes are injected into the first layer 411 from the first electrode 401, and electrons are injected into the first layer 411 from the second layer 412. Also, holes are injected into the fourth layer 414 from the third layer 413 and electrons are injected into the fourth layer 414 from second electrode 402. The holes injected from the first electrode 401 and the electrons injected from the second layer 412 are recombined in the first layer 411, so that a light-emitting substance is excited. The light-emitting substance emits light when the excited light-emitting substance returns to a ground state from the excited state. Also, holes injected from the third layer 413 and electrons injected from the second electrode 402 are recombined in the fourth layer 414, a light-emitting substance in the fourth layer 414 is excited to emit light.

The first layer 411 has a first layer having a function of emitting light and the fourth layer 414 is a second layer having a function of emitting light. The first and second layers having functions of emitting light can have the same structure as that of the second layer 112 shown in Embodiment Mode 5. The structure of the first and second layers having functions of emitting light may be the same or different. In addition, emission colors in light-emitting layers of first and second layers having functions of emitting light may be the same or different. When the emission colors of the two layers are the same, about double luminance can be obtained with the same current density. In addition, by making the emission colors of the two layers different, emission of a mixed color of the two colors can be obtained.

The second layer 412 is a layer including a material having a donor level for generating electrons. The same structure as the third layer 213 shown in Embodiment Mode 8 can be applied to the second layer 412. The third layer 413 is a layer including a composite material of the present invention described in Embodiment Mode 1.

When a light-emitting element in this embodiment mode is manufactured, it can be manufactured in accordance with the method described in Embodiment Mode 6.

In other words, the first electrode 401, the second electrode 402, the first layer 411, the second layer 412, and the fourth layer 414 can be formed by a known method, and the third layer 413 can be formed by appropriately selecting one of methods described in Embodiment Modes 2 to 4.

In the light-emitting element of this embodiment mode, the third layer 413 is formed using a composite material described in Embodiment Mode 1. Hence, the third layer 413 can be formed with good throughput regardless of the increase in a substrate size, and is suitable for mass production. It is possible that the throughput can be increased dramatically as compared with a case that all layers are formed by an evaporation method, since the third layer 413 is formed using a composite material of the present invention described in Embodiment Mode 1 even if another layer is formed by an evaporation method.

Note that this embodiment mode can be freely combined with Embodiment Modes 1 to 8.

Embodiment Mode 10

Embodiment Mode 10 describes a light-emitting device having a light-emitting element of the present invention.

This embodiment mode describes a light-emitting device having a light-emitting element of the present invention in its pixel portion with reference to FIGS. 9A and 9B. FIG. 9A is a top view of the light-emitting device, while FIG. 9B is a cross-sectional view taken along A-A' and B-B' in FIG. 9A. Reference numeral 601 shown by a dotted line denotes a driver circuit portion (source side driver circuit); 602, a pixel portion; 603, a driver circuit portion (gate side driver circuit); 604, a sealing substrate; 605, a sealing material; and 607, a space surrounded by the sealing material 605.

Reference numeral 608 denotes a wiring for transmitting signals to be input into the source side driver circuit portion 601 and the gate side driver circuit portion 603 and receiving signals such as a video signal, a clock signal, a start signal, and a reset signal from an FPC (flexible printed circuit) 609 serving as an external input terminal. Note that a print wiring board (PWB) may be attached to this FPC, and the light-emitting device in this specification may include not only the light-emitting device itself but also the light-emitting device with the FPC and/or the PWB attached thereto.

Next, the cross-sectional structure is described with reference to FIG. 9B. The driver circuit portion and the pixel portion are formed over an element substrate 610. Here, the source side driver circuit portion 601, which is the driver circuit portion, and one pixel of the pixel portion 602 are shown.

In the source side driver circuit portion 601, a CMOS circuit is formed in which an n-channel TFT 623 and a p-channel TFT 624 are combined. Further, the driver circuit may be formed with a known CMOS circuit, PMOS circuit, or NMOS circuit using TFTs. Although this embodiment mode shows an example of forming the pixel portion and the driver circuit formed over the same substrate, the present invention is not limited to this, and the driver circuit can also be formed outside, not over the same substrate as the pixel portion.

The pixel portion 602 is formed with a plurality of pixels including a switching TFT 611, a current controlling TFT 612, and a first electrode 613 connected electrically with a drain of the current controlling TFT 612. An insulator 614 is formed to cover the end portions of the first electrode 613. Here, a positive photosensitive acrylic resin film is used.

In order to improve the coverage, the insulator 614 is formed to have a curved surface with curvature at its upper or lower end portions. For example, in the case of using positive photosensitive acrylic for the insulator 614, only the upper end portion of the insulator 614 preferably has a curved surface with a radius of curvature (0.2 to 0.3 μm). The insulator 614 may be formed with either a negative type, which becomes insoluble to the etchant by the irradiation of light, or a positive type, which becomes soluble to the etchant by the irradiation of light.

A light-emitting stacked body 616 and a second electrode 617 are formed over the first electrode 613. The first electrode 613 serving as an anode in this embodiment mode is preferably formed with a material having a high work function. For example, a single layer of an indium tin oxide (ITO) film, an indium tin oxide film containing silicon, an indium oxide film containing zinc oxide (ZnO) of 2 to 20 wt %, a titanium nitride film, a chromium film, a tungsten film, a Zn film, a Pt film, a stacked layer of a titanium nitride film and a film mainly containing aluminum, a three-layer stacked structure of a titanium nitride film, a film mainly containing aluminum and a titanium nitride film, and the like can be used. Note that, when a stacked structure is employed, resistance of a wiring is low and a favorable ohmic contact is obtained.

The light-emitting stacked body 616 includes a composite material generating holes shown in Embodiment Mode 1. This composite material can be formed by any of the methods shown in Embodiment Modes 2 to 4. Since the methods are each a wet method, they can respond to the increase in a substrate size. When other layers included in the light-emitting stacked body 616 than the layer of the composite material, are formed by a wet method, all layers included in the light-emitting stacked body 616 can be formed by a wet method. Thus, it is suitable for mass production.

The composite material shown in Embodiment Mode 1 has an excellent carrier injecting property and an excellent carrier transporting property. Thus, the driving voltage of a light-emitting element can be reduced.

As the material for the second electrode (cathode) 617 formed over the light-emitting stacked body 616, a material having a low work function is preferable (such as Al, Mg, Li, Ca, an alloy or compound such as MgAg, MgIn, AlLi, $CaF_2$ or $Ca_3N_2$). When light generated in the light-emitting stacked body 616 passes through the second electrode 617, a stacked layer of a thin metal film having a thin thickness, or a transparent conductive film (such as ITO, IZO, ITSO, ZnO or the like) is preferably used as the second electrode (cathode) 617.

Further, a light-emitting element 618 is provided in the space 607 surrounded by the element substrate 610, the sealing substrate 604, and the sealing material 605 by pasting the sealing substrate 604 and the element substrate 610 using the sealing material 605. The space 607 may be filled with an inert gas (such as nitrogen or argon), or may be filled with the sealing material 605.

An epoxy based resin is preferably used for the sealing material 605. It is preferable that these materials do not transmit oxygen or moisture as much as possible. As the material for the sealing substrate 604, a glass substrate, a quartz substrate, further, a plastic substrate made of FRP (Fiberglass-Reinforced Plastics), PVF (polyvinyl fluoride), mylar, polyester, acrylic, or the like can be used.

In this manner, a light-emitting device having a light-emitting element of the present invention can be obtained.

Since the light-emitting device of the present invention employs a composite material described in Embodiment Mode 1, the driving voltage can be reduced. Thus, power consumption can be reduced.

Since the light-emitting element of this embodiment mode is formed using a composite material described in Embodiment Mode 1, the light-emitting device can be formed with good throughput even when the substrate size becomes larger. It is advantageous for mass production. It is possible that the throughput can be increased dramatically as compared with a case that all layers are formed by an evaporation method, since a composite material described in Embodiment Mode 1 is used even when the light-emitting stacked body is formed in combination with an evaporation method. It is advantageous for mass production achieved by increasing the substrate size.

In addition, the composite material described in Embodiment Mode 1, which is included in the light-emitting element of the present invention, exhibits high conductivity. Therefore, without increasing the driving voltage, the light-emitting stacked body 616 can be made thicker; thus, short-circuiting caused by dusts or the like can be prevented. Therefore, a light-emitting device having few defects can be provided.

Figure 8:
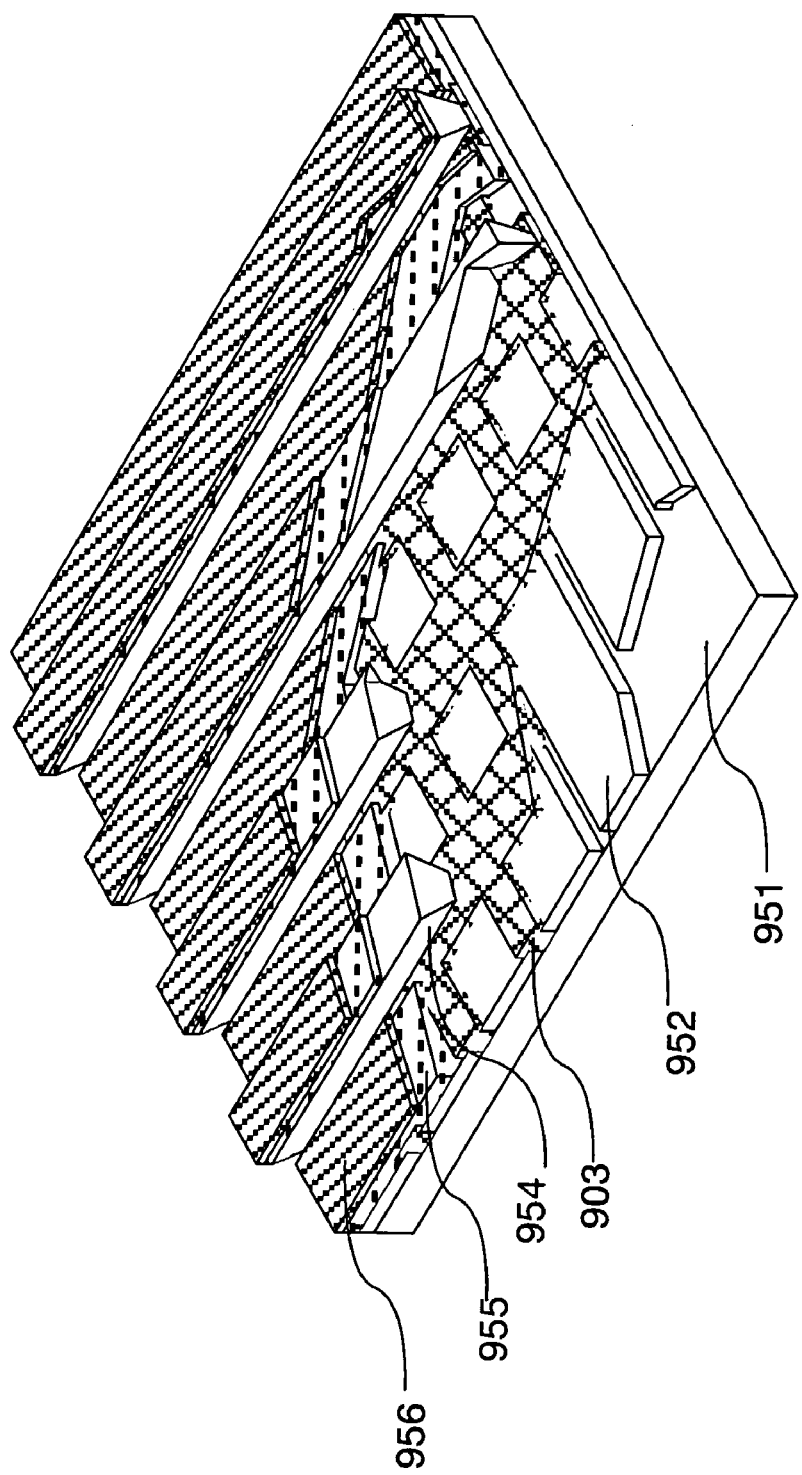
FIG. 8 shows a light-emitting device.

As set forth above, an active matrix light-emitting device which controls the driving of the light-emitting element using a transistor has been described in this embodiment mode. In addition, a passive light-emitting device which drives a light-emitting element without providing a driving element such as a transistor may be employed. FIG. 8 shows a perspective view of a passive matrix light-emitting device which is manufactured in accordance with the present invention. In FIG. 8, a light-emitting stacked body layer 955 is provided between an electrode 952 and an electrode 956 over a substrate 951. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. That is, a cross section in a short side of the partition layer 954 is a trapezoidal shape, and a lower side (the side is in contact with the insulating layer 953) is shorter than an upper side (the side is not in contact with the insulating layer 953). By providing the partition layer 954 in this manner, defects of the light-emitting element due to static charge and the like can be prevented. In addition, by utilizing the light-emitting element of the present invention, which operates at low driving voltage, for a passive matrix light-emitting device, the passive matrix light-emitting device can be driven at lower power consumption.

Embodiment Mode 11

Embodiment mode 11 will describe some of various electronic devices of the present invention. Electronic devices of the present invention are, for example, cameras such as video cameras or digital cameras, goggle type displays, navigation systems, audio reproduction devices (such car audios or audio components), personal computers, game machines, mobile information terminals (such as mobile computers, cell phones, portable game machines, or electronic books), image reproduction devices utilizing a recording medium (such as devices which can reproduce a recording medium such as a digital versatile disk (DVD) and is equipped with a display device capable of displaying the image) and the like. Electronic devices of the present invention are not limited to the above mentioned electronic devices; however, concrete example of these electronic devices are shown in FIGS. 10A to 10E.

FIG. 10A shows a television receiving machine including a casing 9101, a supporting stand 9102, a display portion 9103, speaker portions 9104, a video input terminal 9105, and the like. The television receiving machine of the present invention is manufactured by using a light-emitting device having a light-emitting element of the present invention for the display portion 9103. By using the light-emitting device of the present invention, a television receiving machine with low power consumption and having a display portion with few defects can be provided. It is to be noted that the television receiving machine includes all types of information display devices, e.g., a display device for a computer, one for TV broadcast reception, one for advertisement display, and so on.

FIG. 10B shows a computer including a main body 9201, a casing 9202, a display portion 9203, a keyboard 9204, an external connection port 9205, a pointing mouse 9206, and the like. The computer of the present invention is manufactured by using a light-emitting device having a light-emitting element of the present invention for the display portion 9203. By using the light-emitting device of the present invention, a computer with low power consumption and having a display portion with few defects can be provided.

FIG. 10C shows a goggle-type display including a main body 9301, display portions 9302, arm portions 9303, and the like. The goggle-type display of the present invention is manufactured by using a light-emitting device having a light-emitting element of the present invention for the display portion 9302. By using the light-emitting device of the present invention, a goggle-type display with low power consumption and having a display portion with few defects can be provided.

FIG. 10D shows a cell phone including a main body 9401, a casing 9402, a display portion 9403, an audio input portion 9404, an audio output portion 9405, operation keys 9406, an external connection port 9407, an antenna 9408, and the like. The cell phone of the present invention is manufactured by using a light-emitting device having a light-emitting element of the present invention for the display portion 9403. By using the light-emitting device of the present invention, a cell phone with low power consumption and having a display portion with few defects can be provided. In addition, the power consumption of the cell phone can be suppressed by displaying white characters against black in the display portion 9403.

FIG. 10E shows a camera including a main body 9501, a display portion 9502, a casing 9503, an external connection port 9504, a remote control receiving portion 9505, an image receiving portion 9506, a battery 9507, an audio input portion 9508, operation keys 9509, an eyepiece portion 9510, and the like. The camera of the present invention is manufactured by using a light-emitting device having a light-emitting element of the present invention for the display portion 9502. By using the light-emitting device of the present invention, a camera with low power consumption and having a display portion with few defects can be provided.

As thus described, a light-emitting device having a light-emitting element according to the present invention can be applied in an extremely wide range, and the light-emitting device can be applied to electronic devices of every field. By using a light-emitting device having a light-emitting element of the present invention, electronic devices with low power consumption and few defects can be provided.

Example 1

Synthesis Example 1

A synthesis method of poly{4-[N-(4-diphenylaminophenyl)-N-phenyl]aminostyrene} (PStDPA) which is a high molecular compound having a repetition unit represented by the structural formula (4), will be described.

[Step 1] A synthesis of N-(4-diphenylamino)phenylaniline

In a 1000 mL erlenmayer flask, 25.19 g (0.102 mol) of triphenylamine, 18.05 g (0.102 mol) of N-bromosuccinimide (NBS), and 400 ml of ethyl acetate were put, and stirred at a room temperature in the air overnight (for about 18 hours). After completion of the reaction, the organic layer was washed twice with a saturated aqueous solution of sodium carbonate, then, the water layer was extracted twice with ethyl acetate, and the ethyl acetate layer and the organic layer were washed with a saturated saline. After drying with magnesium sulfate, it was filtrated naturally and concentrated. The obtained colorless solid was recrystallized with ethyl acetate and hexane to obtain of 22.01 g of a colorless powdery solid with the yield of 66%. Nuclear magnetic resonance (NMR) was used to confirm that this colorless powdery solid was N,N-diphenyl-N-(4-bromophenyl)amine. The measurement result by nuclear magnetic resonance (NMR) is shown below.

$^1$H-NMR data of this compound is shown below. $^1$H-NMR (300 MHz, CDCl$_3$) ppm: 7.32 (d, 2H, J=8.7 Hz), 7.29-7.23 (m, 4H), 7.08-7.00 (m, 6H), 6.94 (d, 2H, J=8.7 Hz).

In addition, a synthesis scheme of N,N-diphenyl-N-(4-bromophenyl)amine is shown by the following formula.

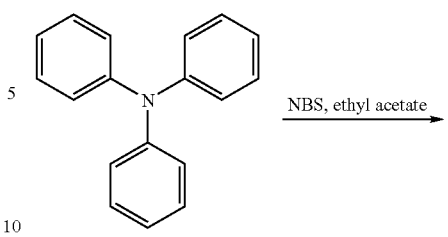

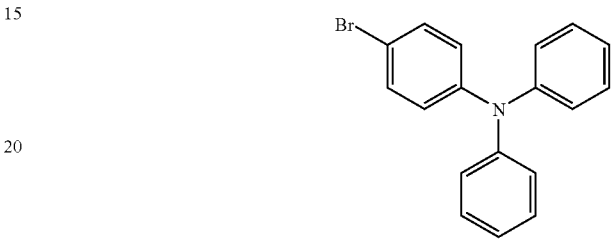

Dehydrogenated toluene solution (5 mL) including N,N-diphenyl-N-(4-bromophenyl)amine (559 mg, 6 mmol), bis(dibenzylideneacetone)palladium(0) (Pd(dba)$_2$) (345 mg, 0.6 mmol), sodium-tert-butoxide (t-BuONa) (577 mg, 6 mmol) was deaerated. Thereafter, aniline (559 mg, 6 mmol) and tri-tert-butylphosphine (P(t-Bu)$_3$) (0.37 mL, 1.8 mmol) were added thereto, and stirred under a nitrogen atmosphere at 80° C. for 5 hours. It was confirmed using a thin film chromatography that N,N-diphenyl-N-(4-bromophenyl)amine as a raw material was lost. After that, saturation saline was added thereto, and a water layer was extracted with about 100 ml of ethyl acetate. The organic layer was dehydrogenated with magnesium sulfate and filtered. The filtrate was concentrated, and then refined in a silica gel column of ethyl acetate:hexane=1:20 (the yield: 42%).

It was confirmed with a nuclear magnetic resonance method (NMR) that the obtained solid was N-(4-diphenylamino)phenylaniline.

$^1$H-NMR of this compound is shown as follows. $^1$H-NMR (300 MHz, CDCl$_3$) dppm: 7.32 (d, 2H, J=8.7 Hz), 7.29-7.23 (m, 5H), 7.08-7.00 (m, 6H), 6.94 (d, 2H, J=8.7 Hz)

A synthesis scheme of N-(4-diphenylamino)phenylaniline is shown by the following formula.

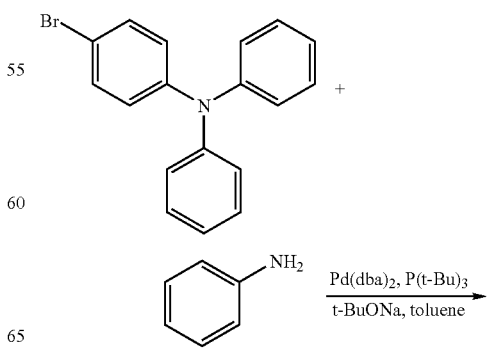

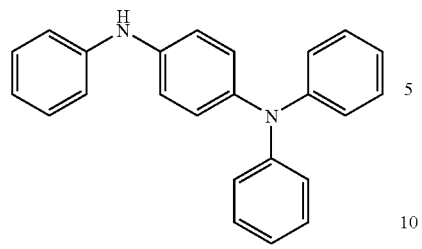

[Step 2]

A synthesis of a compound of 4-[N-(4-diphenylaminophenyl)-N-phenyl]aminobenzaldehyde Under nitrogen, 4.09 g (17.9 mmol) of 2-(4-bromophenyl)-1,3-dioxolane, and 0.3 mL of P(t-Bu)$_3$ 43% hexane solution were added to 100 mL of a dried toluene suspension including 10.0 g (29.8 mmol) of the synthesized N-(4-diphenylamino)phenylaniline, 200 mg (0.348 mmol) of Pd(dba)$_2$, 11.0 g (114 mmol) of t-BuONa, and stirred for 3 hours at 80° C.

The reaction mixture was filtered through florisil, alumina and Celite. The obtained filtrate was washed with a saturated saline. This organic layer was dried with magnesium sulfate, filtered and concentrated. The obtained yellow solid was dissolved in about 100 mL of tetrahydrofuran (THF), and then, about 50 mL of 3% hydrochloric acid was added to the solution and stirred at a room temperature overnight (for about 18 hours). The reaction solution was extracted with ethyl acetate, and then, the obtained oily crude product was refined in column chromatography (the developing solvent: hexane and ethyl acetate) to obtain a yellow solid of 6.76 g with the yield of 86%. It was confirmed with a nuclear magnetic resonance method (NMR) that the obtained yellow solid was 4-[N-(4-diphenylaminophenyl)-N-phenyl]aminobenzaldehyde.

Figure 12:
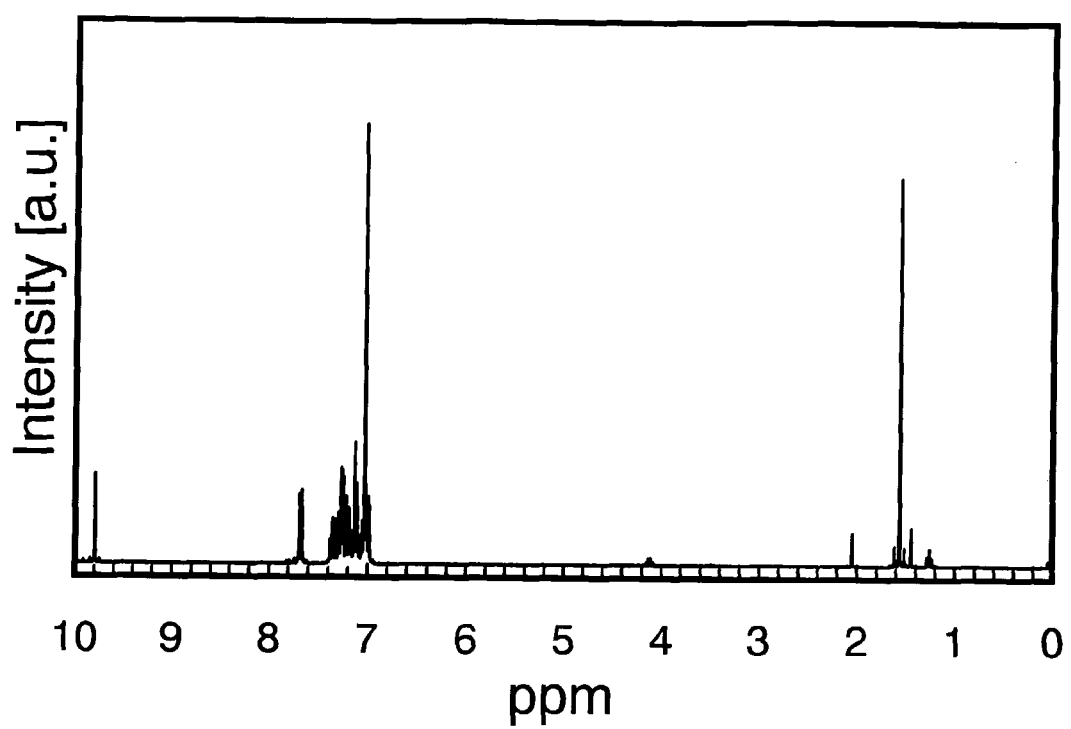
FIG. 12 is an NMP spectrum of 4-[N-(4-diphenylaminophenyl)-N-phenyl]aminobenzaldehyde.

FIG. 12 shows an NMR spectrum of this compound. In addition, $^1$H-NMR is as follows: $^1$H-NMR (300 MHz, CDCl$_3$) δ ppm: 9.79 (s, 1H), 7.68 (d, J=9.0 Hz), 6.89-7.40 (m, 23H).

In addition, a synthesis scheme of 4-[N-(4-diphenylaminophenyl)-N-phenyl]aminobenzaldehyde is shown by the next formula.

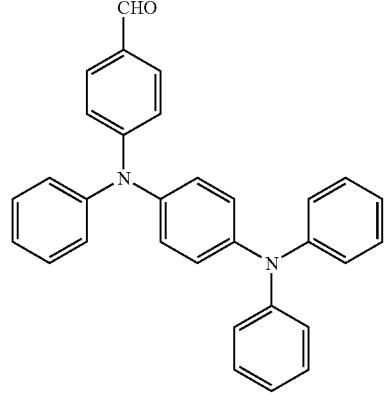

[Step 3] A synthesis of 4-[N-(4-diphenylaminophenyl)-N-phenyl]aminostyrene

Under nitrogen, 15 mL of n-butyllithium (1.58 mol/L) was dropped, at −40° C., into a suspension of dried tetrahydrofuran (100 mL) including 9.31 g (23.0 mmol) of methyl triphenylphosphonium iodine. After the dropping, it was stirred at 0° C. for 1 hour. Into the obtained reaction solution, a dried tetrahydrofuran solution including 6.76 g (15.4 mmol) of 4-[N-(4-diphenylaminophenyl)-N-phenyl]aminobenzaldehyde synthesized in Step 2 was added, and stirred at a room temperature overnight (for about 18 hours).

After the reacted mixture was filtered through Celite, water was added thereto and an organic layer was extracted with ethyl acetate. The organic layer was dried with magnesium sulfate, filtered, and concentrated, the obtained residue was refined in silica gel column chromatography (the developing solvent: hexane and ethyl acetate) to obtain a light-yellow solid of 4.54 g with the yield of 81%. It was confirmed with a nuclear magnetic resonance method (NMR) that the obtained light-yellow solid was 4-[N-(4-diphenylaminophenyl)-N-phenyl]aminostyrene (StDPA).

Figure 13:
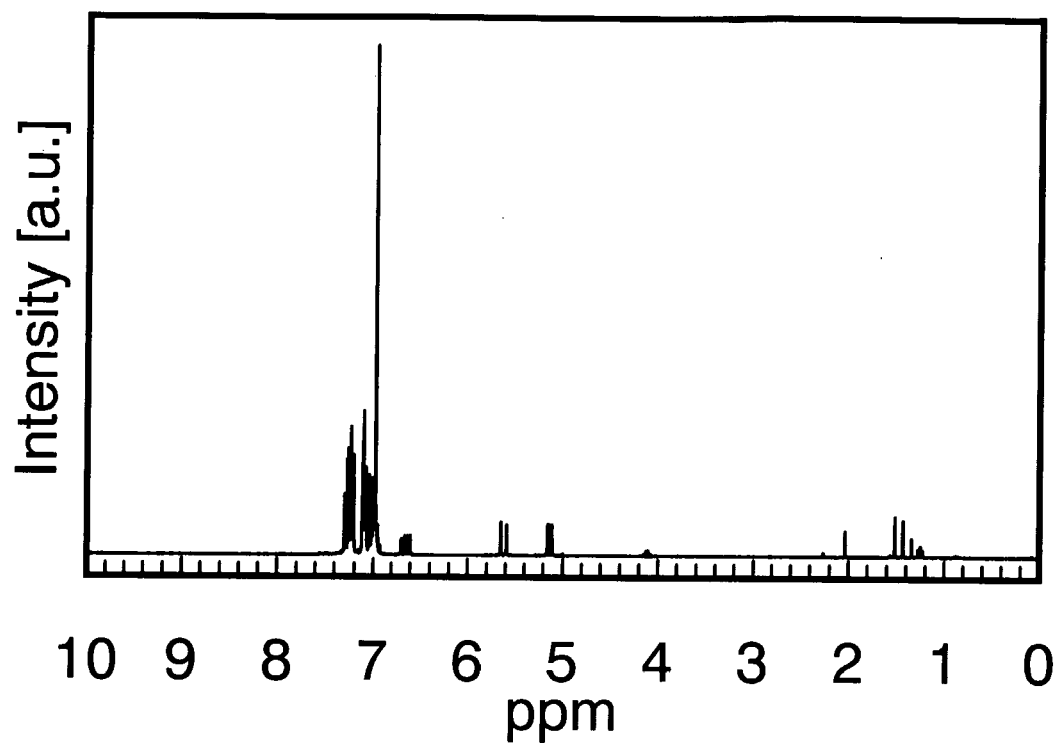
FIG. 13 is an NMP spectrum of 4-[N-(4-diphenylaminophenyl)-N-phenyl]aminostyrene.

FIG. 13 shows an NMR spectrum of this compound. In addition, $^1$H-NMR is as follows: $^1$H-NMR (300 MHz, CDCl$_3$) δ ppm 6.94-7.30 (m, 23H), 6.64 (dd, 1H, J=11, 18 Hz), 5.62 (dd, J=18 Hz), 5.13 (s, 1H, J=11 Hz).

In addition, a synthesis scheme of 4-[N-(4-diphenylaminophenyl)-N-phenyl]aminostyrene (StDPA) is shown by the following formula.

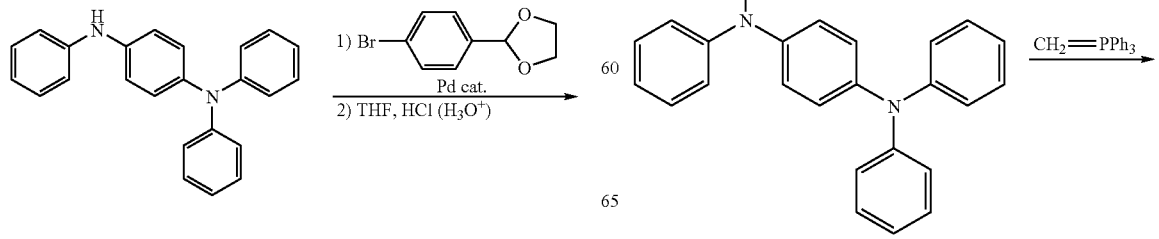

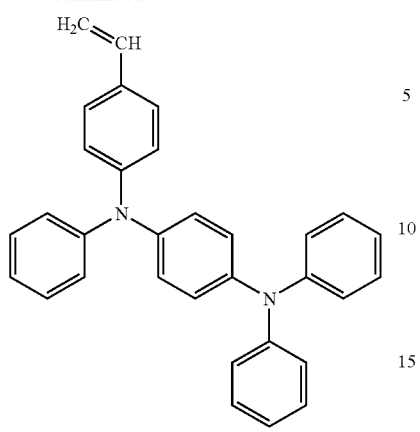

[Step 4] A synthesis of poly{4-[N-(4-diphenylaminophenyl)-N-phenyl]aminostyrene}

A dried toluene mixture (10 mL) including 4.22 g (9.63 mmol) of 4-[N-(4-diphenylaminophenyl)-N-phenyl]aminostyrene (StDPA) synthesized in Step 3 and 112 mg (0.68 mmol) of Azoisobutyronitril was deaerated. After that, it was heated at 60° C. for 3 days. The reaction solution was precipitated again in ether, and the precipitated light-yellow solid was collected by filtrating. This light-yellow solid was dried under a reduced pressure to obtain 3.41 g of a light-yellow solid with the yield of 81%. It was confirmed with a nuclear magnetic resonance method (NMR) that the obtained light-yellow solid was poly{4-[N-(4-diphenylaminophenyl)-N-phenyl]aminostyrene} (PStDPA) which is a hole injecting material of one of polymers according to the present invention.

Figure 14:
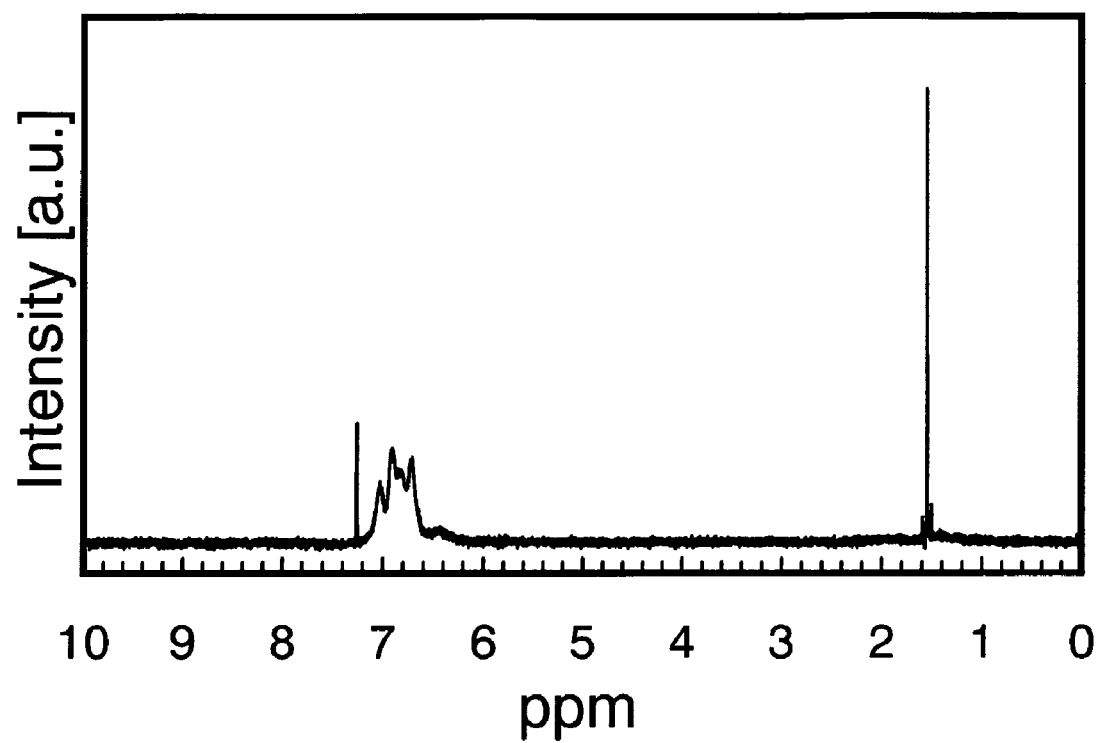
FIG. 14 is an NMR spectrum of poly{4-[N-(4-diphenylaminophenyl)-N-phenyl]aminostyrene} (PS tDPA)

FIG. 14 shows a $^1$H-NMR spectrum of this compound. In addition, $^1$H-NMR is as follows: $^1$H-NMR (300 MHz, CDCl$_3$) δ ppm 1.20-2.5 (br, 3H), 6.30-7.40 (br, 23H).

A synthesis scheme of poly{4-[N-(4-diphenylaminophenyl)-N-phenyl]aminostyrene} (PStDPA) is shown by the following formula.

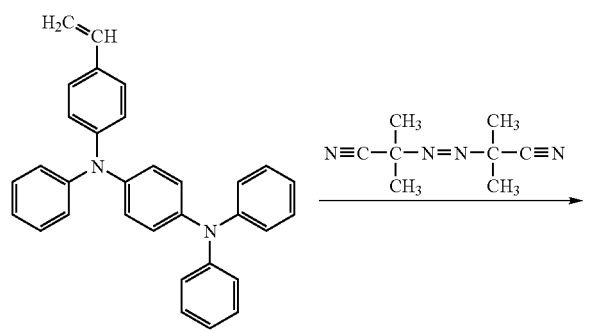

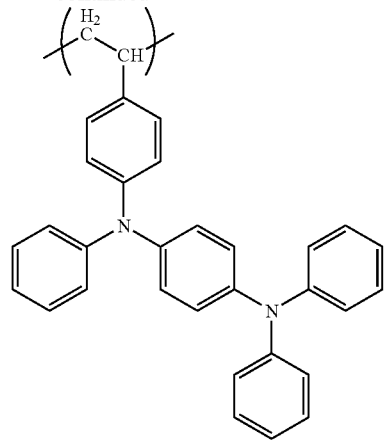

In this manner, PStDPA which is a high molecular compound having a repeating unit represented by the following structural formula (3), can be synthesized.

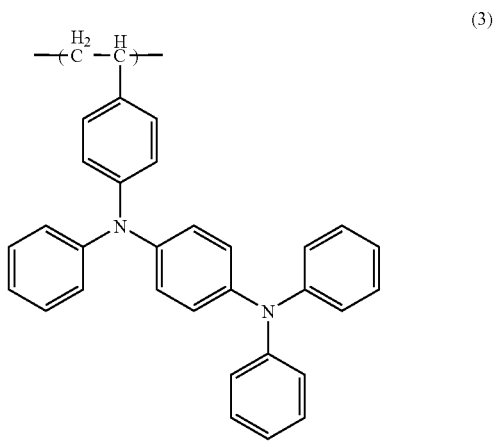

(3)

The molecular weight of the obtained PStDPA was measured using Gel Permeation Chromatography (GPC). It was known that the number average molecular weight was 18000, and the weight average molecular weight was 44000 in polystyrene conversion.

Synthesis Example 2

In Synthesis Example 2, a synthesis method of a high molecular compound having a repetition unit represented by a structural formula (78), poly{4-[N-(9-carbazol-3-yl)-N-phenylamino]styrene} (PStPCA) is described.

Step 1 Synthesis of 3-(N-phenylamino)-9-phenylcarbazole (PCA)

(1) Synthesis of 3-bromo-9-phenylcarbazole

Firstly, 24.3 g (100 mmol) of N-phenylcarbazole was dissolved in 600 ml of glacial acetic acid, and 17.8 g (100 mmol) of N-bromo succinic acid imide (NBS) was slowly added thereto. The mixture was stirred overnight (about 18 hours) at a room temperature. This glacial acetic acid solution was dropped in 1 litter of ice water while stirring them. A precipitated white solid was washed three times with water. This solid was dissolved in 150 ml of diethyl ether, and washed with a saturated sodium hydrogencarbonate solution and water.

This organic layer was dried with magnesium sulfate, and filtered. The obtained filtrate was concentrated. The thus obtained residue was added with about 50 ml of methanol and uniformly dissolved therein by being irradiated with supersonic. This solution was left still to precipitate a white solid. This solution was filtrated and the filtrate was dried to obtain 28.4 g (the yield: 88%) of 3-bromo-9-phenylcarbazole, which was a white powder. The synthesis scheme is shown below.

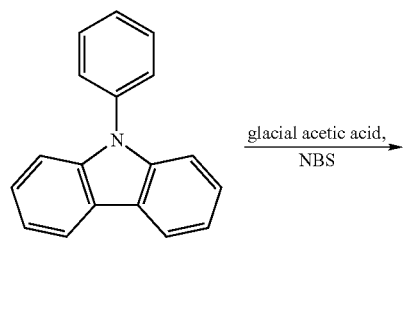

(2) Synthesis of PCA

Next, under nitrogen, 110 mL of dehydrated xylene and 7.0 g (75 mmol) of aniline were added to a mixture of 19 g (60 mmol) of 3-bromo-9-phenylcarbazole obtained in (1), 340 mg (0.6 mmol) of bis(dibenzylideneacetone)palladium(0) (Pd(dba)$_2$), 1.6 g (3.0 mmol) of 1,1-bis(diphenylphosphino)ferrocene (DPPF), and 13 g (180 mmol) of sodium-tert-butoxide (t-NuONa). This was heated and stirred under a nitrogen atmosphere at 90° C. for 7.5 hours.

After the termination of the reaction, about 500 mL of toluene, which was heated to 50° C., was added to the suspension and this suspension was filtered through florisil, alumina and Celite. The thus obtained filtrate was concentrated and the residue was added to hexane-ethyl acetate and irradiated with supersonic. The thus obtained suspension was filtered and the filtrate was dried to obtain 15 g (the yield: 75%) of a cream-colored powder. By using a nuclear magnetic resonance ($^1$H-NMR) method, it was confirmed that this cream-colored powder was 3-(N-phenylamino)-9-phenylcarbazole (PCA). $^1$H-NMR of this compound is shown below.

$^1$H-NMR (300 MHz, CDCl$_3$); δ=6.84 (t, j=6.9, 1H), 6.97 (d, j=7.8, 2H), 7.20-7.61 (m, 13H), 7.90 (s, 1H), 8.04 (d, j=7.8, 1H)

Further, a synthetic scheme of 3-(N-phenylamino)-9-phenylcarbazole (PCA) is shown below.

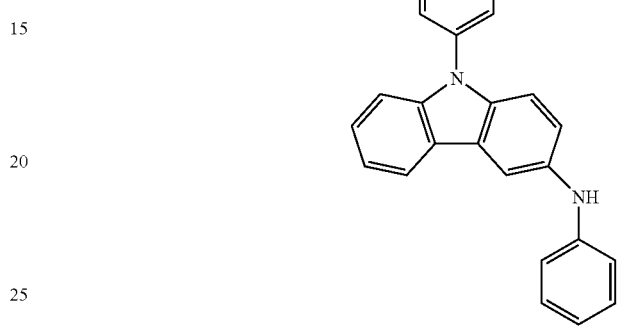

Step 2 Synthesis of poly{4-[N-(9-carbazol-3-yl)-N-phenylamino]styrene} (PStPCA)

(i) Synthesis of 4-iodobenzaldehyde (compound A)

8.0 g (43.2 mmol) of 4-bromobenzaldehyde, 107.6 g (0.65 mmol) of potassium iodide, 41.1 g (0.22 mmol) of copper iodide and 130 mL of dimethylformamide (DMF) were put in a 300 mL three-neck flask, and refluxed in a nitrogen atmosphere for 3 hours. After it was put back at a room temperature, 1N of hydrochloric acid and ethyl acetate were added, and stirred for 1 hour. It was filtered to remove potassium iodide and copper iodide, and the filtrate was washed with sodium sulfate and water, and dried with magnesium sulfate. It was distilled under a reduced pressure to obtain 4-iodobenzaldehyde (compound A). A synthesis scheme is shown below.

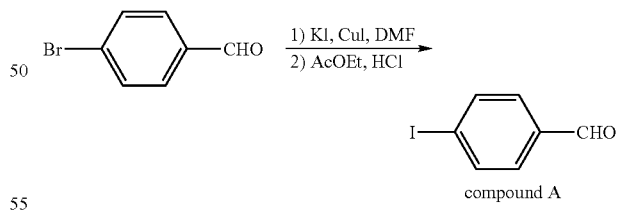

(ii) Synthesis of 2-(4-iodophenyl)-1,3-dioxolane (compound B)

6.42 g (27.7 mmol) of the compound A obtained in Step 1 and 14.4 g (0.23 mol) of ethylene glycol, 533 mg (2.8 mmol) of p-toluene sulfonic acid monohydrate, and 30 mL of toluene were put in a 100 mL eggplant flask, and refluxed for 4 hours. The reaction solution was extracted with ethyl acetate, washed with sodium hydrogen carbonate and water. Then, after it was dried with magnesium sulfate, it was distilled under a reduced pressure to obtain 5.95 g of 2-(4-iodophenyl)-1,3-dioxolane (compound B) (yield: 77.8%). A synthesis scheme is shown below.

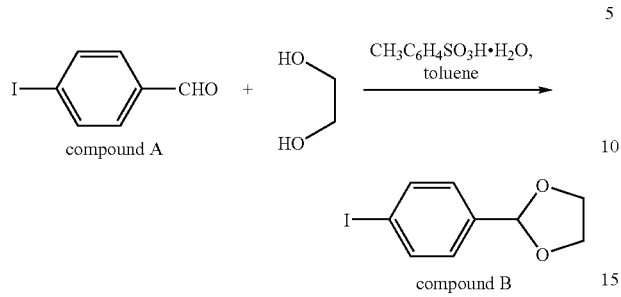

compound A compound B (iii) Synthesis of 4-[N-(9-carbazol-3-yl)-N-phenylamino]benzaldehyde (compound C)

Figure 15:
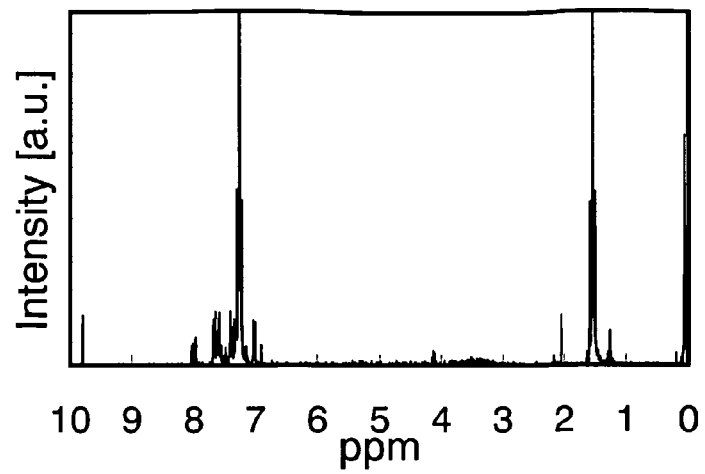
FIG. 15 is an NMP spectrum of 4-[N-(9-carbazol-3-yl)-N-phenylamino]benzaldehyde.

5.95 g (21.6 mmol) of the compound B, 7.30 g (21.6 mmol) of PCA synthesized in Step 1, 0.59 g (0.68 mmol) of bis(dibenzylideneacetone)palladium(0) (Pd(dba)$_2$), 9.11 g (45.0 mmol) of tri-tert-butylphosphine (P(t-Bu)$_3$), 7.93 g (82.5 mmol) of sodium tert-butoxide (Na(O-t-Bu)) and 50 mL of xylene were put in a 300 mL three-neck flask, and refluxed in a nitrogen atmosphere for 3 hours. The reaction solution was filtered through florisil, alumina and Celite and the filtrate was washed with saturation saline, and then, dried with magnesium sulfate. After that, 1N of hydrochloric acid and tetrahydrofuran were added, and stirred at a room temperature overnight, extracted with ethyl acetate, washed with water and saturation saline, and then dried with magnesium sulfate. It was refined with chromatography (hexane:ethyl acetate) to obtain 7.94 g of 4-[N-(9-calbazol-3-yl)-N-phenylamino]benzaldehyde (compound C) (yield: 93.8%). $^1$H-NMR analysis result of the obtained substance is shown below, and $^1$H-NMR chart is shown in FIG. 15.

$^1$H NMR (300 MHz, CDCl$_3$): δ=7.02 (d, J=9.00, 2H), 7.21-7.68 (m, 17H), 7.97 (s, 1H), 8.03 (d, J=7.80, 1H), 9.80 (s, 1H)

In addition, a synthesis scheme is shown below.

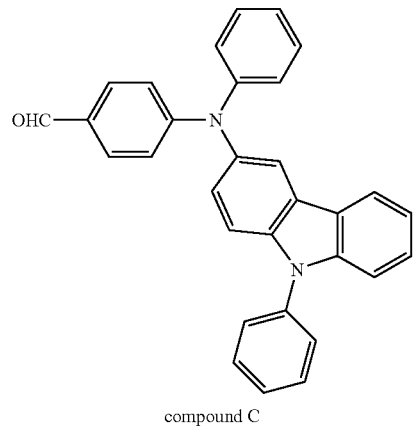

compound C (iv) Synthesis of 4-[N-(9-carbazol-3-yl)-N-phenylamino]styrene (compound D)

Figure 16:
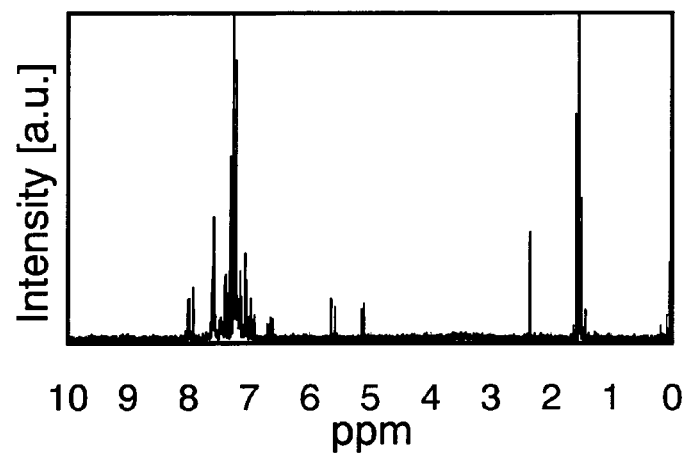
FIG. 16 is an NMR spectrum of 4-[N-(9-carbazol-3-yl)-N-phenylamino]styrene.

In a three-neck flask, 7.50 g (18.6 mmol) of (methyl)triphenylphosphonium iodide (MePPh$_3$I) and 150 mL of tetrahydrofuran (THF) were put in a three-neck flask, stirred in a nitrogen atmosphere at −40° C., and 1.86 g (18.4 mmol) of n-butyllithium (n-BuLi) was dropped. Thereafter, the temperature was risen up to 0° C., and stirred for 1 hour. 6.71 g (15.3 mmol) of the compound C was added, the temperature was risen up to a room temperature and it was stirred overnight. The reaction solution was extracted with ethyl acetate, washed with water, and then, dried with magnesium sulfate. It was filtrated through florisil, alumina and Celite to obtain 5.66 g of the compound D (yield: 71.3%). $^1$H-NMR analysis result of the obtained substance is shown below, and $^1$H-NMR chart is shown in FIG. 16. $^1$HNMR (300 MHz, CDCl$_3$), δ=5.12 (d, J=5.55, 1H), 5.61 (d, J=17.40, 1H), 6.65 (q, J=17.55, 1H), 7.05 (d, J=8.40, 2H), 7.13-7.81 (m, 17H), 7.87 (s, 1H), 7.99 (d, J=8.10, 1H)

In addition, a synthesis scheme is shown below.

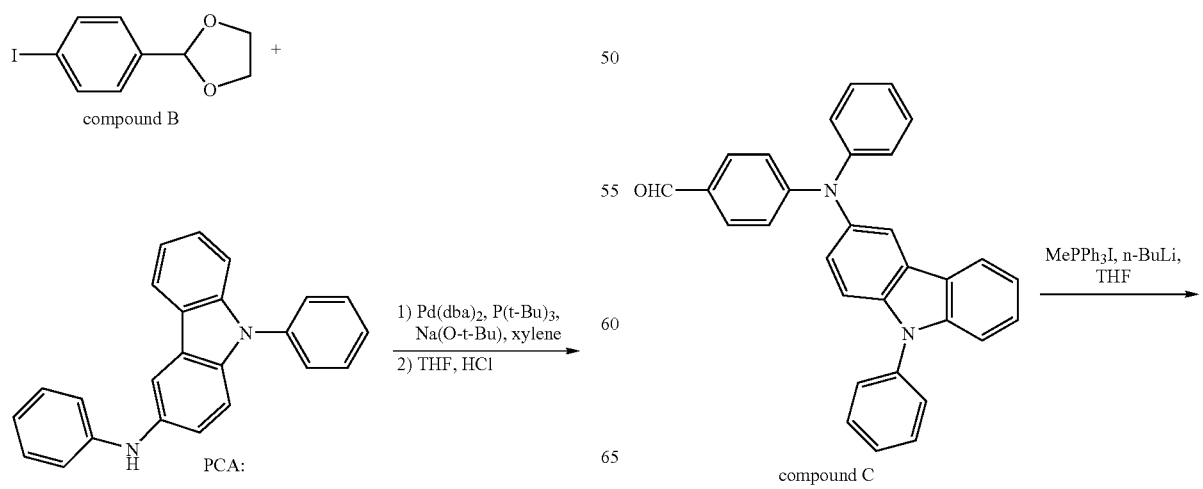

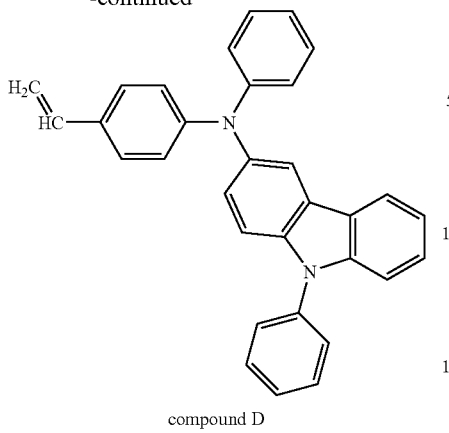

compound D

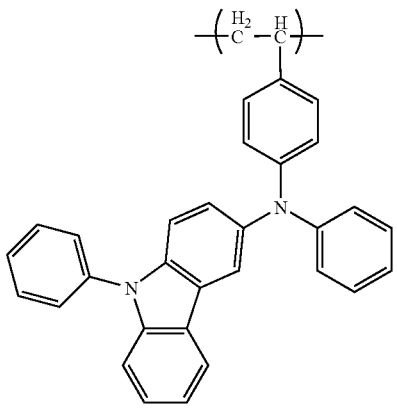

(78)

(v) Synthesis of poly{4-[N-(9-calbazol-3-yl)-N-phe-nylamino]styrene}

Figure 17:
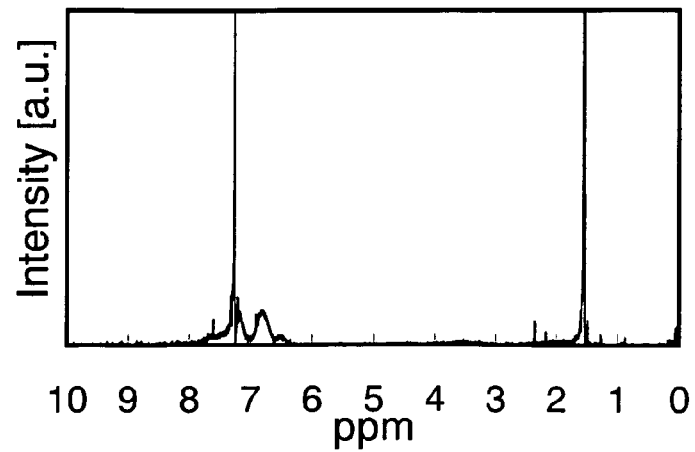
FIG. 17 is an NMR spectrum of poly{4-[N-(9-carbazol-3-yl)-N-phenylamino]styrene} (PStPCA)

In a test tube, 5.66 g (13.8 mmol) of the compound D, 113 mg (0.69 mmol) of 2,2'-azobisisobutyronitrile, and 6.88 mL of toluene were put, and left for three days in a nitrogen atmosphere at 60° C., and reprecipitated with ether to 3.75 g of poly{4-[N-(9-carbaxol-3-yl)-N-phenylamino]styrene} (PStPCA) (yield: 66.3%). ¹H-NMR analysis result of the obtained substance is shown below, and ¹H-NMR chart is shown in FIG. 17.

¹H NMR (300 MHz, CDCl₃), δ=1.75-2.43 (br, 3H), 6.40-7.00 (br, 21H)

In addition, a synthesis scheme is shown below.

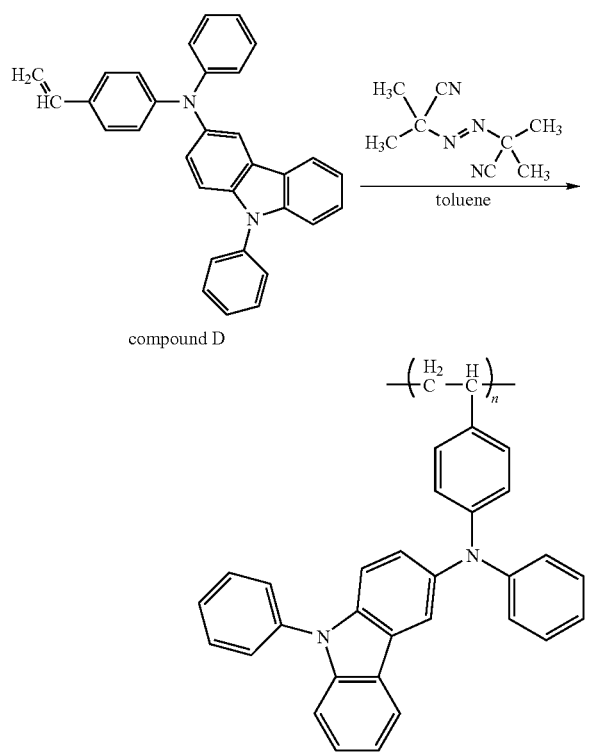

In this manner, the high molecular compound having a repetition unit represented by the next structural formula (78), PStPCA can be synthesized.

The obtained PStPCA was subjected to a molecular weight measurement using Gel Permeation Chromatography (GPC). It can be understood that the number average molecular weight was 7,300 and the weight average molecular weight was 28000 in polystyrene conversion.

Example 2

In this example, a method of forming a composite material of the present invention including PStDPA and vanadium oxide is described. The composite material of the present invention including PStDPA and vanadium oxide is formed by a sol gel method as a film over a glass substrate in this example.

74.8 mg (0.171 mmol) of PStDPA was dissolved in 15 mL of xylene and stirred. Into this solution, 47.2 mg (0.193 mmol) of vanadium(V) triisopropoxide oxide (made by JAPAN PURE CHEMICAL CO., LTD, purity 5N) was added. Further, 24.1 mg (0.185 mmol) of ethyl acetoacetate was put as stabilizer and stirred, and a solution was prepared, which included PStDPA as a high molecular compound, vanadium as an inorganic compound material and a stabilizer.

The glass substrate used in this example was baked at 200° C. for 1 hour, after it was washed with pure water as a pretreatment. Further, a UV ozone treatment was conducted for 370 seconds as a pretreatment.

A spin coating method was used for forming a film over the glass substrate. The prepared solution was dropped to the pretreated glass substrate, rotated at 200 rpm for 2 seconds, at 1000 rpm for 60 seconds and then, 3000 rpm for 10 seconds.

The substrate provided with the film was hydrolyzed by water vapor for 2 hours under conditions of 40° C. at atmospheric pressure (1 atmospheric pressure), and then, baked for 1.5 hour at 120° C. under a reduced pressure using a rotary pump to form a composite material including PStDPA and vanadium oxide.

Example 3

Figure 18:
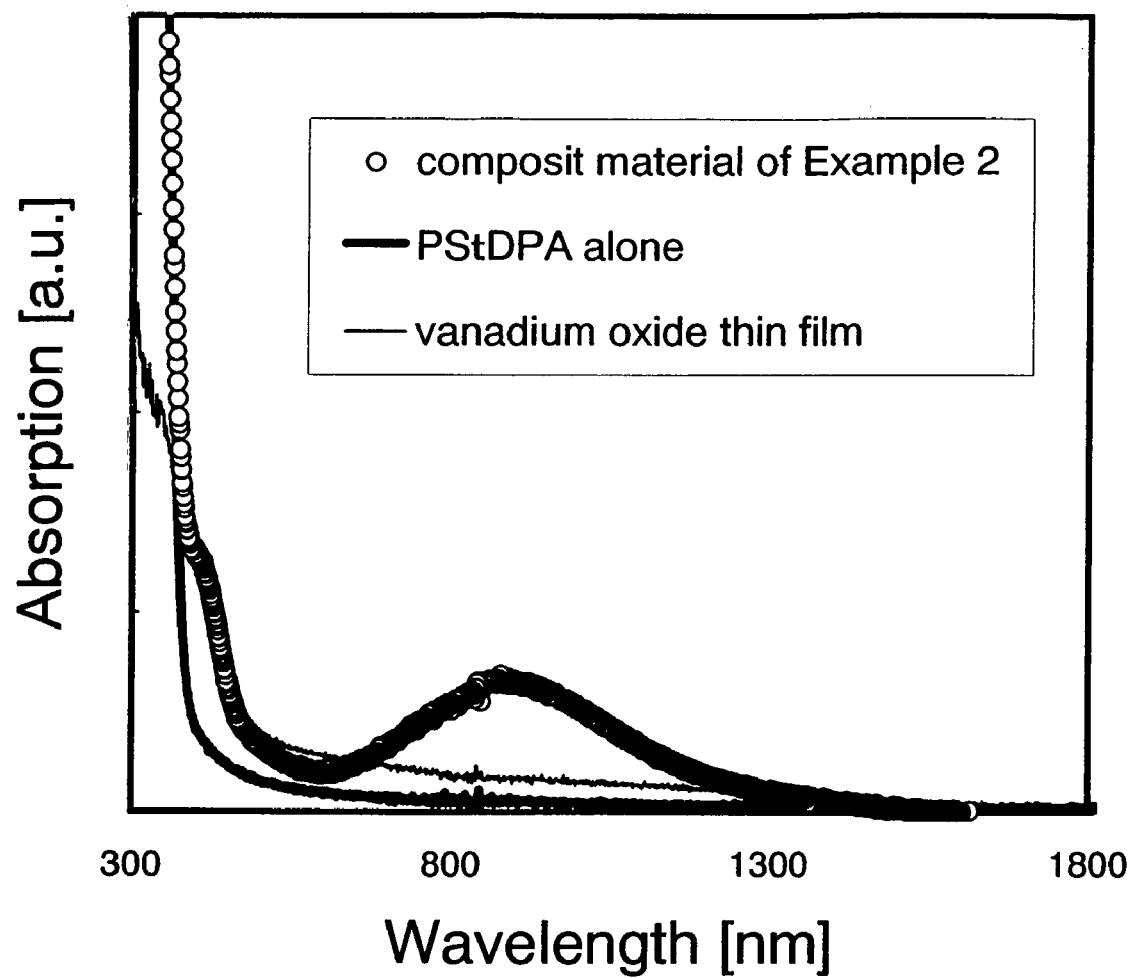
FIG. 18 shows absorption spectra of PStDPA, a vanadium oxide, and a composite material including PStDPA and vanadium oxide.

Example 3 describes an absorption spectrum of a composite material of the present invention. FIG. 18 shows absorption spectra of a PStDPA thin film, a vanadium oxide thin film formed by a sol-gel method, and a thin film of the composite material of the present invention including PStDPA and vanadium oxide. The composite material of the present invention including PStDPA and vanadium oxide was formed by the method described in Example 2.

According to FIG. 18, the absorption spectrum of the composite material of the present invention including PStDPA and vanadium oxide is different from those of vanadium oxide and PStDPA, and it has an absorption peak, in particular around 900 nm, which is not shown in absorption spectra of PStDPA and vanadium oxide.

It can be considered that this is an absorption peak which is caused by an interaction between PStDPA and vanadium oxide, and PStDPA donates electrons to vanadium oxide.

A composite material of the present invention having such characteristics is a material having excellent conductivity, and excellent carrier injecting and transporting properties. In addition, a composite material of the present invention is suitable for mass production and advantageous industrially since it can be formed by a wet method.

Example 4

Current-voltage characteristics of a single layer element which actually employed the composite material of the present invention including PAtDPA and vanadium oxide were measured.

A manufacturing method of a single layer element which was measured is described. 76.7 mg (0.175 mmol) of PStDPA was dissolved in 7.5 mL of xylene, and stirred. 46.1 mg (0.189 mmol) of vanadium(V) triisopropoxide oxide was put into this solution. Further, 22.0 mg (0.169 mmol) of ethyl acetoacetate was put as stabilizer and stirred, and a solution was prepared, which included PStDPA as a high molecular compound, vanadium as an inorganic compound material and a stabilizer.

A substrate over which a transparent electrode (ITSO) of 2×2 mm$^2$ was formed as a first electrode was used. As a pretreatment for forming an organic layer over the electrode, a surface of the substrate was washed with a porous resin brush, baked at 200° C. for 1 hour and subjected to a UV ozone treatment for 370 seconds.

A spin coating method was used for forming a film over the glass substrate. The solution was dropped to the substrate provided with the transparent electrode after the pretreatment, rotated at 200 rpm for 2 seconds, at 500 rpm for 60 seconds and then, 3000 rpm for 10 seconds.

The substrate provided with the film was hydrolyzed by water vapor for 2 hours under conditions of 40° C. at an atmospheric pressure (1 pressure), and then, baked for 1.5 hour at 120° C. under a reduced pressure using a rotary pump to form a composite material including PStDPA and vanadium oxide. The thickness of the film was 86 nm.

Next, Al of 100 nm was formed over the formed composite material as a second electrode by a vacuum evaporation method to obtain a single layer element. The formed element has a stacked structure in which the transparent electrode (ITSO), the composite material of the present invention including PStDPA and vanadium oxide (86 nm), and Al (100 nm) were stacked sequentially.

Figure 19:
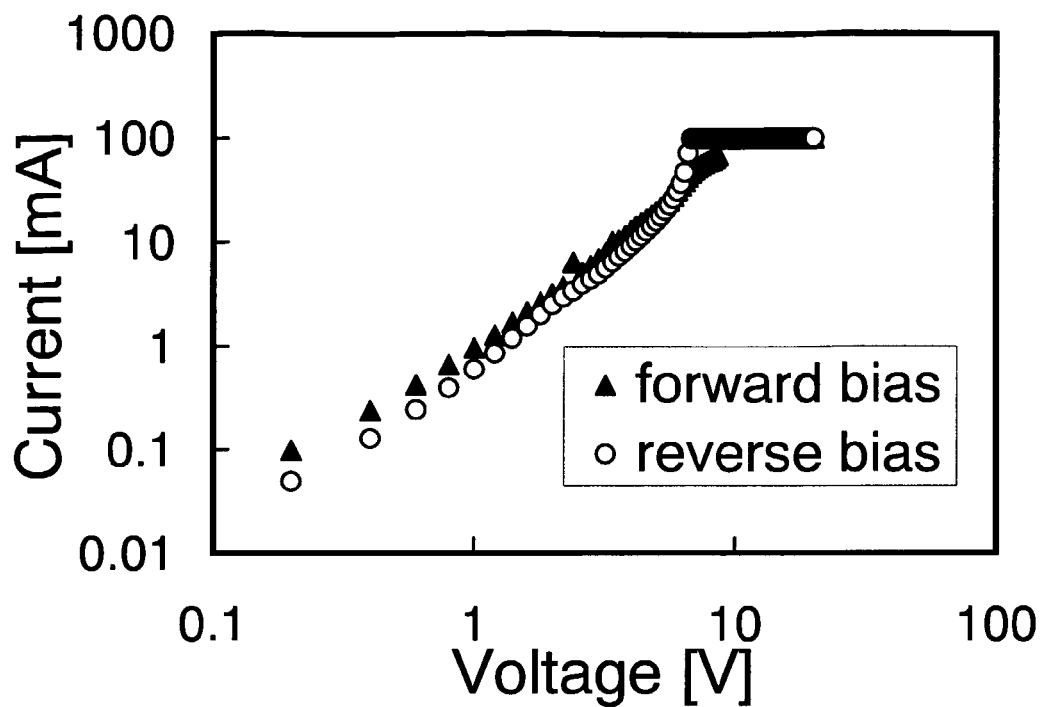
FIG. 19 shows current-voltage characteristics of a film made of a composite material of the present invention.

As described above, current-voltage characteristics of the manufactured element were measured. At this time, the measurement was conducted to the manufactured element using a source meter (a 2400 type Source Meter manufactured by Keithley Instruments Inc.), by applying a direct voltage. At this time, in voltage application, a case that the transparent electrode serves as anode and the Al electrode serves a cathode is a forward bias, while a case that the Al electrode serves as an anode and the transparent electrode serves as a cathode is a reverse bias. The voltage was applied at 0.2 V intervals in the range of 0 V to 20 V, and a current value of each voltage was measured. The measurement results are shown in FIG. 19. In FIG. 19, the horizontal axis represents voltage (unit: V) and the vertical axis represents current (unit: mA). According to FIG. 19, current of the forward bias and the reverse bias flow in this element so well.

Comparative Example 1

As a comparative example, current-voltage characteristics of a single layer element made of PStDPA alone were measured.

A manufacturing method of a single layer element which was measured is described. 152 mg (0.347 mmol) of PStDPA was dissolved in 7.5 mL of xylene, and stirred to prepare a solution including PStDPA.

A substrate over which a transparent electrode (ITSO) of 2×2 mm$^2$ was formed as a first electrode was used. As a pretreatment for forming an organic layer over the electrode, a surface of the substrate was washed with a porous resin brush, baked at 200° C. for 1 hour and subjected to a UV ozone treatment for 370 seconds.

A spin coating method was used for forming a film over the glass substrate. The solution was dropped to the substrate provided with the transparent electrode after the pretreatment, rotated at 200 rpm for 2 seconds, at 800 rpm for 60 seconds and then, 3000 rpm for 10 seconds to form a film. After the film formation, it was baked for 1.5 hours at 120° C. under a reduced pressure using a rotary pump. The thickness of the film was 93 nm.

Next, Al of 100 nm was formed over the formed layer as a second electrode by a vacuum evaporation method to obtain a single layer element. The formed element has a stacked structure in which the transparent electrode (ITSO), PStDPA (93 nm) and Al (100 nm) were stacked sequentially.

Figure 20:
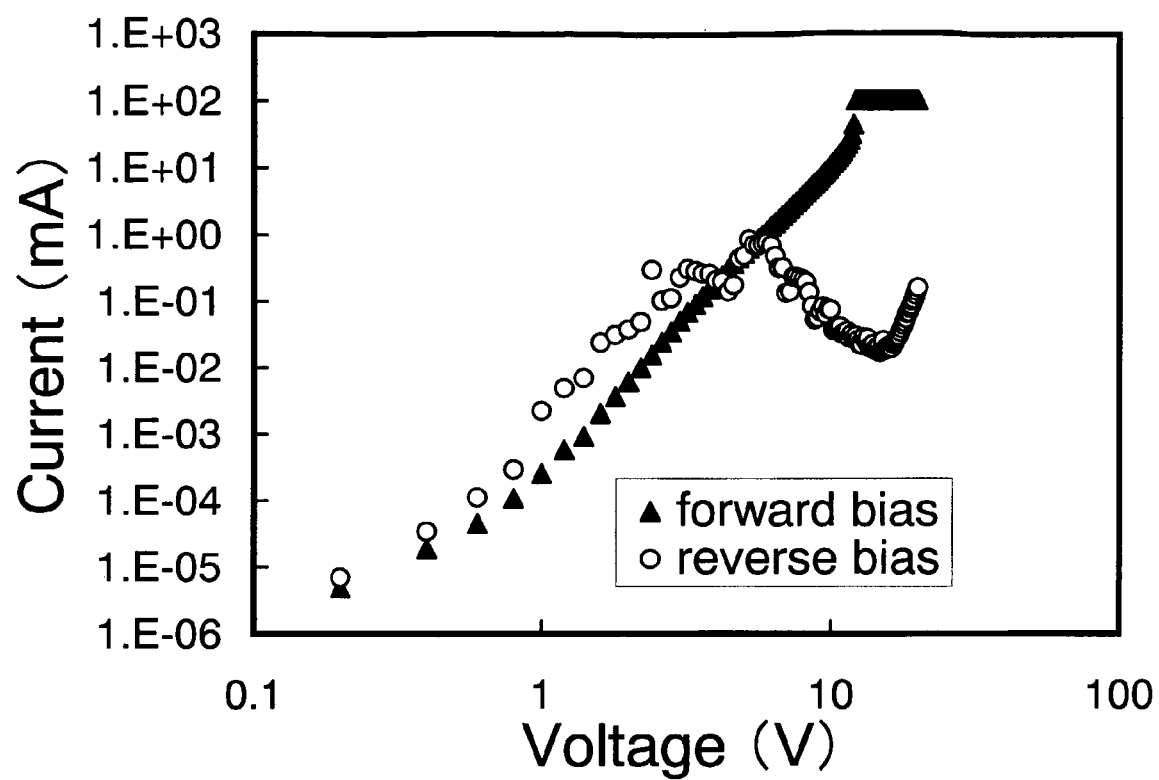
FIG. 20 shows current-voltage characteristics of a film made of PStDPA alone.

As described above, current-voltage characteristic of the manufactured element was measured. At this time, the measurement was conducted to the manufactured element using a source meter (a 2400 type Source Meter manufactured by Keithley Instruments Inc), by applying a direct voltage. At this time, in voltage application, a case that the transparent electrode serves as anode and the Al electrode serves a cathode is a forward bias, while a case that the Al electrode serves as an anode and the transparent electrode serves as a cathode is a reverse bias. The voltage was applied at 0.2 V intervals in the range of 0 V to 20 V, and a current value of each voltage was measured. The measurement results are shown in FIG. 20. In FIG. 20, the horizontal axis represents voltage (unit: V) and the vertical axis represents current (unit: mA). According to FIG. 20, current of the reverse bias cannot flow stably in this element of this comparative example, unlike the element using the composite material of the present invention in Example 4.

Figure 21:
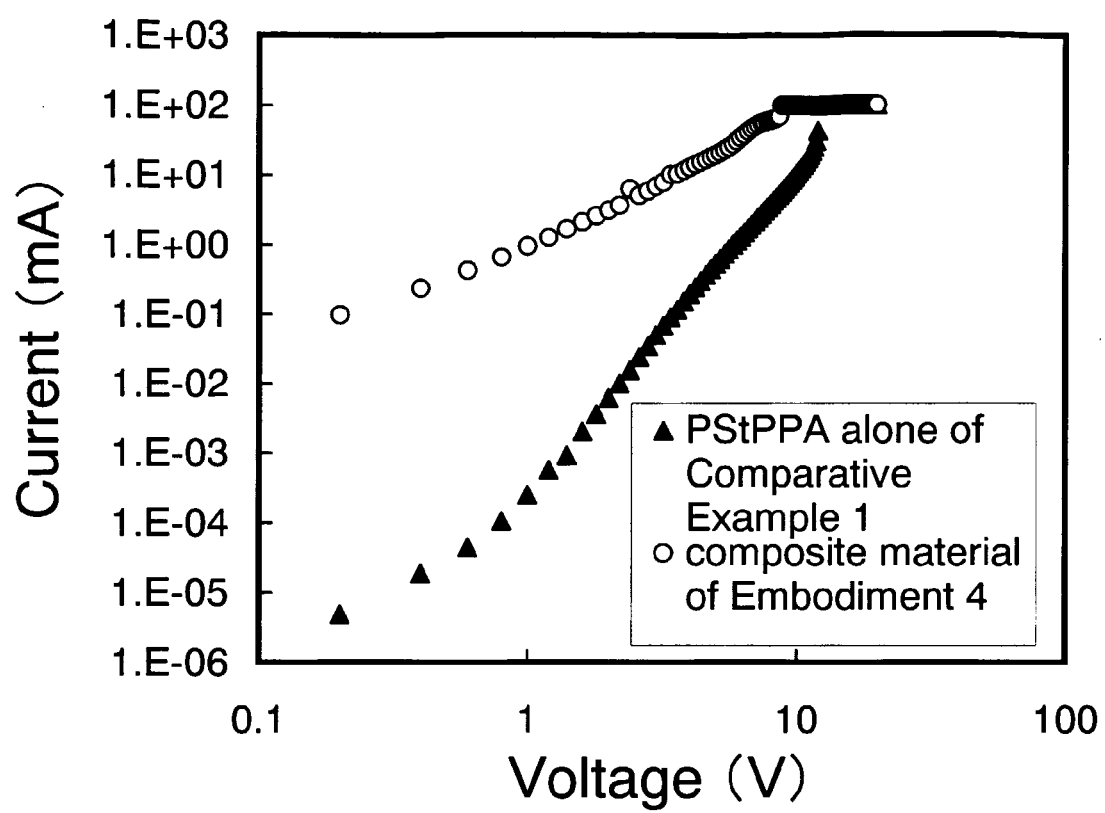
FIG. 21 shows a comparison of current-voltage characteristics of a film made of PStDPA alone and a film made of a composite material.

FIG. 21 shows a comparison in a forward bias between the element formed with a film of PStDPA alone and the element made with a film of the composite material of the present invention. In FIG. 21, the horizontal axis represents voltage (unit: V) and the vertical axis represents current (unit: mA). According to FIG. 21, it is shown that current flows more in the film made of the composite material of the present invention than in the film made of PStDPA alone, although the film made of PStDPA alone and the film made of the composite material of the present invention have almost equal thickness in each element.

Example 5

In Example 5, an example of a light-emitting element is described specifically, in which a layer including a composite material of the present invention which is formed from PStDPA and vanadium oxide as shown in Example 2, is provided to be in contact with an electrode serving as an anode.

In a gloved box with a nitrogen atmosphere whose water concentration was kept 10 ppm or less, 150 mg of PStDPA, 90 mg of vanadium(V) triisopropoxide oxide which is a raw material of vanadium oxide, and 50 mg of ethyl acetoacetate as a stabilizer were dissolved in 15 mL of a mixed solvent in which dehydration toluene and dehydration tetrahydrofuran (THF) were mixed with the volume ratio of 1:1, and stirred for one day to prepare a solution for coating.

Next, a glass substrate provided with indium tin silicon oxide (ITSO) of 110 nm thick was prepared. An insulating film covering the periphery of the surface of ITSO such that 2 mm square of the surface is exposed. It should be noted that ITSO is an electrode serving as an anode of the light-emitting element. As a pretreatment for forming the light-emitting element over the substrate, the surface of the substrate was washed with a porous resin brush, and baked at 200° C. for 1 hour, then, a UV ozone treatment was conducted for 370 seconds.

The prepared solution was dropped onto the substrate through a 0.45 μm filter, and the substrate was rotated to be spin-coated with the solution at 200 rpm for 2 seconds, at 1500 rpm for 60 seconds and at 2500 rpm for 10 seconds. After wiping the end portion of the substrate, the spin-coated substrate and a beaker containing pure water were put in a vacuum-constant temperature drying apparatus and heated at 40° C. for 2 hours at a normal pressure to be hydrolyzed by water vapor. Further, after taking the beaker containing pure water out of the vacuum-constant temperature drying apparatus, the substrate was baked at 120° C. for 1.5 hours, while the air inside the vacuum-constant temperature drying apparatus is evacuated using a rotary pump, thereby obtaining a composite material including PStDPA and vanadium oxide over the ITSO electrode. The film thickness was 50 nm.

The substrate was fixed on a holder provided in the vacuum evaporation apparatus such that the surface of the substrate provided with ITSO and the composite material faces down.

After reducing the pressure of the vacuum evaporation apparatus to $10^{-4}$ Pa, NPB of 10 nm thick was formed as the hole transporting layer by a vacuum evaporation method using resistance heating. Over NPB, a light-emitting layer including $Alq^3$ and coumarin 6 was formed to have a thickness of 40 nm. The light-emitting layer was formed by a co-evaporation method which evaporated $Alq_3$ and coumarin 6 from different evaporation sources from each other simultaneously. A ratio of $Alq_3$ and coumarin 6 was adjusted such that $Alq_3$:coumarin 6 is 1:0.01 (mass ratio). Further, over this light-emitting layer, $Alq_3$ of 30 nm thick was formed as an electron transporting layer. Over the electron transporting layer, lithium fluoride of 1 nm thick was formed as an electron injecting layer. Over the electron injecting layer, aluminum of 200 nm thick was formed as a cathode to obtain a light-emitting element in this example.

After sealing this light-emitting element in a gloved box with a nitrogen atmosphere so as not to expose the light-emitting element to the air, operation characteristics of the light-emitting element were measured. It should be noted that the measurement was conducted at a room temperature (an atmosphere kept at 25° C.).

Figure 22:
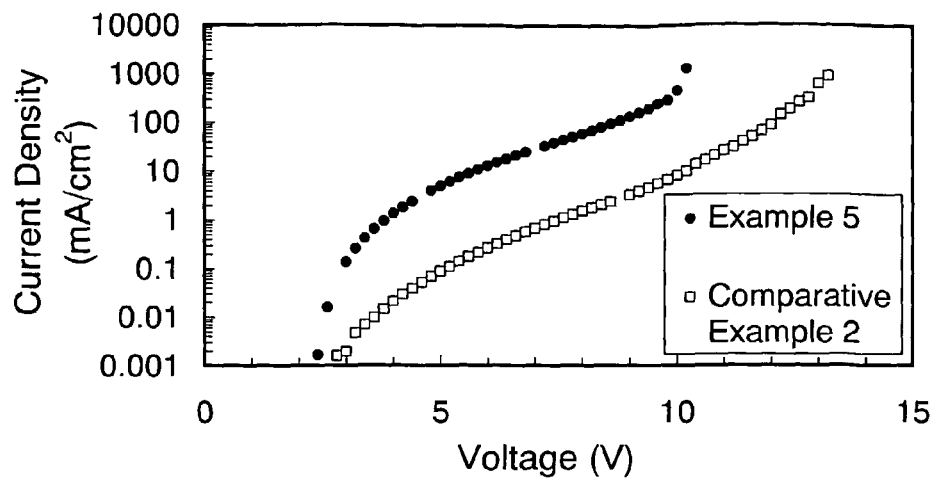
FIG. 22 shows voltage-current density characteristics of a light-emitting element in Example 5 and a light-emitting element in a comparative example 2.
Figure 23:
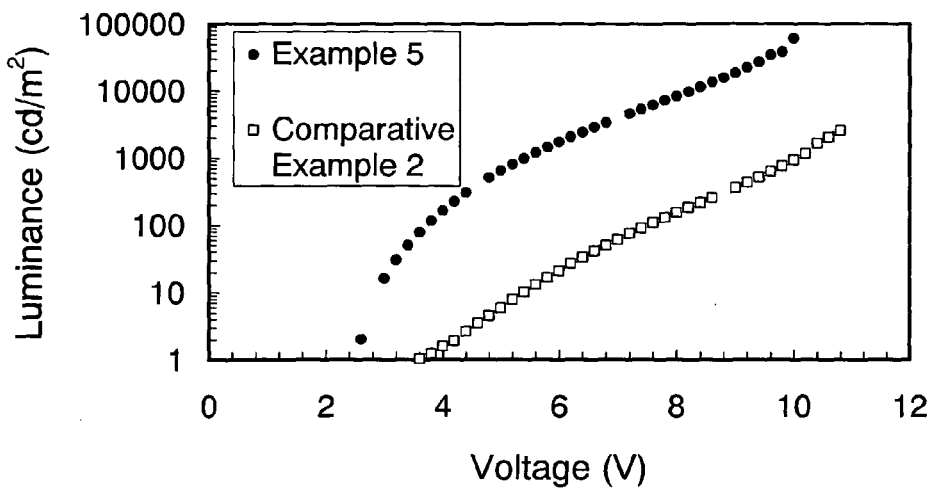
FIG. 23 shows voltage-luminance characteristics of a light-emitting element in Example 5 and a light-emitting element in a comparative example 2.
Figure 24:
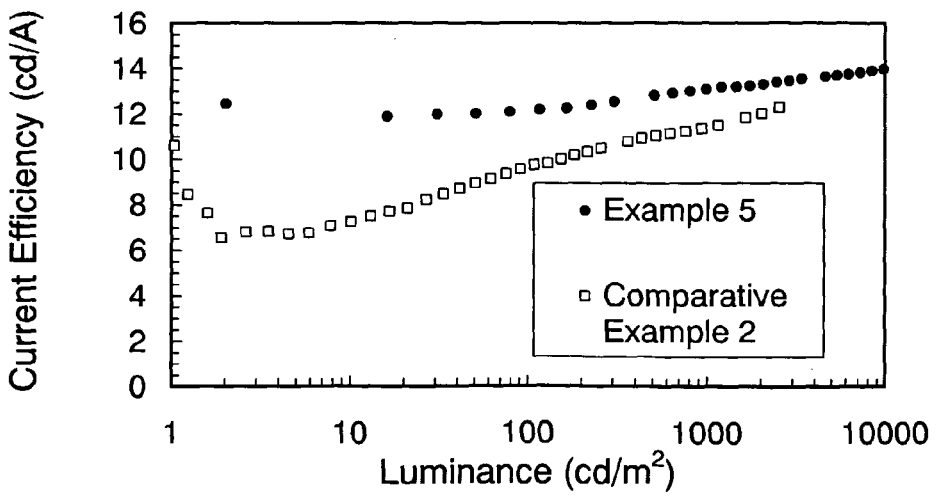
FIG. 24 shows luminance-current efficiency characteristics of a light-emitting element in Example 5 and a light-emitting element in a comparative example 2.

FIG. 22, FIG. 23, and FIG. 24 show voltage-current density characteristics, voltage-luminance characteristics, and luminance-current efficiency characteristics of this light-emitting element, respectively. This light-emitting element emits light at 1740 cd/m$^2$, by applying a voltage of 6V thereto to allow current flow with current density of 13.1 mA/cm$^2$. The current efficiency at this time was 13.2 cd/A. In addition, CIE chromaticity coordinate at this time was (x, y)=(0.29, 0.63) and thus, green emission derived from coumarin 6 was obtained. As to the luminance, a maximum luminance higher than 100,000 cd/m$^2$ was obtained.

In this manner, by providing the composite material of the present invention to be in contact with the electrode serving as an anode of the light-emitting element, the light-emitting element can operate at low voltage and operated extremely efficiently.

Comparative Example 2

Next, as a comparative example, an example of a light-emitting element in which a layer made of PStDPA alone is provided to be in contact with the electrode serving as the anode is described specifically.

In a gloved box with a nitrogen atmosphere whose water concentration was kept 10 ppm or less, 115 mg of PStDPA was dissolved in 15 mL of dehydration toluene, and stirred for one day to prepare a solution for coating.

This solution was applied to the same substrate under the same condition as in Example 5 such that the substrate was spin-coated with this solution. After wiping the end portion of the substrate, the spin-coated substrate was put in a vacuum-constant temperature drying apparatus and baked at 120° C. for 1.5 hours, thereby obtaining a layer made of PStDPA over the ITSO electrode. The film thickness was 50 nm.

The substrate was fixed on a holder provided in the vacuum evaporation apparatus such that the surface of the substrate provided with ITSO and PStDPA faces down. Then, in a similar manner to Example 5, NPB of 10 nm thick as a hole transporting layer, a light-emitting layer including $Alq_3$ and coumarin 6 of 30 nm thick, $Alq_3$ of 30 nm as an electron transporting layer, lithium fluoride of 1 nm as an electron injecting layer, and a cathode made of aluminum were sequentially stacked to obtain the light-emitting element in this comparative example.

After sealing this light-emitting element in a gloved box with a nitrogen atmosphere so as not to expose the light-emitting element to the air, operation characteristics of the light-emitting element were measured. It should be noted that the measurement was conducted at room temperature (an atmosphere kept at 25° C.).

FIG. 22, FIG. 23, and FIG. 24 show voltage-current density characteristics, voltage-luminance characteristics, and luminance-current efficiency characteristics of this light-emitting element, respectively along with the characteristics of Example 5. This light-emitting element allows current to flow at a current density of only 0.268 mA/cm$^2$ even by applying a voltage of 6V thereto, and the luminance was only 21.0 cd/m$^2$.

As described above, by applying a composite material of the present invention combining an organic compound and an inorganic compound to a light-emitting element, it can be understood that the driving voltage of the light-emitting element can be decreased dramatically as compared with a case that an inorganic compound was not combined. In addition, it is shown that other luminescence characteristics such as current efficiency, and maximum luminance were superior.

Example 6

Example 6 describes a manufacturing method of a composite material of the present invention including PStPCA synthesized in Synthesis Example 2 and vanadium oxide. A composite material of the present invention including PSt- PCA and vanadium oxide was formed over a glass substrate by a sol gel method in this example.

In a gloved box with a nitrogen atmosphere whose water concentration was kept 10 ppm or less, 50 mg of PStPCA was dissolved in 5 mL of dehydration xylene, and stirred. Into this solution, 28 mg of vanadium(V) triisopropoxide oxide which is a raw material of vanadium oxide, and 17 mg of ethyl acetoacetate as a stabilizer were added and stirred at room temperature for one day to prepare a solution for coating.

The solution was dropped onto a quartz substrate through a 0.45 μm filter, and the substrate was rotated to be spin-coated with the solution at 200 rpm for 2 seconds, at 1000 rpm for 60 seconds and at 3000 rpm for 10 seconds. The spin-coated substrate and a beaker containing pure water were put in an electric furnace and heated at 40° C. for 2 hours to be hydrolyzed by water vapor. Further, after taking the beaker containing pure water out of the furnace, the substrate was baked at 120° C. for 1.5 hours, while the air inside the furnace is evacuated using a rotary pump, thereby obtaining a composite material of the present invention including PStPCA and vanadium oxide over the quartz substrate.

Example 7

Figure 25:
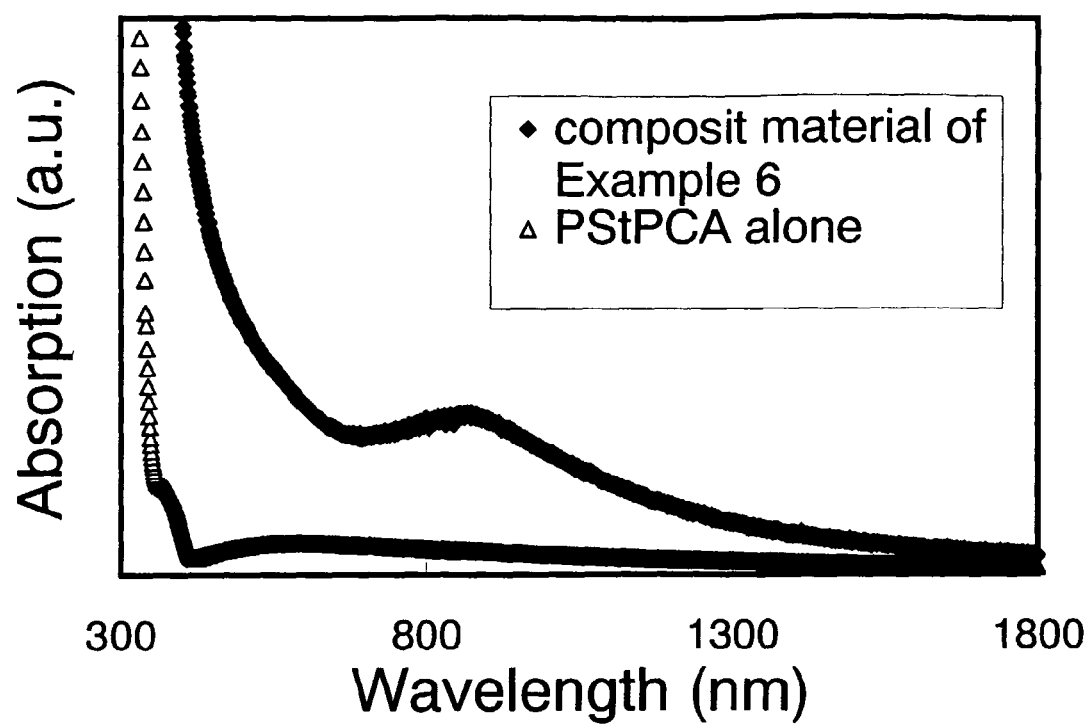
FIG. 25 shows absorption spectra of PStPCA and a composite material of the present invention including PStPCA and vanadium oxide.

Example 7 describes an absorption spectrum of a composite material of the present invention including PStPCA manufactured and vanadium oxide in Example 6. FIG. 25 shows measurement results of ultraviolet, visible and near infrared absorption spectra obtained using a ultraviolet-visible-near infrared (UV/VIS/NIR) spectrophotometer, (U-4000 made by Hitachi, Ltd.,) regarding two thin films of PStPCA thin film, and a thin film made of a composite material of the present invention including PStPCA and vanadium oxide. Note that the absorption spectrum of a thin film made of vanadium oxide is shown in FIG. 18, and thus, it is omitted here.

According to FIG. 25, the absorption spectrum of a composite material of the present invention including PStPCA and vanadium oxide is different from that of PStPCA alone or that of vanadium oxide alone. In particular, it has an absorption peak around 900 nm, which is not shown in the absorption spectra of PStPCA nor vanadium oxide.

It can be considered that this is an absorption peak which is caused by an interaction between PStPCA and vanadium oxide, and PStPCA donates electrons to vanadium oxide.

A composite material of the present invention having such characteristics is a material having excellent conductivity, and excellent carrier injecting and transporting properties. In addition, a composite material of the present invention is suitable for mass production and advantageous industrially since it can be formed by a wet method.

Example 8

In Example 8, current-voltage characteristics of a single layer element which employed the composite material of the present invention including PStPCA shown in Example 6 and vanadium oxide were measured.

A manufacturing method of a single layer element was measured is described first. In a gloved box with a nitrogen atmosphere whose water concentration was kept 10 ppm or less, 50 mg of PStPCA was dissolved in 5 mL of dehydration xylene, and stirred. Into this solution, 28 mg of vanadium(V) triisopropoxide oxide which was a raw material of vanadium oxide was added, and 17 mg of ethyl acetoacetate as a stabilizer and stirred for one day at room temperature to prepare a solution for coating.

Next, a glass substrate provided with ITSO of 110 nm thick was prepared. An insulating film covering the periphery of the surface of ITSO such that 2 mm square of the surface is exposed. The substrate was subjected to ultrasonic cleaning using acetone, pure water and ethanol sequentially, boiled with ethanol, and then, a UV ozone treatment was conducted for 370 seconds at last.

The prepared solution was dropped onto the substrate through a 0.45 μm filter, and the substrate was rotated to be spin-coated with the solution at 200 rpm for 2 seconds, at 1000 rpm for 60 seconds and at 3000 rpm for 10 seconds. After wiping the end portion of the substrate, the spin-coated substrate and a beaker containing pure water were put in an electric furnace and heated at 40° C. for 2 hours at a normal pressure to be hydrolyzed by water vapor. Further, after taking the beaker containing pure water out of the furnace, the substrate was baked at 120° C. for 1.5 hours, while the air inside the furnace is evacuated using a rotary pump, thereby obtaining a composite material including PStPCA and vanadium oxide over the ITSO electrode. The film thickness was 65 nm.

The substrate was fixed on a holder provided in the vacuum evaporation apparatus such that the surface of the substrate provided with ITSO and the composite material faces down, and Al of 100 nm thick was formed by a vacuum evaporation method, thereby obtaining a single layer element in which the composite material of the present invention was formed between the ITSO electrode and the Al electrode.

Figure 26:
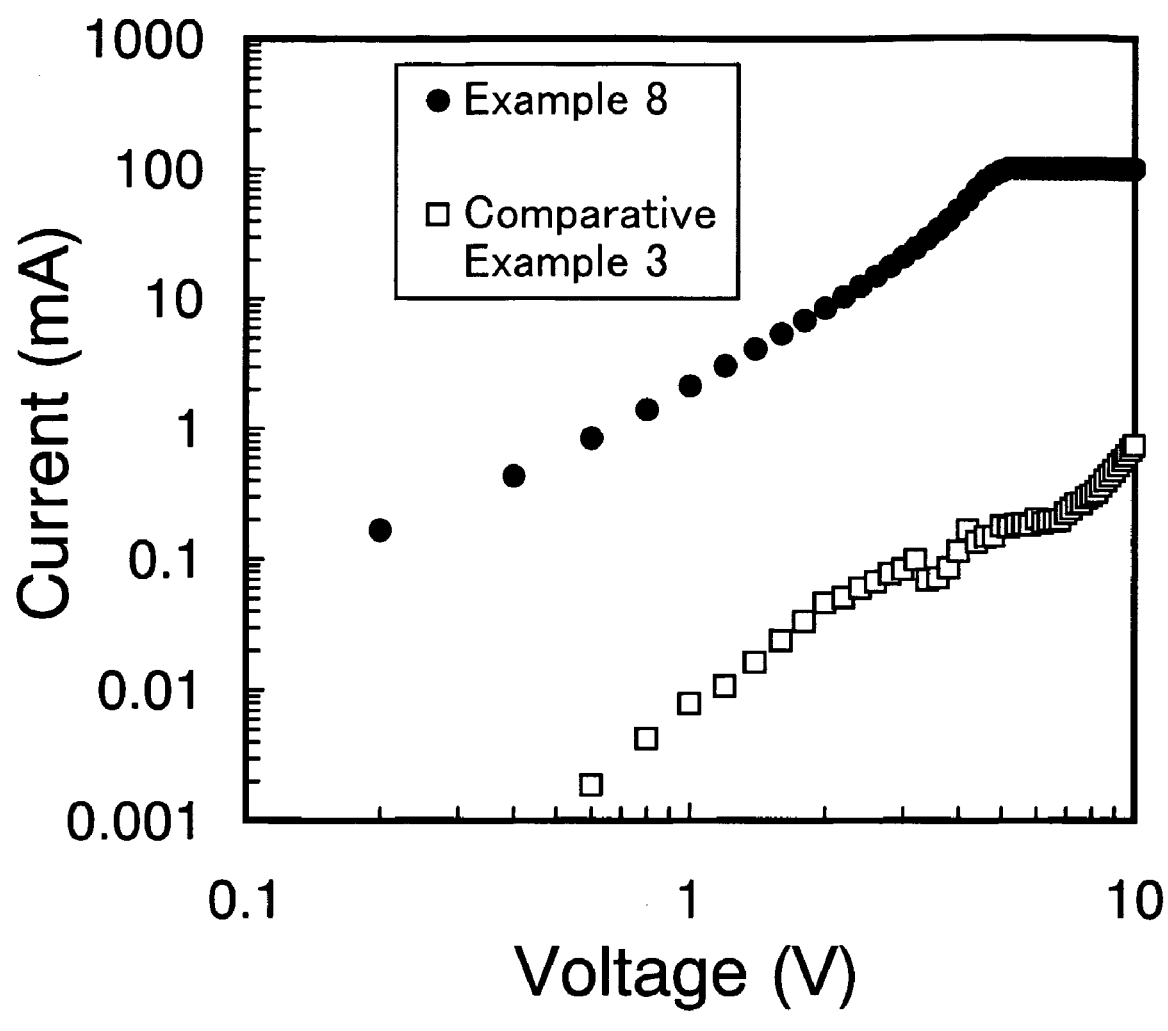
FIG. 26 shows comparison of current-voltage characteristics of a film of a composite material including PStPCA and vanadium oxide, and a film of PStPCA alone.

As described above, current-voltage characteristics of the manufactured element were measured. At this time, the measurement was conducted to the manufactured element using a source meter (a 2400 type Source Meter manufactured by Keithley Instruments Inc.) by applying a direct voltage. At this time, a voltage is applied such that the ITSO electrode serves as anode and the Al electrode serves as a cathode. The measurement results are shown in FIG. 26. In FIG. 26, the horizontal axis represents voltage (unit: V) and the vertical axis represents current (unit: mA). According to FIG. 26, it can be understood that current flows in this element so well. In addition, the current value is saturated at 100 mA, because the limiter of the measurement apparatus was set 100 mA.

Comparative Example 3

As a comparative example, current-voltage characteristics of a single layer element made with a film of PStPCA alone were measured.

A manufacturing method of a single layer element which was measured is described. 150 mg of PStPCA was dissolved in 7.5 mL of xylene, and stirred to prepare a solution including PStPCA.

The prepared solution was dropped onto the similar substrate as in Example 8 through a 0.45 μm filter, and the substrate was rotated to be spin-coated with the solution at 200 rpm for 2 seconds, at 1500 rpm for 60 seconds and at 3000 rpm for 10 seconds. After wiping the end portion of the substrate, the spin-coated substrate was put in an electric furnace and baked at 120° C. for 1.5 hours, while the air inside the heating furnace is evacuated using a rotary pump, thereby obtaining a layer including PStPCA over the ITSO electrode. The film thickness was 59 nm.

The substrate was fixed on a holder provided in the vacuum evaporation apparatus such that the surface of the substrate provided with ITSO and PStPCA faces down, and Al of 100 nm thick was formed by a vacuum evaporation method, thereby obtaining a single layer element in which PStPCA was formed between the ITSO electrode and the Al electrode.

As described above, current-voltage characteristic of the manufactured element was measured. At this time, the measurement was conducted to the manufactured element using a source meter (a 2400 type Source Meter manufactured by Keithley Instruments Inc), by applying a direct voltage. At this time, in voltage application, a case that the ITSO electrode serves as anode and the Al electrode serves as a cathode is a forward bias, while a case that the Al electrode serves as an anode and the ITSO electrode serves as a cathode is a reverse bias. The measurement results are shown in FIG. 26 together with the results of Example 8. According to FIG. 26, it can be understood that less current flows in the element of this comparative example than the element using the composite material of the present invention in Example 8.

Example 9

Example 9 describes a manufacturing method of a composite material of the present invention including PStDPA and tantalum oxide synthesized in Synthesis Example 1. A composite material of the present invention including PStDPA and tantalum oxide was formed over a glass substrate by a sol gel method in this example.

In a gloved box with a nitrogen atmosphere whose water concentration was kept 10 ppm or less, 50 mg of PStDPA was dissolved in 5 mL of dehydration xylene, and stirred. Into this solution, 50 mg of penta ethoxy tantalum (V) which was a raw material of tantalum oxide was added, and 17 mg of ethyl acetoacetate was added as a stabilizer and stirred for one day at room temperature to prepare a solution for coating.

The solution was dropped onto a quartz substrate through a 0.45 μm filter, and the substrate was rotated to be spin-coated with the solution at 200 rpm for 2 seconds, at 1000 rpm for 60 seconds and at 3000 rpm for 10 seconds. The spin-coated substrate and a beaker containing pure water were put in an electric furnace and heated at 40° C. for 2 hours to be hydrolyzed by water vapor. Further, after taking the beaker containing pure water out of the furnace, the substrate was baked at 120° C. for 1.5 hours, while the air inside the furnace is evacuated using a rotary pump, thereby obtaining a composite material of the present invention including PStDPA and tantalum oxide over the quartz substrate.

Example 10

Figure 27:
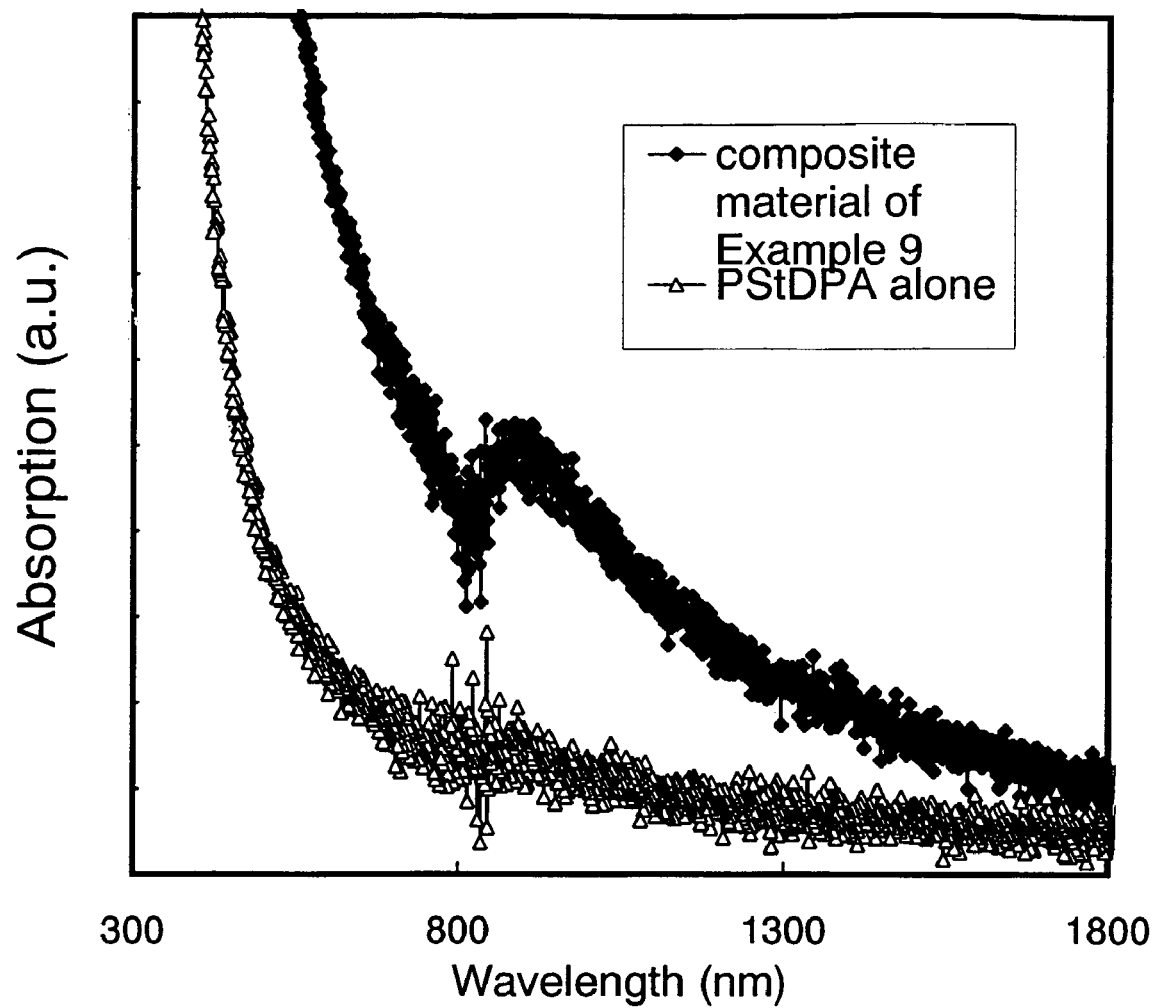
FIG. 27 shows comparison of absorption characteristics of a film of a composite material including PStDPA and tantalum oxide, and a film of PStDPA alone.

Example 10 describes an absorption spectrum of a composite material of the present invention including PStDPA and tantalum oxide manufactured in Example 9. FIG. 27 shows measurement results of ultraviolet, visible and near infrared absorption spectra obtained using a ultraviolet-visible-near infrared (UV/VIS/NIR) spectrophotometer, (U-4000 made by Hitachi, Ltd.,) regarding two thin films of PStDPA thin film, and a thin film made of a composite material of the present invention including PStDPA and tantalum oxide.

According to FIG. 27, the absorption spectrum of a composite material of the present invention including PStDPA and tantalum oxide is different from that of PStDPA alone. In particular, it has an absorption peak around 900 nm, which is not shown in the absorption spectrum of PStDPA. In addition, it can be thought that tantalum oxide does not have an absorption peak of around 900 nm, by considering that tantalum oxide is an insulator having a large band gap. Therefore, the absorption peak around 900 nm can be considered to be an absorption peak unique to the composite material of the present invention.

It can be considered that this is an absorption peak which is caused by an interaction between PStDPA and tantalum oxide, and PStDPA donates electrons to tantalum oxide.

A composite material of the present invention having such characteristics is a material having excellent conductivity, and excellent carrier injecting and transporting properties. In addition, a composite material of the present invention is suitable for mass production and advantageous industrially since it can be formed by a wet method.

Example 11

Example 11 describes a manufacturing method of a composite material including PStPCA and tantalum oxide synthesized in Synthesis Example 2. A composite material of the present invention including PStPCA and tantalum oxide was formed over a glass substrate by a sol gel method in this example.

In a gloved box with a nitrogen atmosphere whose water concentration was kept 10 ppm or less, 50 mg of PStPCA was dissolved in 5 mL of a mixed solvent in which dehydration toluene and dehydration tetrahydrofuran (THF) were mixed with the volume ratio of 1:1, and stirred. Into this solution, 50 mg of penta ethoxy tantalum (V) which was a raw material of tantalum oxide was added, and 17 mg of ethyl acetoacetate was added as a stabilizer and stirred for one day at room temperature to prepare a solution for coating.

The solution was dropped onto a quartz substrate through a 0.45 μm filter, and the substrate was rotated to be spin-coated with the solution at 200 rpm for 2 seconds, at 1000 rpm for 60 seconds and at 2500 rpm for 10 seconds. The spin-coated substrate and a beaker containing pure water were put in an electric furnace and heated at 40° C. for 2 hours to be hydrolyzed by water vapor. Further, after taking the beaker containing pure water out of the furnace, the substrate was baked at 120° C. for 1.5 hours, while the air inside the furnace is evacuated using a rotary pump, thereby obtaining a composite material of the present invention including PStPCA and tantalum oxide over the quartz substrate.

Example 12

Figure 28:
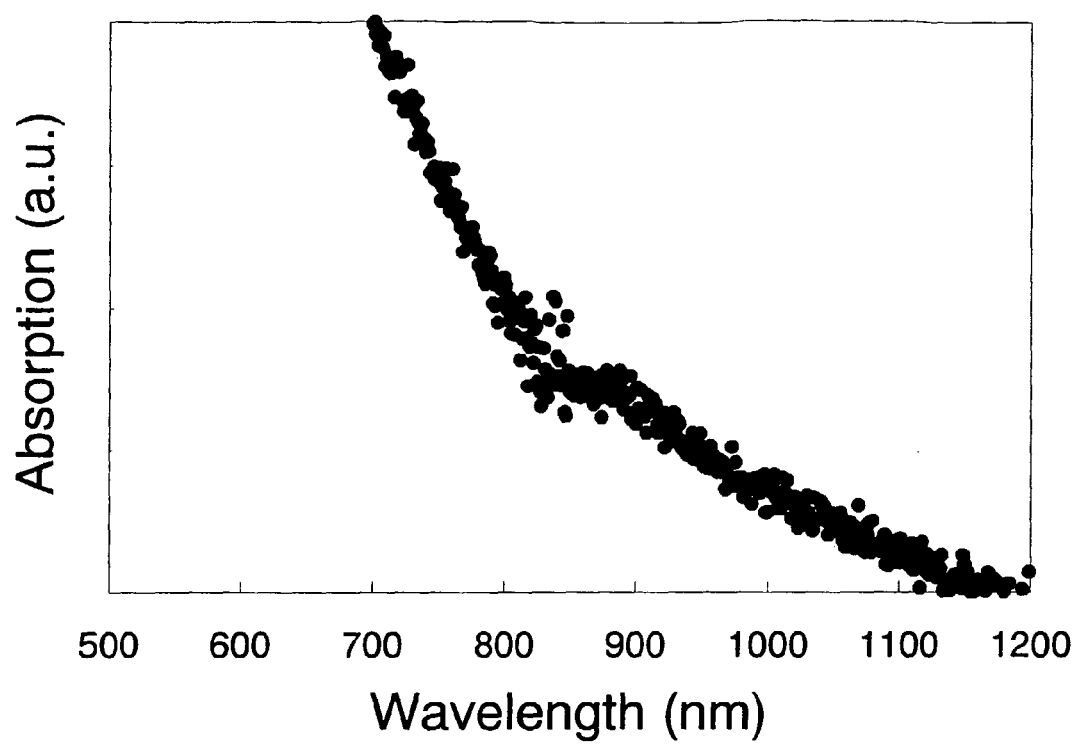
FIG. 28 shows an absorption spectrum of a composite material including PStPCA and tantalum oxide.

Example 12 describes an absorption spectrum of a composite material of the present invention including PStPCA and tantalum oxide, which has been described in Example 11. FIG. 28 shows measurement results of ultraviolet, visible and near infrared absorption spectra obtained using an ultraviolet-visible-near infrared (UV/VIS/NIR) spectrophotometer, (U-4000 made by Hitachi, Ltd.,) regarding a thin film made of a composite material of the present invention including PStPCA and tantalum oxide.

According to FIG. 28, the absorption spectrum of a composite material of the present invention including PStPCA and tantalum oxide has a unique absorption peak around 900 nm, as in FIG. 27. It can be considered that this is an absorption peak which is caused by an interaction between PStPCA and tantalum oxide, and PStPCA donates electrons to tantalum oxide.

A composite material of the present invention having such characteristics is a material having excellent conductivity, and excellent carrier injecting and transporting properties. In addition, a composite material of the present invention is suitable for mass production and advantageous industrially since it can be formed by a wet method.

Example 13

Example 13 describes a manufacturing method of a composite material including PStDPA and molybdenum oxide synthesized in Synthesis Example 1. A composite material of the present invention including PStDPA and molybdenum oxide was formed over a glass substrate by a sol gel method in this example.

In a gloved box with a nitrogen atmosphere whose water concentration was kept 10 ppm or less, 50 mg of PStDPA was dissolved in 5 mL of a mixed solvent in which dehydration toluene and dehydration tetrahydrofuran (THF) were mixed with the volume ratio of 1:1, and stirred. Into this solution, 41 mg of penta ethoxy molybdenum(V) which was a raw material of molybdenum oxide was added, and 17 mg of ethyl acetoacetate was added as a stabilizer and stirred at room temperature for one day to prepare a solution for coating.

The solution was dropped onto a quartz substrate through a 0.45 μm filter, and the substrate was rotated to be spin-coated with the solution at 200 rpm for 2 seconds, at 1000 rpm for 60 seconds and at 2500 rpm for 10 seconds. The spin-coated substrate and a beaker containing pure water were put in an electric furnace and heated at 40° C. for 2 hours to be hydrolyzed by water vapor. Further, after taking the beaker containing pure water out of the furnace, the substrate was baked at 120° C. for 1.5 hours, while the air inside the furnace is evacuated using a rotary pump, thereby obtaining a composite material of the present invention including PStDPA and molybdenum oxide over the quartz substrate.

Example 14

Figure 29:
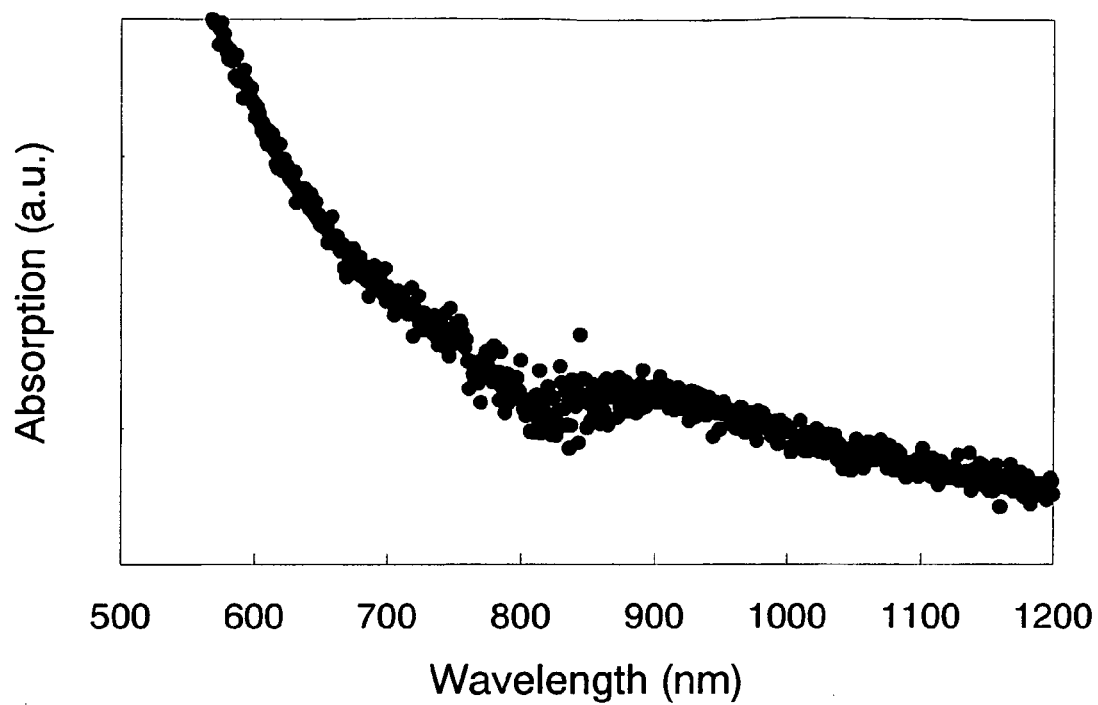
FIG. 29 shows an absorption spectrum of a composite material including PStDPA and molybdenum oxide.

Example 14 describes an absorption spectrum of a composite material including PStDPA and molybdenum oxide which was formed in Example 13. FIG. 29 shows measurement results of ultraviolet, visible and near infrared absorption spectra obtained using an ultraviolet-visible-near infrared (UV/VIS/NIR) spectrophotometer, (U-4000 made by Hitachi, Ltd.) regarding a thin film made of a composite material of the present invention including PStDPA and molybdenum oxide, which was formed in Example 13.

According to FIG. 29, the absorption spectrum of a composite material of the present invention including PStDPA and molybdenum oxide has a unique absorption peak around 900 nm, similarly as in FIG. 27. It can be considered that this is an absorption peak which is caused by an interaction between PStDPA and molybdenum oxide, and PStDPA donates electrons to tantalum oxide.

A composite material of the present invention having such characteristics is a material having excellent conductivity, and excellent carrier injecting and transporting properties. In addition, a composite material of the present invention is suitable for mass production and advantageous industrially since it can be formed by a wet method.

Example 15

Example 15 describes a manufacturing method of a composite material including PStDPA which was synthesized in Synthesis example 1 and niobium oxide. In this example, a composite material of the present invention including PStDPA and niobium oxide was formed as a film in a similar manner to Example 13, except that penta etoxy niobium(V) was used instead of penta ethoxy molybdenum(V).

Example 16

Figure 30:
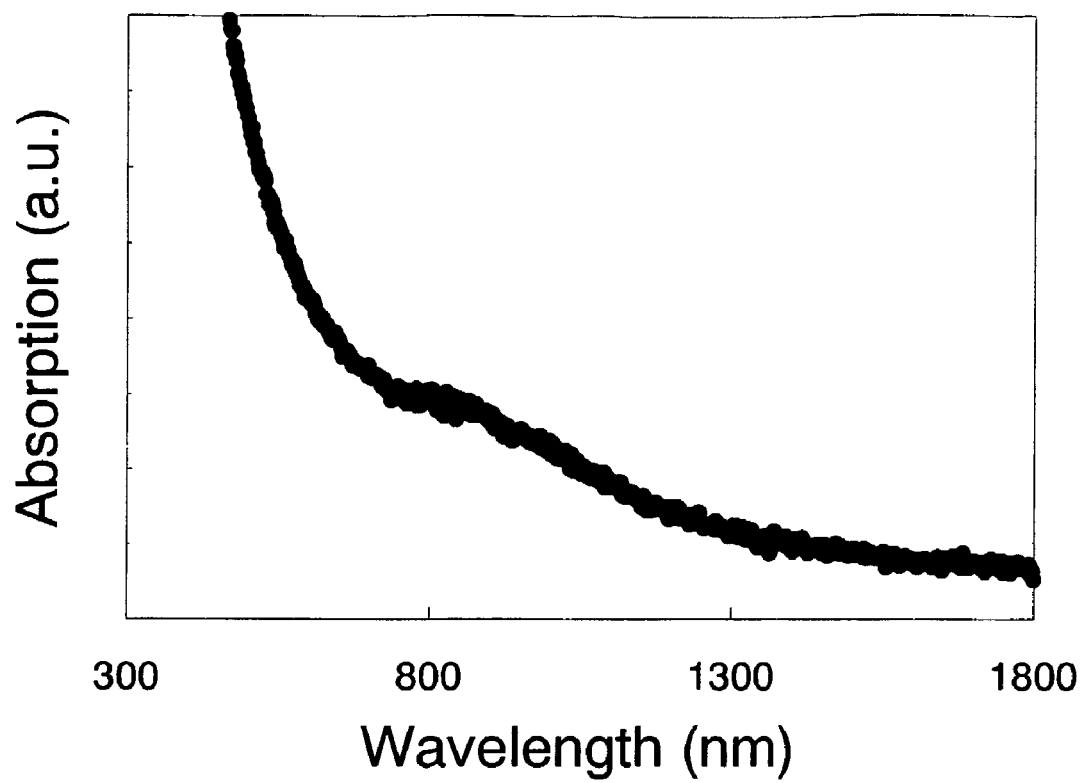
FIG. 30 shows an absorption spectrum of a composite material including PStDPA and niobium oxide.

Example 16 describes an absorption spectrum of a composite material including PStDPA and niobium oxide which ws formed in Example 15. FIG. 30 shows measurement results of ultraviolet, visible and near infrared absorption spectra obtained using an ultraviolet-visible-near infrared (UV/VIS/NIR) spectrophotometer, (U-4000 made by Hitachi, Ltd.,) regarding a thin film made of a composite material of the present invention including PStDPA and niobium oxide.

According to FIG. 30, the absorption spectrum of a composite material of the present invention including PStDPA and niobium oxide has a unique absorption peak around 900 nm, similarly as in FIG. 27. It can be considered that this is an absorption peak which is caused by an interaction between PStDPA and niobium oxide, and PStDPA donates electrons to niobium oxide.

A composite material of the present invention having such characteristics is a material having excellent conductivity, and excellent carrier injecting and transporting properties. In addition, the composite material of the present invention is suitable for mass production and advantageous industrially since it can be formed by a wet method.

Example 17

Example 17 describes a concrete example of a light-emitting element in which a layer including a composite material of the present invention including PStPCA and vanadium oxide which is shown in Example 6, is provided to be in contact with an electrode serving as an anode.

In a gloved box with a nitrogen atmosphere whose water concentration was kept 10 ppm or less, 50 mg of PStPCA, 32 mg of vanadium(V) triisopropoxide oxide which was a raw material of vanadium oxide, and 16 mg of ethyl acetoacetate as a stabilizer were dissolved in 5 mL of a mixed solvent in which dehydration toluene and dehydration tetrahydrofuran (THF) were mixed with the volume ratio of 1:1, and stirred for one day to prepare a solution for coating.

Next, a glass substrate provided with indium tin silicon oxide (ITSO) of 110 nm was prepared. An insulating film covering the periphery of the surface of ITSO such that 2 mm square of the surface is exposed. It should be noted that ITSO is an electrode serving as an anode of the light-emitting element. As a pretreatment for forming the light-emitting element over the substrate, the surface of the substrate was washed with a porous resin brush as a pretreatment, and baked at 200° C. for 1 hour, then, a UV ozone treatment was conducted for 370 seconds.

The prepared solution was dropped onto a substrate through a 0.45 μm filter, and the substrate was rotated to be spin-coated with the solution at 200 rpm for 2 seconds, at 2000 rpm for 60 seconds and at 2500 rpm for 10 seconds. After wiping an end portion of the substrate, the spin-coated substrate and a beaker containing pure water were put in a vacuum-constant temperature drying apparatus and heated at 40° C. for 2 hours at a normal pressure to be hydrolyzed by water vapor. Further, after taking the beaker containing pure water out of the vacuum-constant temperature drying apparatus, the substrate was baked at 120° C. for 1.5 hours, while the air inside vacuum-constant temperature drying apparatus is evacuated using a rotary pump, thereby obtaining a composite material of the present invention including PStPCA and vanadium oxide over the ITSO electrode. The film thickness was 50 nm.

The substrate was fixed on a holder provided in the vacuum evaporation apparatus such that the surface of the substrate provided with ITSO and the composite material faces down.

After reducing the pressure of the vacuum evaporation apparatus to $10^{-4}$ Pa, NPB of 10 nm was formed as the hole transporting layer by a vacuum evaporation method using resistance heating. Over NPB, a light-emitting layer including Alq₃ and coumarin 6 was formed to have a thickness of 40 nm. The light-emitting layer was formed by a co-evaporation method which evaporated Alq₃ and coumarin 6 from different evaporation sources from each other simultaneously. A ratio of Alq₃ and coumarin 6 was adjusted such that Alq₃:coumarin 6 is 1:0.01 (mass ratio). Further, over this light-emitting layer, Alq₃ of 10 nm thick was formed as an electron transporting layer. Over an electron transporting layer, an electron injecting layer including Alq₃ and lithium was formed to have a thickness of 20 nm, and over the electron injecting layer, aluminum of 200 nm thick was formed as a cathode to obtain a light-emitting element in this example.

After sealing this light-emitting element in a gloved box with a nitrogen atmosphere so as not to expose the light-emitting element to the air, operation characteristics of the light-emitting element were measured. It should be noted that the measurement was conducted at a room temperature (an atmosphere kept at 25° C.).

Figure 31:
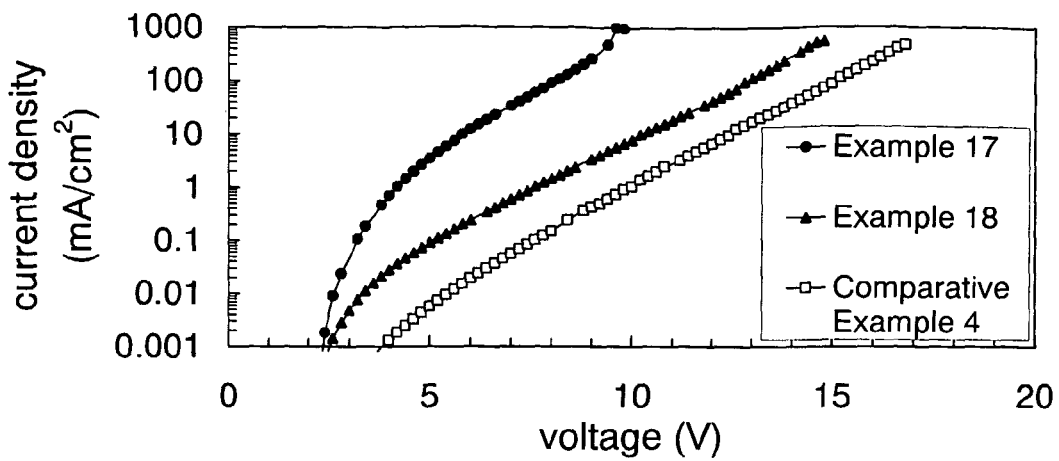
FIG. 31 shows voltage-current density of light-emitting elements in Examples 17 and 18 and a comparative example 4.
Figure 32:
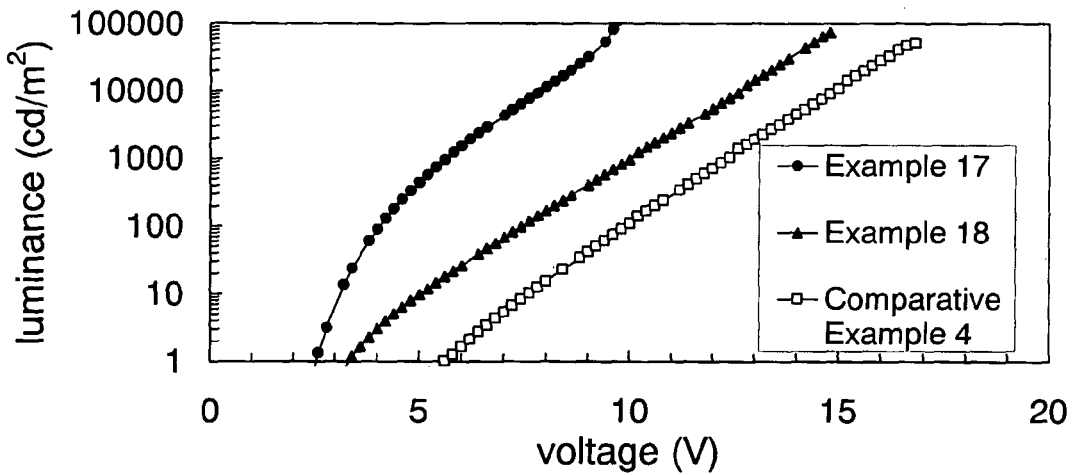
FIG. 32 shows voltage-luminance of light-emitting elements in Examples 17 and 18 and a comparative example 4.
Figure 33:
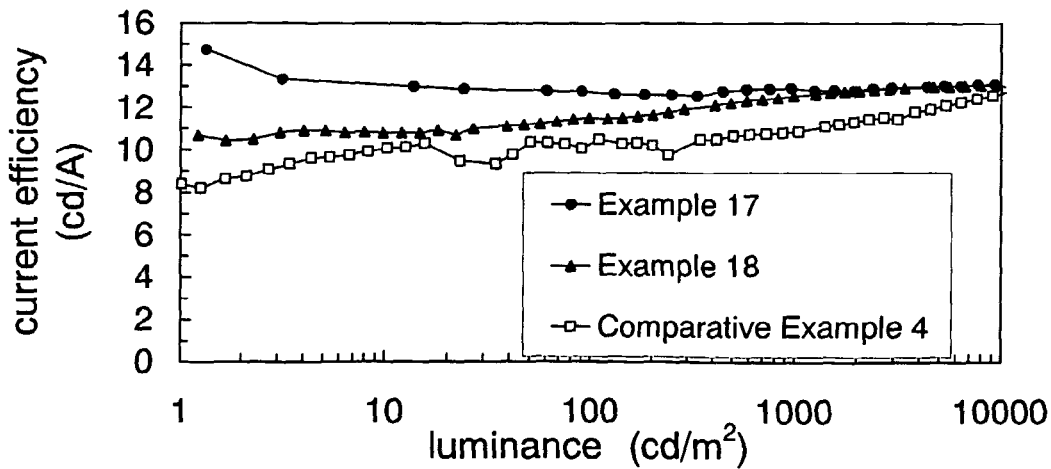
FIG. 33 shows luminance-current efficiency characteristics of light-emitting elements in Examples 17 and 18 and a comparative example 4.

FIG. 31, FIG. 32, and FIG. 33 show voltage-current density characteristics, voltage-luminance characteristics, and luminance-current efficiency characteristics of this light-emitting element, respectively. This light-emitting element emits light at 1560 cd/m², by applying a voltage of 6V thereto to allow current flow with current density of 12.1 mA/cm². The current efficiency at this time was 12.8 cd/A. In addition, CIE chromaticity coordinate at this time were (x, y)=(0.29, 0.63) and thus, green emission derived from coumarin 6 was obtained. As to the luminance, a maximum luminance greater than 100,000 cd/m2 was obtained.

In this manner, by providing the composite material of the present invention to be in contact with the electrode serving as an anode of the light-emitting element, the light-emitting element can operate at low voltage and operated extremely efficiently.

Comparative Example 4

Next, as a comparative example, an example of a light-emitting element in which a layer made of PStPCA alone was provided to be in contact with the electrode serving as the anode is described specifically.

In a gloved box with a nitrogen atmosphere whose water concentration was kept 10 ppm or less, 75 mg of PStPCA was added to 10 mL of dehydration toluene and stirred for one day to prepare a solution for coating.

The solution was dropped onto the same substrate as in Example 17 described above and the substrate was rotated to be spin-coated with the solution at 200 rpm for 2 seconds, at 500 rpm for 60 seconds and at 2500 rpm for 10 seconds. After wiping the end portion of the substrate, the spin-coated substrate was put in a vacuum-constant temperature drying apparatus and baked at 120° C. for 1.5 hours while the air inside vacuum-constant temperature drying apparatus is evacuated using a rotary pump, thereby obtaining a layer made of PStPCA over the ITSO electrode. The film thickness was 50 nm.

The substrate was fixed on a holder provided in the vacuum evaporation apparatus such that the surface of the substrate provided with ITSO and PStDPA faces down. In a similar way to Example 17, NPB of 10 nm as the hole transporting layer. a light-emitting layer including Alq₃ and coumarin 6 of 40 nm thick, Alq₃ of 10 nm thick as an electron transporting layer, Alq₃ and lithium of 20 nm thick as electron injecting layer, and aluminum of 200 nm as a cathode were sequentially formed to obtain the light-emitting element of this comparative example.

After sealing this light-emitting element in a gloved box with a nitrogen atmosphere so as not to expose the light-emitting element to the air, operation characteristics of the light-emitting element were measured. It should be noted that the measurement was conducted at a room temperature (an atmosphere kept at 25° C.).

FIG. 31, FIG. 32, and FIG. 33 show voltage-current density characteristics, voltage-luminance characteristics, and luminance-current efficiency characteristics of this light-emitting element, respectively along with the characteristics of Example 17. This light-emitting element allows current to flow at a current density of only 0.0194 mA/cm² even by applying a voltage of 6V thereto, and the luminance was only 1.67 cd/m².

As described above, by applying a composite material combining an organic compound and an inorganic compound to a light-emitting element, it can be understood that the driving voltage of the light-emitting element can be decreased dramatically as compared with a case that an inorganic compound is not combined. In addition, it is shown that other luminescence characteristics such as current efficiency, and maximum luminance were superior.

Example 18

Example 18 specifically describes an example of a light-emitting element in which a layer of a composite material of the present invention including PStPCA and tantalum oxide as shown in Example 11, is provided to be in contact with an electrode serving as an anode. The light-emitting element was formed in the same way as that of Example 17, except that 50 mg of penta ethoxy tantalum (V) was used instead of 32 mg of vanadium(V) triisopropoxide oxide.

After sealing this light-emitting element in a gloved box with a nitrogen atmosphere so as not to expose the light-emitting element to the air, operation characteristics of the light-emitting element were measured. It should be noted that the measurement was conducted at a room temperature (an atmosphere kept at 25° C.).

FIG. 31, FIG. 32, and FIG. 33 show voltage-current density characteristics, voltage-luminance characteristics, and luminance-current efficiency characteristics of this light-emitting element, respectively along with the characteristics of Example 17 and the comparative example 4. This light-emitting element of Example 18 using the composite material of the present invention including PStPCA and tantalum oxide has a higher driving voltage than the light-emitting element of Example 17, but shows a more favorable driving voltage than the light-emitting element of the comparative example 4 using PStPCA alone. According to FIG. 33, it can be understood that this light-emitting element shows a superior current efficiency to that of the comparative example 4.

Example 19

In Example 19, a composite material of the present invention using PStDPA and vanadium oxide was observed with a cross-section TEM (Transmission Electron Microscope). As a sample for observation, the light-emitting element manufactured in Example 5 was used.

Figure 34A:
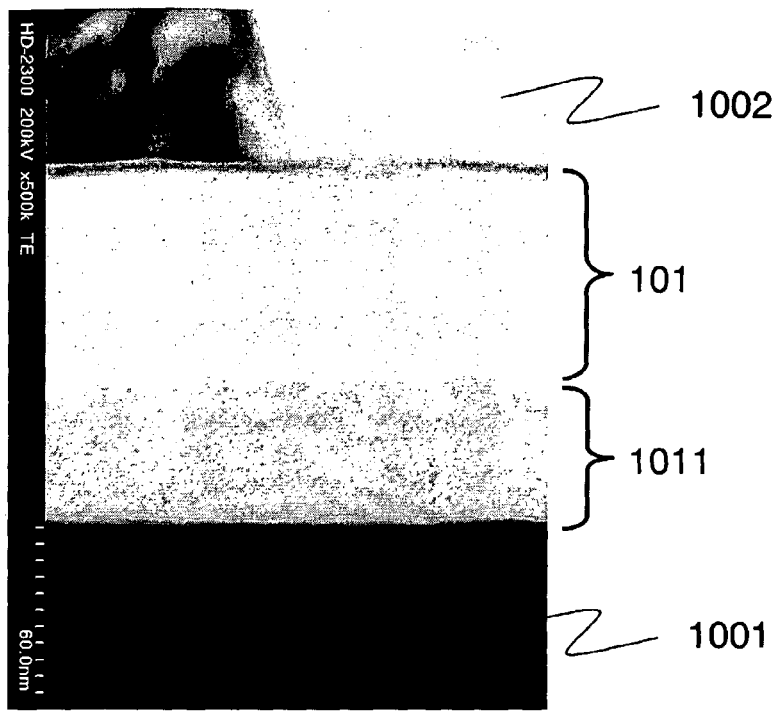
FIGS. 34A and 34B are each a cross-section TEM photograph of a composite material including PStDPA and vanadium oxide.

FIG. 34A is a cross section TEM photograph of the light-emitting element manufactured in Example 5 (magnification: 500,000 times). In the FIG. 34A, reference numeral 1001 denotes an anode made of ITSO. Reference 1002 denotes a cathode made of Al. Reference numeral 1011 denotes a composite material of the present invention including PStDPA and vanadium oxide. Reference numeral 1012 denotes a stacked body including a hole transporting layer made of NPB, a light-emitting layer made of Alq₃ and coumarin 6, an electron transporting layer made of Alq$_3$, and an electron injecting layer made of lithium fluoride. Note that the photograph of FIG. 34B shows an enlarged portion of a portion of the composite material 1011 of the present invention in FIG. 34A.

Figure 34B:
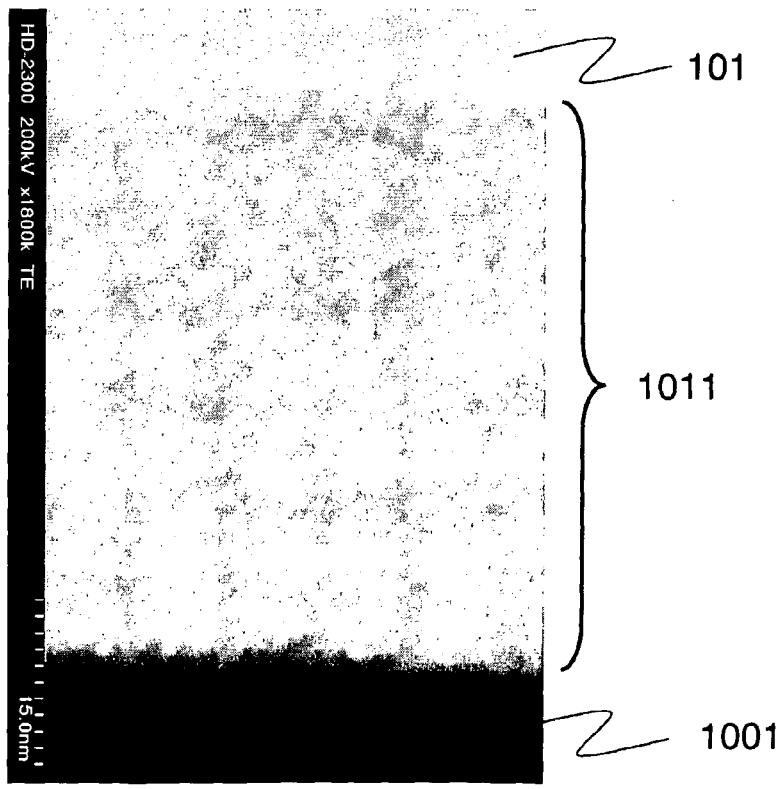

As shown in FIGS. 34A and 34B, a shadow (a black spot) having a diameter of several nm was observed in the composite material 1011 of the present invention manufactured in Example 5. EDX (Energy Dispersive X-ray spectroscopy) analysis was conducted to the black spots, and vanadium and oxygen were detected. Further, by conducting EDX (Energy Dispersive X-ray spectroscopy) line analysis to the composite material 1101 of the present invention, a difference of the concentration of vanadium was observed noticeably.

From the above, it can be considered that, in the composite material of the present invention formed in Example 5, nanoparticles (nanoclusters) of vanadium oxide are formed and dispersed almost uniformly.

Note that in EDX line analysis, since a half width of a peak showing detection of vanadium is around 5 nm at most, the grain diameter of vanadium oxide was estimated to around 1 to 10 nm. Since vanadium oxide forms nanoparticles (nanoclusters) with the diameter of around 1 to 10 nm, the specific surface area becomes larger and thus, the area for the interaction with a high molecular compound is large. It can be considered that this contributes to the high conductivity, hole injecting property and hole transporting property.

Example 20

Figure 35A:
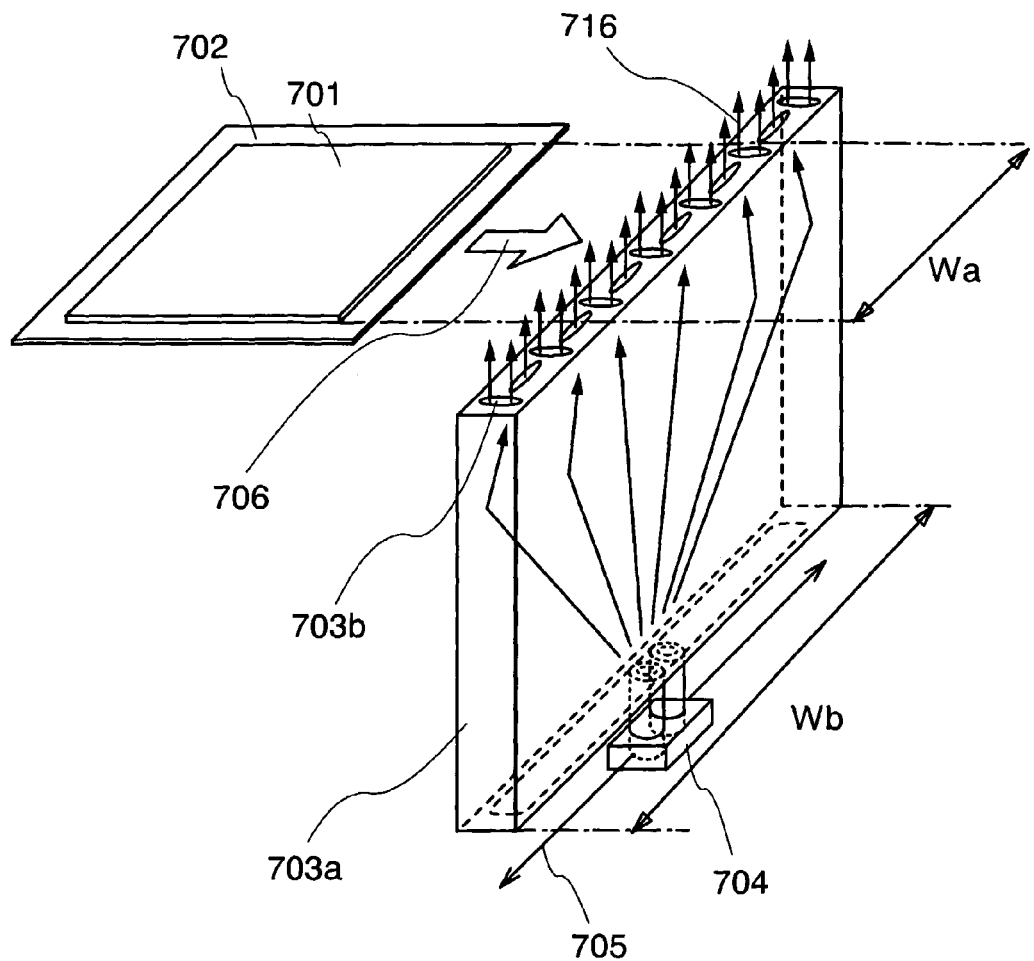
FIGS. 35A and 35B each show an evaporation apparatus.

Example 20 shows an example in which an evaporation apparatus by which a layer including a composite material of the present invention and layers as a light-emitting stacked body are formed by an evaporation method, in forming a light-emitting element or a light-emitting device of the present invention. FIG. 35A shows a perspective view of the evaporation apparatus. The mechanism of the evaporation apparatus is shown briefly below.

The position of a substrate 701 is aligned in advance with an evaporation mask 702, and the substrate aligned with the evaporation mask is transferred in the direction of an arrow 706. The substrate is transported and passes over a deposition shield 703a. The deposition shield 703a has opening portions 703b, and an evaporation material from an evaporation source 704 is sublimated from the opening portions 703b. The deposition shield 703a is heated so that a sublimation direction 716 of the evaporation material from the opening portion 703b is kept without being attached to the deposition shield.

The evaporation source 704 has a structure in which plural crucibles can be provided, and it can move in the direction of an arrow 705. A resistance heating method is used for the evaporation method. In addition, the range in which the evaporation source moves is preferably wider than the width Wa of the substrate. In addition, by making the width Wb of the deposition shield wider than the width Wa of the substrate, the thickness uniformity of an evaporated film is improved.

In other words, the evaporation apparatus shown in FIG. 35A is provided with a deposition shield for keeping a sublimation direction of the evaporation material in a film formation chamber, and the plurality of opening portions. The evaporation material is sublimated from the opening portions. Under the deposition shield, the evaporation source which can move in a perpendicular direction to the movement direction (also, referred to as a transfer direction) of the substrate, is provided. In addition, the width Wb of the deposition shield is made wider than the width Wa of the substrate, thereby increasing the thickness uniformity of the evaporated film.

Note that in the evaporation apparatus in FIG. 35A, the shape or number of the opening portion 703b is not limited especially.

Figure 35B:
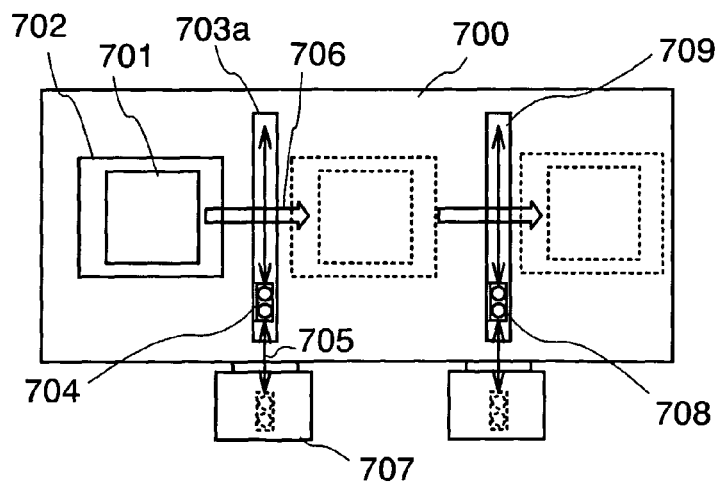

An installation chamber connected to the film formation chamber through a gate may be provided so as to supply an evaporation material to crucibles of the evaporation source. In addition, plural evaporation sources and deposition shields may be provided in one film formation chamber. FIG. 35B shows a top view of an evaporation apparatus provided with plural evaporation sources and installation chambers. When an installation chamber 707 is set in the movement direction of the evaporation source (the direction shown by the arrow 705), and an evaporation material is supplied, the evaporation source may be moved to the installation chamber for the supply of the evaporation material. When the evaporation source is fixed in the film formation chamber, the pressure of the film formation chamber is needed to be an atmospheric pressure so as to supply the evaporation material to the evaporation source, and the film formation chamber is needed to be evacuated so as to evaporate again, which takes time. In the case of providing the installation chamber 707, while the vacuum degree of the film formation chamber 700 is kept, it is acceptable as long as only the inside of the installation chamber is changed between atmospheric pressure and vacuum. Thus, the evaporation material can be supplied in a short time.

A second deposition shield 709 is provided to be in parallel with the deposition shield 703a, and a second evaporation source 708 which moves in a perpendicular direction to the transfer direction of the substrate may be provided. By providing a plurality of evaporation sources in one film formation chamber, it is possible to stack layers sequentially. Here, an example in which two evaporation sources are provided in one film formation chamber is shown; however, two or more evaporation sources may be provided in one film formation chamber.

In other words, two deposition shields are provided in the perpendicular direction to the transfer direction of the substrate in one film formation chamber, and the same evaporation material may be formed continuously by providing evaporation sources to each of the deposition shields. By employing such evaporation apparatus, the film formation speed can be increased. It should be noted that the two deposition shields are provided in parallel with each other and have an adequate interval therebetween.

In addition, different evaporation materials may be set in the two evaporation sources and films may be stacked sequentially. For example, an organic compound and an inorganic compound are set separately in two crucibles of a first evaporation source, and a substrate passes over the first evaporation source to deposit a composite material of the present invention. Then, a second organic compound is set in crucibles of a second evaporation source, and the substrate is moved so that it passes over the other of the second evaporation source, to deposit a light-emitting layer over a buffer layer.

This application is based on Japanese Patent Application serial no. 2005-085026 filed in Japan Patent Office on Mar. 23, 2005, and Japanese Patent Application serial No. 2005-321431 filed in Japan Patent Office on Nov. 4, 2005 and the contents of which are hereby incorporated by reference.

EXPLANATION OF REFERENCES

100: substrate, 101: first electrode, 102: second electrode, 103: light-emitting stacked body, 111: first layer, 112: second layer, 200: substrate, 201: first electrode, 202: second electrode, 203: light-emitting stack body, 211: first layer, 212: second layer, 213: third layer, 214: fourth layer, 301: first electrode, 302: second electrode, 303: light-emitting stacked body, 311: first layer, 312: second layer, 313: third layer, 401: first electrode, 402: second electrode, 403: light-emitting stacked body, 411: first layer, 412: second layer, 413: third layer, 414: fourth layer, 601: source side driver circuit, 602: pixel portion, 603: gate side driver circuit, 604: sealing substrate, 605: sealing material, 607: space, 608: wiring, 609: FPC (flexible printed circuit), 610: element substrate, 611: switching TFT, 612: current controlling TFT, 613: first electrode, 614: insulator, 616: light-emitting stacked body, 617: second electrode, 618: light-emitting element, 623: n-channel TFT, 624: p-channel TFT, 700: film formation chamber, 701: substrate, 702: evaporation mask, 703a: deposition shield, 703b: opening portion, 704: evaporation source, 705: arrow, 706: arrow, 707: installation chamber, 708: evaporation source, 709: deposition shield, 716: sublimation direction, 951: substrate, 952: electrode, 953: insulating layer, 954: partition layer, 955: light-emitting stacked body layer, 956: electrode, 9101: casing, 9102: supporting stand, 9103: display portion, 9104: speaker portion, 9105: video input terminal, 9201: main body, 9202: casing, 9203: display portion, 9204: keyboard, 9205: external connection port, 9206: pointing mouse, 9301: main body, 9302: display portion, 9303: arm portion, 9401: main body, 9402: casing, 9403: display portion, 9404: audio input portion, 9405: audio output portion, 9406: operation key, 9407: external connection port, 9408: antenna, 9501: main body, 9502: display portion, 9503: casing, 9504: external connection port, 9505: remote control receiving portion, 9406: image receiving portion, 9507: battery, 9508: audio input portion, 9509 operation key, 9510: eyepiece portion,

The invention claimed is:

1. A composite material comprising:

a vinyl polymer; and an inorganic compound with an electron accepting property to the vinyl polymer, wherein the vinyl polymer is selected from

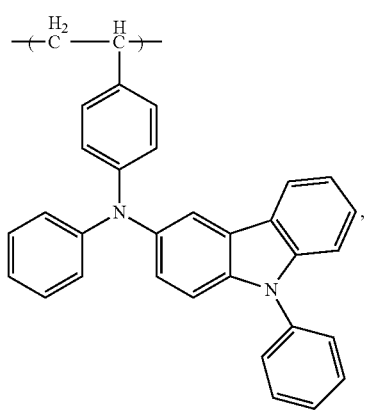

and

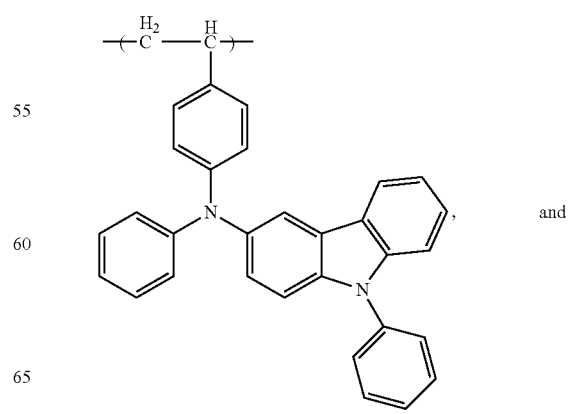

2. The composite material according to claim 1, wherein an absorption spectrum of the composite material is different from an absorption spectrum of the vinyl polymer or an absorption spectrum of the inorganic compound.

3. The composite material according to claim 1, wherein the inorganic compound is an oxide of a metal belonging to Group 5 to 7 in the periodic table.

4. The composite material according to claim 1, wherein the inorganic compound is vanadium oxide, molybdenum oxide, tungsten oxide, tantalum oxide, niobium oxide or rhenium oxide.

5. The composite material according to claim 1, wherein the inorganic compound is dispersed as nanoparticles in the vinyl polymer, and wherein a grain diameter of the nanoparticles is 20 nm or less.

6. A light-emitting element comprising:

a first electrode;

a second electrode; and a light-emitting stacked body interposed between the first electrode and the second electrode, wherein the light-emitting stacked body includes a layer comprising a composite material, and wherein the composite material comprises a vinyl polymer and an inorganic compound with an electron accepting property to the vinyl polymer, and wherein the vinyl polymer is selected from

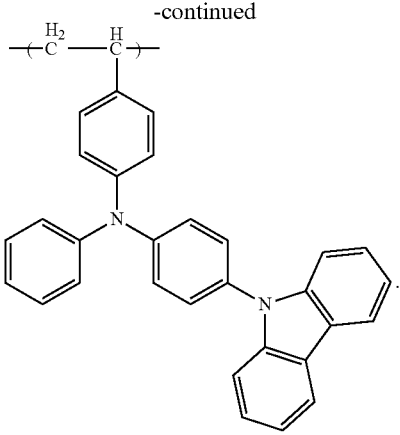

7. The light-emitting element according to claim 6, wherein the layer comprising the composite material is in contact with the first electrode, and wherein the first electrode serves as an anode.

8. The light-emitting element according to claim 6, wherein the layer comprising the composite material is in contact with the first electrode, and wherein the first electrode serves as a cathode.

9. The light-emitting element according to claim 6, wherein the inorganic compound is an oxide of a metal belonging to Group 5 to 7 in the periodic table.

10. The light-emitting element according to claim 6, wherein the inorganic compound is vanadium oxide, molybdenum oxide, tungsten oxide, tantalum oxide, niobium oxide or rhenium oxide.

11. The light-emitting element according to claim 6, wherein the inorganic compound is dispersed as nanoparticles in the vinyl polymer, and wherein a grain diameter of the nanoparticles is 20 nm or less.

12. An electronic device comprising a display portion, wherein the display portion has the light-emitting element according to claim 6.

13. A method for manufacturing a light-emitting element comprising the step of:
   forming a sol by dissolving a metal alkoxide, an chelating agent, and water in an organic solvent,
   mixing a vinyl polymer having a triarylamine skeleton with the sol,
   coating an electrode with the sol,
   forming a film comprising the vinyl polymer and a metal oxide by hydrolyzing the sol which coats the electrode, and
   baking the film comprising the vinyl polymer and the metal oxide.

14. The method for manufacturing a light-emitting element according to claim 13, wherein the metal alkoxide is an alkoxide of a metal belonging to Group 5 to 7 in the periodic table.

15. The method for manufacturing a light-emitting element according to claim 13, wherein the vinyl polymer is selected from

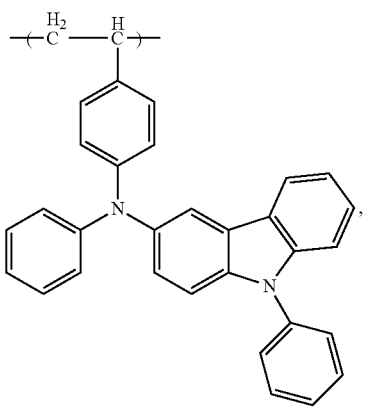

, and

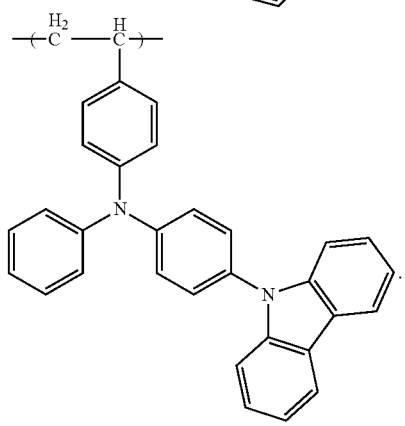

.

16. The method for manufacturing a light-emitting element according to claim 14, wherein the metal is vanadium, molybdenum, tungsten, tantalum, niobium or rhenium.

* * * * *